(12) United States Patent
Tran et al.

(10) Patent No.: US 12,057,170 B2
(45) Date of Patent: Aug. 6, 2024

(54) NEURAL NETWORK ARRAY COMPRISING ONE OR MORE COARSE CELLS AND ONE OR MORE FINE CELLS

(71) Applicant: Silicon Storage Technology, Inc., San Jose, CA (US)

(72) Inventors: Hieu Van Tran, San Jose, CA (US); Stanley Hong, San Jose, CA (US); Stephen Trinh, San Jose, CA (US); Thuan Vu, San Jose, CA (US); Steven Lemke, Boulder Creek, CA (US); Vipin Tiwari, Dublin, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/139,908

(22) Filed: Apr. 26, 2023

(65) Prior Publication Data
US 2024/0079064 A1 Mar. 7, 2024

Related U.S. Application Data

(62) Division of application No. 17/082,956, filed on Oct. 28, 2020, now Pat. No. 11,682,459.

(60) Provisional application No. 63/024,351, filed on May 13, 2020.

(51) Int. Cl.
*G11C 16/10* (2006.01)
*G06N 3/065* (2023.01)
(Continued)

(52) U.S. Cl.
CPC ............ *G11C 16/10* (2013.01); *G06N 3/065* (2023.01); *G11C 11/5628* (2013.01);
(Continued)

(58) Field of Classification Search
CPC ....................................................... G11C 11/54
See application file for complete search history.

(56) References Cited

U.S. PATENT DOCUMENTS

| 5,029,130 | A | 7/1991 | Yeh |
| 6,747,310 | B2 | 6/2004 | Fan |

(Continued)

FOREIGN PATENT DOCUMENTS

| JP | 2019-145188 | 8/2019 |
| WO | 2019 089168 | 5/2019 |

OTHER PUBLICATIONS

Lemke et al., "Ultra-Precise Tuning of Analog Neural Memory Cells in a Deep Learning Artificial Neural Network," U.S. Appl. No. 16/985,147, filed Aug. 4, 2020.

(Continued)

*Primary Examiner* — Alfredo Bermudez Lozada
(74) *Attorney, Agent, or Firm* — DLA PIPER LLP US

(57) ABSTRACT

In one example, a system comprises a neural network array of non-volatile memory cells arranged in rows and columns; and a logical cell comprising a first plurality of non-volatile memory cells in a first row of the array and a second plurality of non-volatile memory cells in a second row adjacent to the first row; wherein the first plurality of non-volatile memory cells and the second plurality of non-volatile memory cells are configured as one or more coarse cells and one or more fine cells.

15 Claims, 50 Drawing Sheets

(51) Int. Cl.
  *G11C 11/56* (2006.01)
  *G11C 16/04* (2006.01)
  *G11C 16/14* (2006.01)
  *G11C 16/34* (2006.01)

(52) U.S. Cl.
  CPC ...... *G11C 16/0425* (2013.01); *G11C 16/0433* (2013.01); *G11C 16/14* (2013.01); *G11C 16/3459* (2013.01)

(56) References Cited

U.S. PATENT DOCUMENTS

| | | |
|---|---|---|
| 2010/0074007 A1 | 3/2010 | Parker |
| 2016/0293260 A1 | 10/2016 | Tran |
| 2016/0314843 A1 | 10/2016 | Tseng |
| 2017/0337466 A1 | 5/2017 | Bayat |
| 2019/0164617 A1 | 5/2019 | Tran et al. |
| 2019/0287621 A1 | 9/2019 | Tran et al. |
| 2021/0272639 A1* | 9/2021 | Dhotre .................... G06F 9/542 |
| 2023/0238067 A1* | 7/2023 | Zhao ..................... G11C 16/12 365/185.22 |

OTHER PUBLICATIONS

Taiwanese Office Action mailed on Mar. 8, 2022 pertaining to the related Taiwanese Patent Application No. 110114844.
Japanese Office Action mailed on Dec. 12, 2023 corresponding to the related Japanese Patent Application No. 2022-568435.
S. Korean Office Action mailed on Mar. 26, 2024 corresponding to the related S. Korean Patent Application No. 10-2022-7036139.

\* cited by examiner

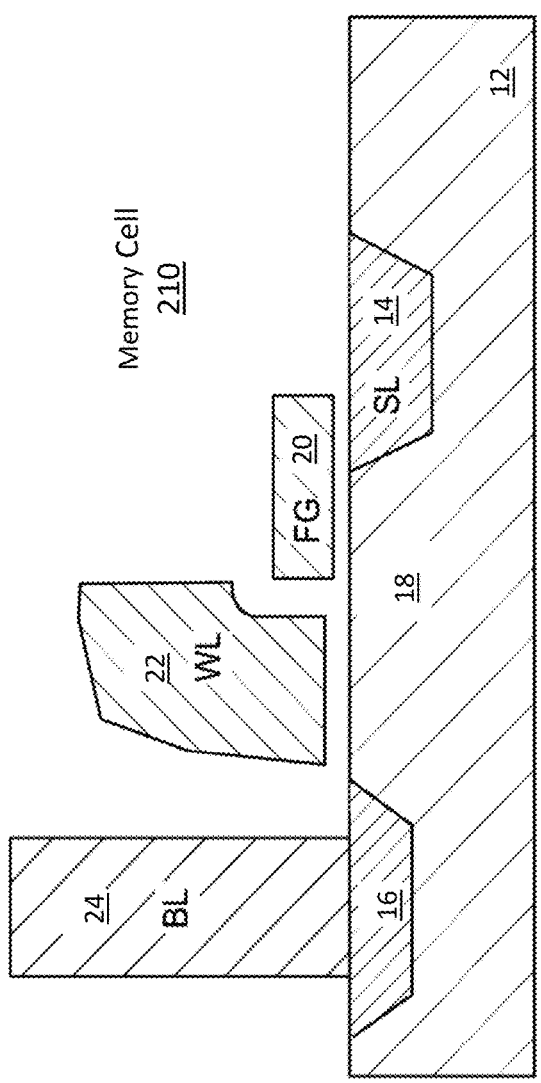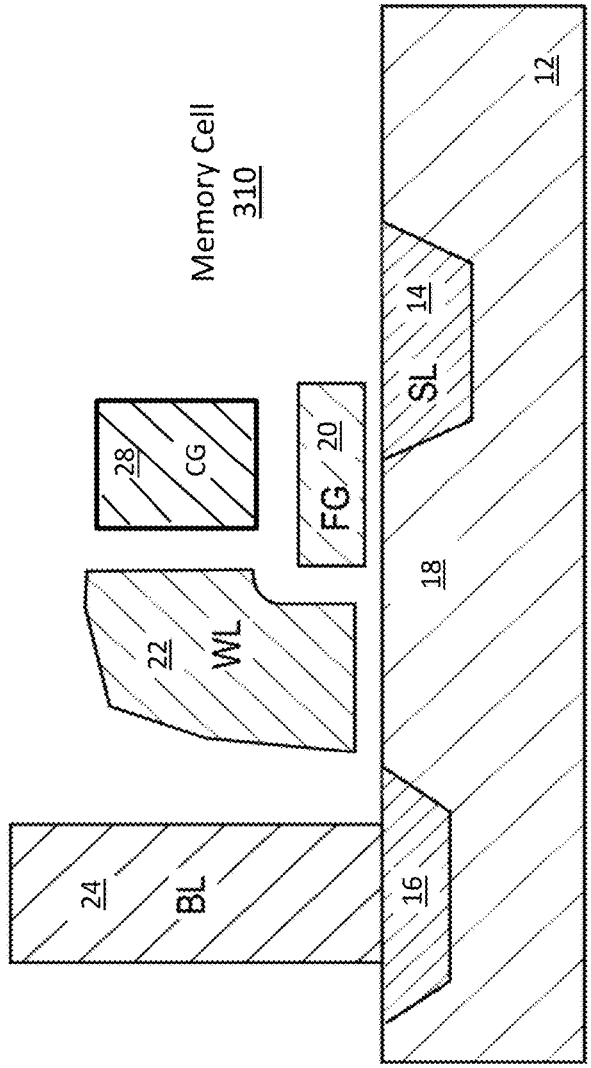
FIGURE 2
(PRIOR ART)
FIGURE 3
(PRIOR ART)

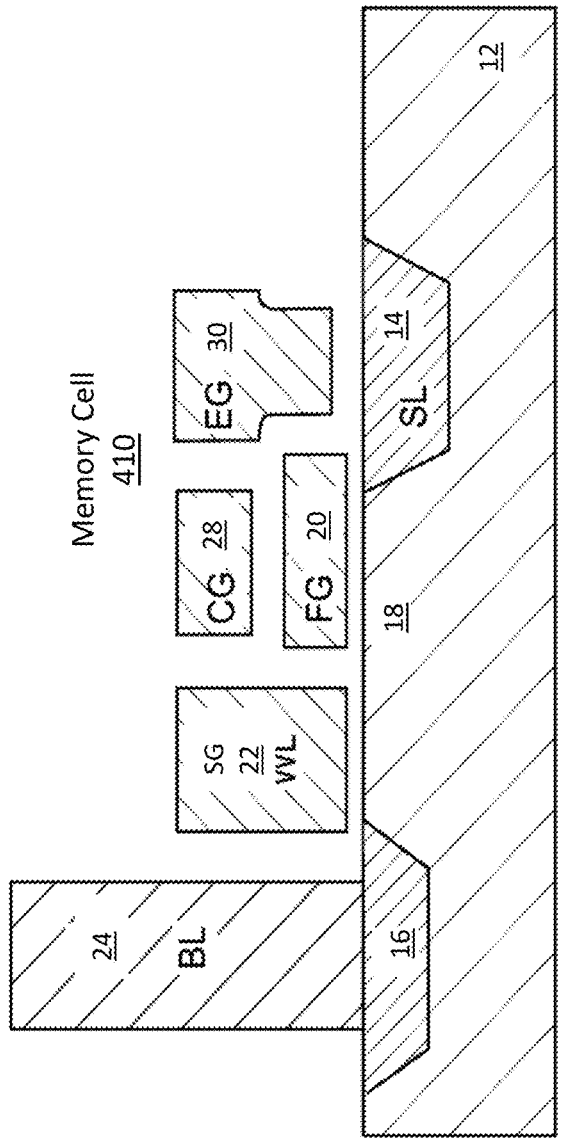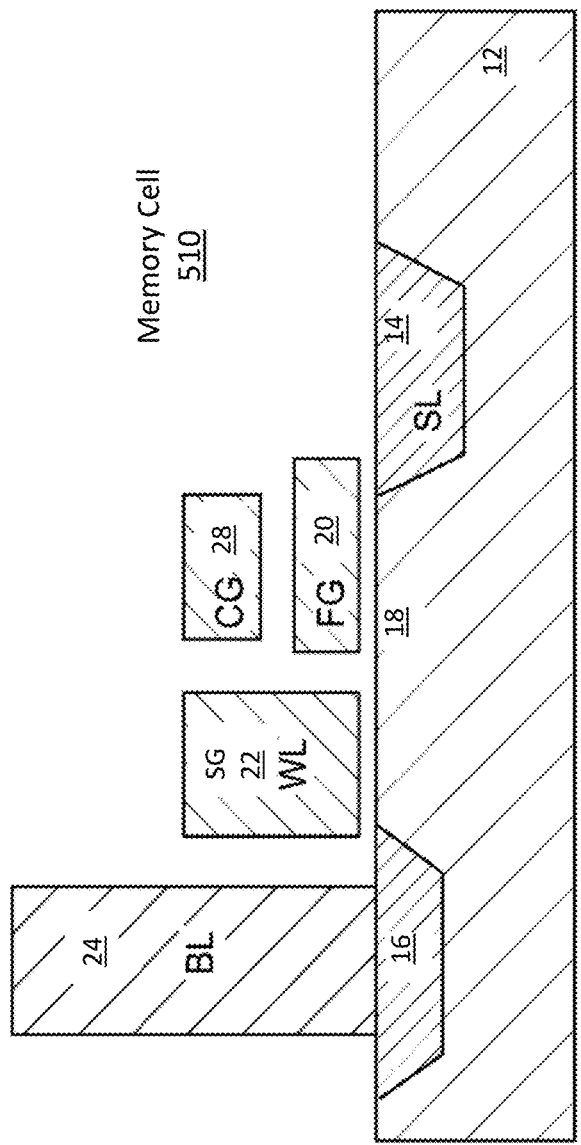
**FIGURE 4
(PRIOR ART)**
**FIGURE 5
(PRIOR ART)**

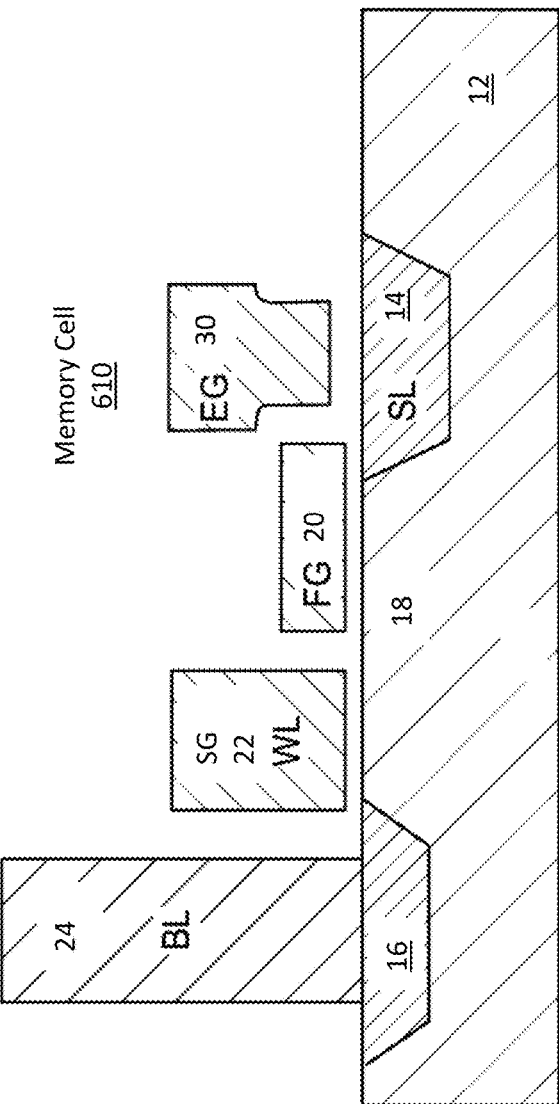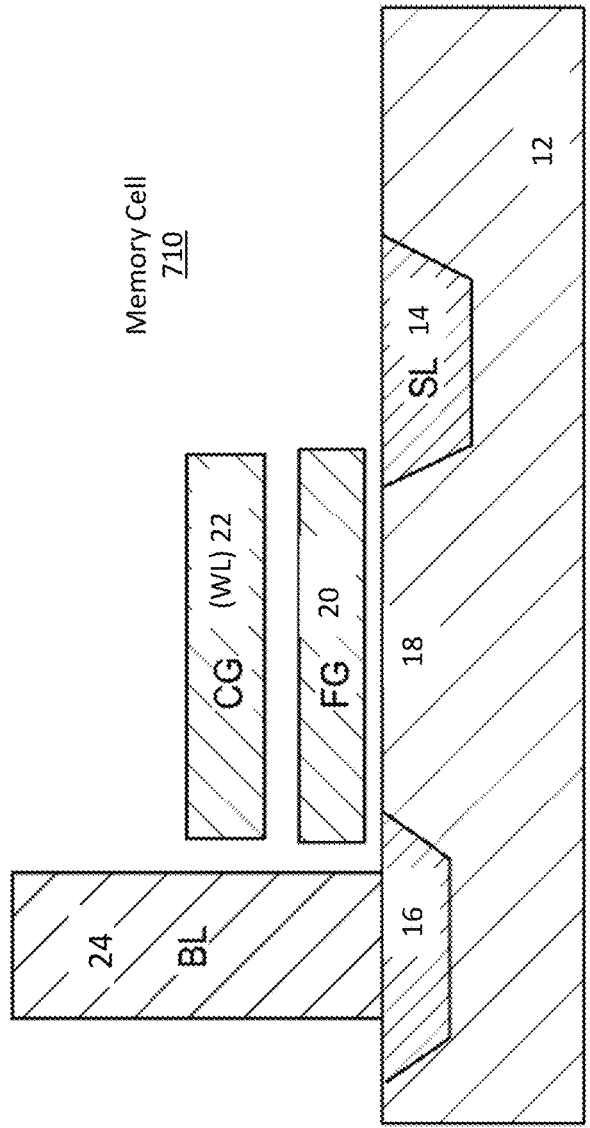
FIGURE 6
(PRIOR ART)
FIGURE 7
(PRIOR ART)

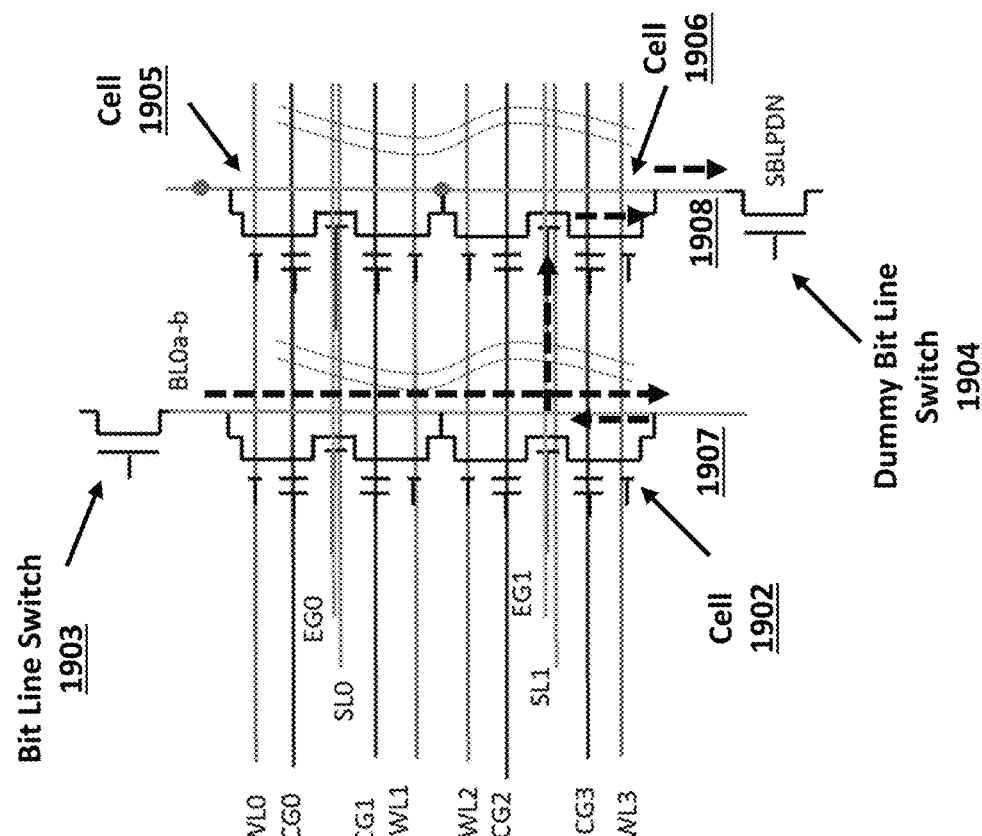
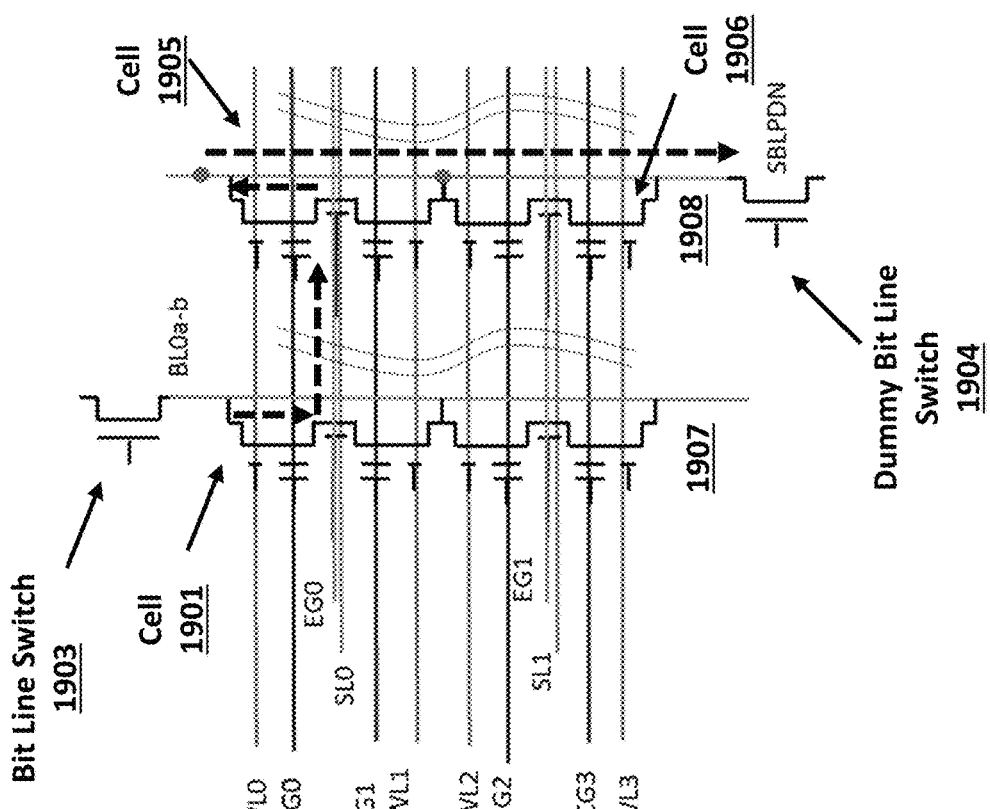

Output Circuit
3400

Output Circuit
3410

Output Circuit
3420

FIGURE 48

Array 4800

| | Tuning BL 4801-1 | Mixed BL 4801-2 | Coarse BL 4801-3 | Tuning BL 4801-4 | Mixed BL 4801-5 | Coarse BL 4801-6 |
|---|---|---|---|---|---|---|
| Row 4810 | Tuning Cell 4811-1 | Coarse Cell 4811-2 | Coarse Cell 4811-3 | Tuning Cell 4811-4 | Coarse Cell 4811-5 | Coarse Cell 4811-6 |
| Row 4820 | Tuning Cell 4821-1 | Fine Cell 4821-2 | Coarse Cell 4821-3 | Tuning Cell 4821-4 | Fine Cell 4821-5 | Tuning Cell 4821-6 |
| Row 4830 | Tuning Cell 4831-1 | Coarse Cell 4831-1 | Coarse Cell 4831-1 | Tuning Cell 4831-4 | Coarse Cell 4831-5 | Coarse Cell 4831-6 |
| Row 4840 | Tuning Cell 4841-1 | Fine Cell 4841-1 | Coarse Cell 4841-1 | Tuning Cell 4841-4 | Fine Cell 4841-5 | Coarse Cell 4841-6 |

Logical Cell 4851 (encompasses Tuning Cell 4811-1, Tuning Cell 4821-1, Coarse Cell 4811-3, Coarse Cell 4821-3)

NEURAL NETWORK ARRAY COMPRISING ONE OR MORE COARSE CELLS AND ONE OR MORE FINE CELLS

PRIORITY CLAIM

This application is a divisional of U.S. patent application Ser. No. 17/082,956, filed on Oct. 28, 2020, titled, "Analog Neural Memory Array in Artificial Neural Network Comprising Logical Cells and Improved Programming Mechanism," which claims priority to U.S. Provisional Patent Application No. 63/024,351, filed on May 13, 2020, and titled, "Analog Neural Memory Array in Artificial Neural Network Comprising Logical Cells and Improved Programming Mechanism," which is incorporated by reference herein.

FIELD OF THE INVENTION

Numerous examples of neural network arrays and associated programming mechanisms are disclosed.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Examples of different non-volatile memory cells that can be used in VMMs will now be discussed.

Non-Volatile Memory Cells

Various types of known non-volatile memory cells can be used in the VMM arrays. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become energized (heated) when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 µA | 8-11 V | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 µA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). Programming is performed using hot electron injection from channel 18 to floating gate 20 in the channel region next to the drain region 16, and erasing is performed using by Fowler-Nordheim electron tunneling from floating gate 20 to substrate 12. The read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

FIG. 8 depicts twin split-gate memory cell 810. Memory cell 810 comprises floating gate (FG) 20 disposed over and insulated from the substrate 12, a control gate 28 (CG) disposed over and insulated from the floating gate 20, an erase gate 30 (EG) disposed adjacent to and insulated from the floating and control gates 20/28 and disposed over and insulated from the substrate 12, where the erase gate is created with a T shape such that a top corner of the control gate CG faces the inside corner of the T shaped erase gate to improve erase efficiency, and a drain region 16 (DR) in the substrate adjacent the floating gate 20 (with a bit line contact 24 (BL) connected to the drain diffusion regions 16 (DR)). The memory cells are formed as pairs of memory cells (A on the left and B on the right), sharing a common erase gate 30. This cell design differs from that the memory cells discussed above with reference to FIGS. 2-7 at least in that it lacks a source region under the erase gate EG, lacks a select gate (also referred to as a word line), and lacks a channel region for each memory cell. Instead, a single continuous channel region 18 extends under both memory cells (i.e. extends from the drain region 16 of one memory cell to the drain region 16 of the other memory cell). To read or program one memory cell, the control gate 28 of the other memory cell is raised to a sufficient voltage to turn on the underlying channel region portion via voltage coupling to the floating gate 20 there between (e.g. to read or program cell A, the voltage on FGB is raised via voltage coupling from CGB to turn on the channel region portion under FGB). Erasing is performed using Fowler Nordheim electron tunneling from floating gate 20 to erase gate 30. Programming is performed using hot electron injection from channel 18 to floating gate 20, this is indicated as PROGRAM 1 in Table 5. Alternatively, programming is performed using Fowler Nordheim electron tunneling from erase gate 30 to floating gate 20, this is indicated as PROGRAM 2 in Table 5. Alternatively programming is performed using Fowler Nordheim electron tunneling from channel 18 to floating gate 20, in this case the condition is similar to PROGRAM 2 except the substrate is biased at a low voltage or negative voltage while erase gate is biased at a low positive voltage.

Table No. 5 depicts typical voltage ranges that can be applied to the terminals of memory cell 810 for performing read, erase, and program operations. Cell A (FG,CGA,BLA) is selected for read, program, and erase operation.

TABLE NO. 5

Operation of Flash Memory Cell 810 of FIG. 8

|  | CGA | BLA | EG | CGB | BLB |
|---|---|---|---|---|---|
| READ | 1.5-4 V | 0.1-0.8 V | 2.5 V | 1.5-4 V | 0 |
| ERASE | 0 V to −8 V | 0 V | 8 V to 11.5 V | 0 V to 4 V (Vcginhe) | 0 V |
| PROGRAM 1 | 10.5 V | 4.5 V | 1.5 V | 4 | Iprog |
| PROGRAM 2 | 4 V to 11.5 V | 0 V | −4 V to −11.5 V | 0 V to −2 V (Vcginhp) | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

FIG. 9 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 10 is a block diagram of a system that can be used for that purpose. VMM system 32 includes non-volatile memory cells and is utilized as the synapses (such as CB 1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tanh, ReLU functions, or any other non-linear function. The rectified output values of activation function circuit 39 become an element of a feature map of the next layer (e.g. C1 in FIG. 9), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 10 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level (e.g., current, voltage, or charge), binary level, digital pulses, or digital bits (in which case an output ADC is provided to convert output analog level into digital bits).

FIG. 11 is a block diagram depicting the usage of numerous layers of VMM systems 32, here labeled as VMM systems 32a, 32b, 32c, 32d, and 32e. As shown in FIG. 11, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 11 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

FIG. 12 depicts neuron VMM array 1200, which is particularly suited for memory cells 310 as shown in FIG. 3, and is utilized as the synapses and parts of neurons between an input layer and the next layer. VMM array 1200 comprises memory array 1201 of non-volatile memory cells and reference array 1202 (at the top of the array) of non-volatile reference memory cells. Alternatively, another reference array can be placed at the bottom.

In VMM array 1200, control gate lines, such as control gate line 1203, run in a vertical direction (hence reference array 1202 in the row direction is orthogonal to control gate line 1203), and erase gate lines, such as erase gate line 1204, run in a horizontal direction. Here, the inputs to VMM array 1200 are provided on the control gate lines (CG0, CG1, CG2, CG3), and the output of VMM array 1200 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1200, i.e. the flash memory of VMM array 1200, are preferably configured to operate in a sub-threshold region.

The non-volatile reference memory cells and the non-volatile memory cells described herein are biased in weak inversion:

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log [Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg = n*Vt*\log [Ids/wp*Io]$$

Here, wp is w of a reference or peripheral memory cell.

For a memory array used as a vector matrix multiplier VMM array, the output current is:

$$Iout = wa*Io*e^{(Vg)/nVt}, \text{ namely}$$

$$Iout = (wa/wp)*Iin = W*Iin$$

$$W = e^{(Vthp-Vtha)/nVt}$$

$$Iin = wp*Io*e^{(Vg)/nVt}$$

Here, wa=w of each memory cell in the memory array.

Vthp is effective threshold voltage of the peripheral memory cell and Vtha is effective threshold voltage of the main (data) memory cell.

Note that threshold voltage of a transistor is a function of substrate body bias voltage and the substrate body bias can be modulated for various compensation such as over temperature or by modulating the cell current $$Vth = Vth0 + \text{gamma}(SQRT(Vsb+|2*\phi F|) - SQRT|2*\phi F|)$$

Vth0 is threshold voltage with zero substrate bias, $\phi F$ is surface potential, gamma is body effect parameter.

A wordline or control gate can be used as the input for the memory cell for the input voltage.

Alternatively, the non-volatile memory cells of VMM arrays described herein can be configured to operate in the linear region:

$$Ids = \text{beta}*(Vgs-Vth)*Vds; \text{ beta}=u*Cox*Wt/L,$$

$$W \alpha (Vgs-Vth),$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = \frac{1}{2}*\text{beta}*(Vgs-Vth)^2; \text{ beta}=u*Cox*Wt/L$$

$$W \alpha (Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

FIG. 13 depicts neuron VMM array 1300, which is particularly suited for memory cells 210 as shown in FIG. 2, and is utilized as the synapses between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1314 (only partially depicted) with current inputs flowing into them. The reference cells are tuned (e.g., programmed) to target reference levels. The target reference levels are provided by a reference mini-array matrix (not shown).

Memory array 1303 serves two purposes. First, it stores the weights that will be used by the VMM array 1300 on respective memory cells thereof. Second, memory array 1303 effectively multiplies the inputs (i.e. current inputs provided in terminals BLR0, BLR1, BLR2, and BLR3, which reference arrays 1301 and 1302 convert into the input voltages to supply to wordlines WL0, WL1, WL2, and WL3) by the weights stored in the memory array 1303 and then adds all the results (memory cell currents) to produce the output on the respective bit lines (BL0-BLN), which will be the input to the next layer or input to the final layer. By performing the multiplication and addition function, memory array 1303 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE No. 6

| Operation of VMM Array 1300 of FIG. 13: | | | | | |
|---|---|---|---|---|---|
| | WL | WL -unsel | BL | BL -unsel | SL | SL -unsel |
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 14 depicts neuron VMM array 1400, which is particularly suited for memory cells 210 as shown in FIG. 2, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 run in row direction of the VMM array 1400. VMM array is similar to VMM 1300 except that in VMM array 1400, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 7 depicts operating voltages for VMM array 1400. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 of first non-volatile reference memory cells, and reference array 1502 of second non-volatile reference memory cells. Reference arrays 1501 and 1502 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1512 (only partially shown) with current inputs flowing into them through BLR0, BLR1, BLR2, and BLR3. Multiplexors 1512 each include a respective multiplexor 1505 and a cascoding transistor 1504 to ensure a constant voltage on the bitline (such as BLR0) of each of the first and second non-volatile reference memory cells during a read operation. The reference cells are tuned to target reference levels.

Memory array 1503 serves two purposes. First, it stores the weights that will be used by the VMM array 1500. Second, memory array 1503 effectively multiplies the inputs (current inputs provided to terminals BLR0, BLR1, BLR2, and BLR3, for which reference arrays 1501 and 1502 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1500 implements uni-directional tuning for non-volatile memory cells in memory array 1503. That is, each non-volatile memory cell is erased and then partially programmed until the desired charge on the floating gate is reached. This can be performed, for example, using the precision programming techniques described below. If too TABLE No. 7

| Operation of VMM Array 1400 of FIG. 14 | | | | | |
|---|---|---|---|---|---|
| | WL | WL -unsel | BL | BL -unsel | SL | SL -unsel |
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT | much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No. 8

Operation of VMM Array 1500 of FIG. 15

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 90.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 16 depicts neuron VMM array 1600, which is particularly suited for memory cells 310 as shown in FIG. 3, and is utilized as the synapses and parts of neurons between an input layer and the next layer. VMM array 1600 comprises a memory array 1603 of non-volatile memory cells, reference array 1601 or first non-volatile reference memory cells, and reference array 1602 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1600 is similar to VMM array 1600, except that VMM array 1600 implements bi-directional tuning, where each individual cell can be completely erased, partially programmed, and partially erased as needed to reach the desired amount of charge on the floating gate due to the use of separate EG lines. As shown, reference arrays 1601 and 1602 convert input current in the terminal BLR0, BLR1, BLR2, and BLR3 into control gate voltages CG0, CG1, CG2, and CG3 (through the action of diode-connected reference cells through multiplexors 1614) to be applied to the memory cells in the row direction. The current output (neuron) is in the bitlines BL0-BLN, where each bit line sums all currents from the non-volatile memory cells connected to that particular bitline.

Table No. 9 depicts operating voltages for VMM array 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No. 9

Operation of VMM Array 1600 of FIG. 16

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight w can be implemented by a single memory cell or by a differential cell or by two blend memory cells (average of 2 or more cells). In the differential cell case, two memory cells are needed to implement a weight w as a differential weight (w=w+−w−). In the two blend memory cells, two memory cells are needed to implement a weight w as an average of two cells.

One challenge with VMM arrays is that they require extreme precision during the programming process. For example, if each cell in the VMM array can store one of N different values (e.g., N=64 or 128), then the system must be able to deposit small increments of additional charge on the floating gate of the selected cell to achieve the desired change in level. One the other hand, it is still important that programming be as fast as possible, and there is an inherent tradeoff between programming precision and programming speed.

What is needed is an improved VMM system that is able to achieve precise programming while still completing the programming process at a relatively quick pace.

SUMMARY OF THE INVENTION

In one example, a system comprises a neural network array of non-volatile memory cells arranged in rows and columns; and a logical cell comprising a first plurality of non-volatile memory cells in a first row of the array and a second plurality of non-volatile memory cells in a second row adjacent to the first row; wherein the first plurality of non-volatile memory cells and the second plurality of non-volatile memory cells are configured as one or more coarse cells and one or more fine cells.

BRIEF DESCRIPTION OF THE DRAWINGS

FIG. 2 depicts a prior art split gate flash memory cell.
FIG. 3 depicts another prior art split gate flash memory cell
FIG. 4 depicts another prior art split gate flash memory cell.
FIG. 5 depicts another prior art split gate flash memory cell.
FIG. 6 depicts another prior art split gate flash memory cell.
FIG. 7 depicts a prior art stacked gate flash memory cell.
FIGS. 19A, 19B, and 19C depicts an improved VMM array.
FIG. 48 depicts another embodiment of a VMM array.

DETAILED DESCRIPTION OF THE INVENTION

The artificial neural networks of the present invention utilize a combination of CMOS technology and non-volatile memory arrays.

Embodiments of Improved VMM Systems

Figure 1:
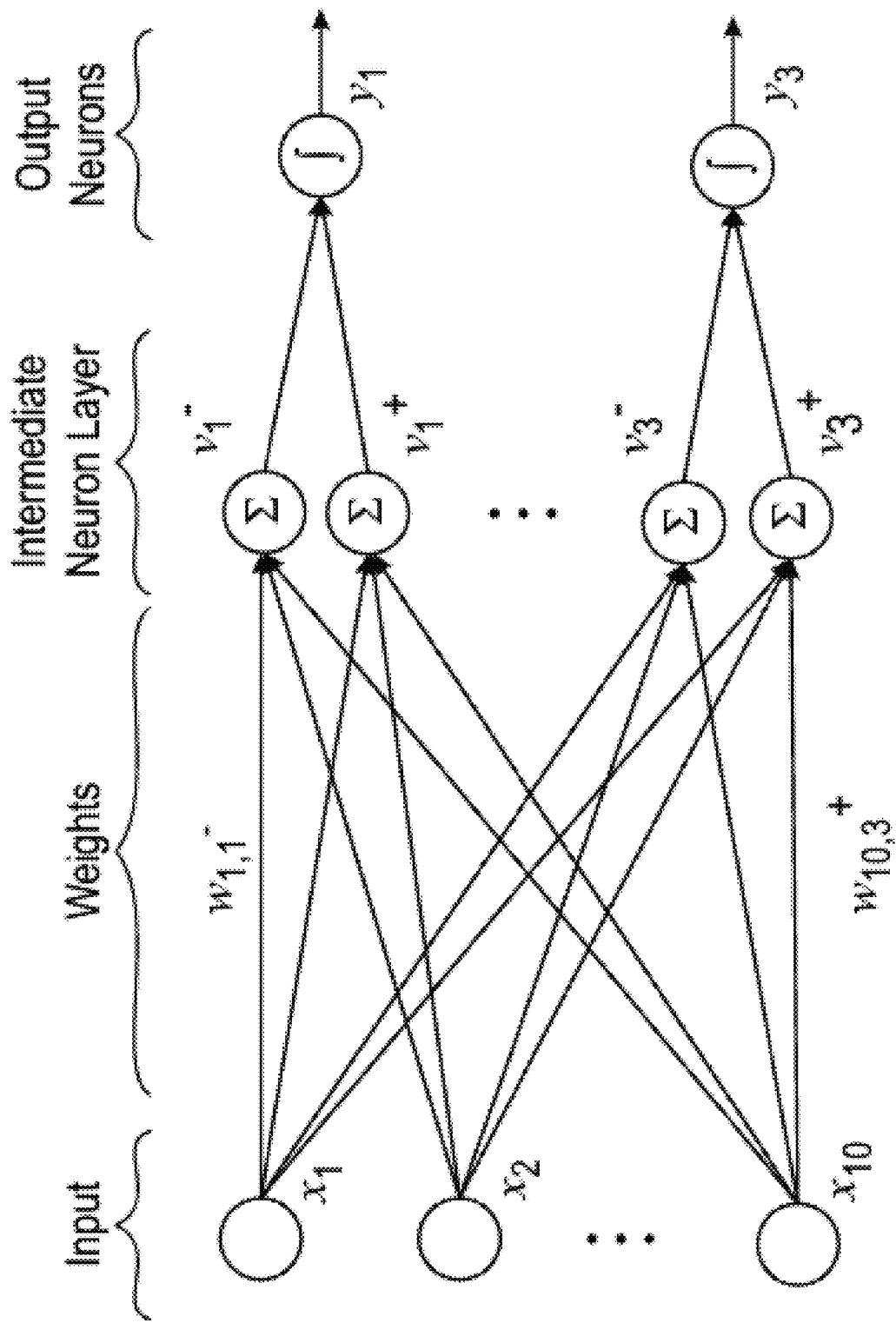
FIG. 1 depicts a prior art artificial neural network.
Figure 8:
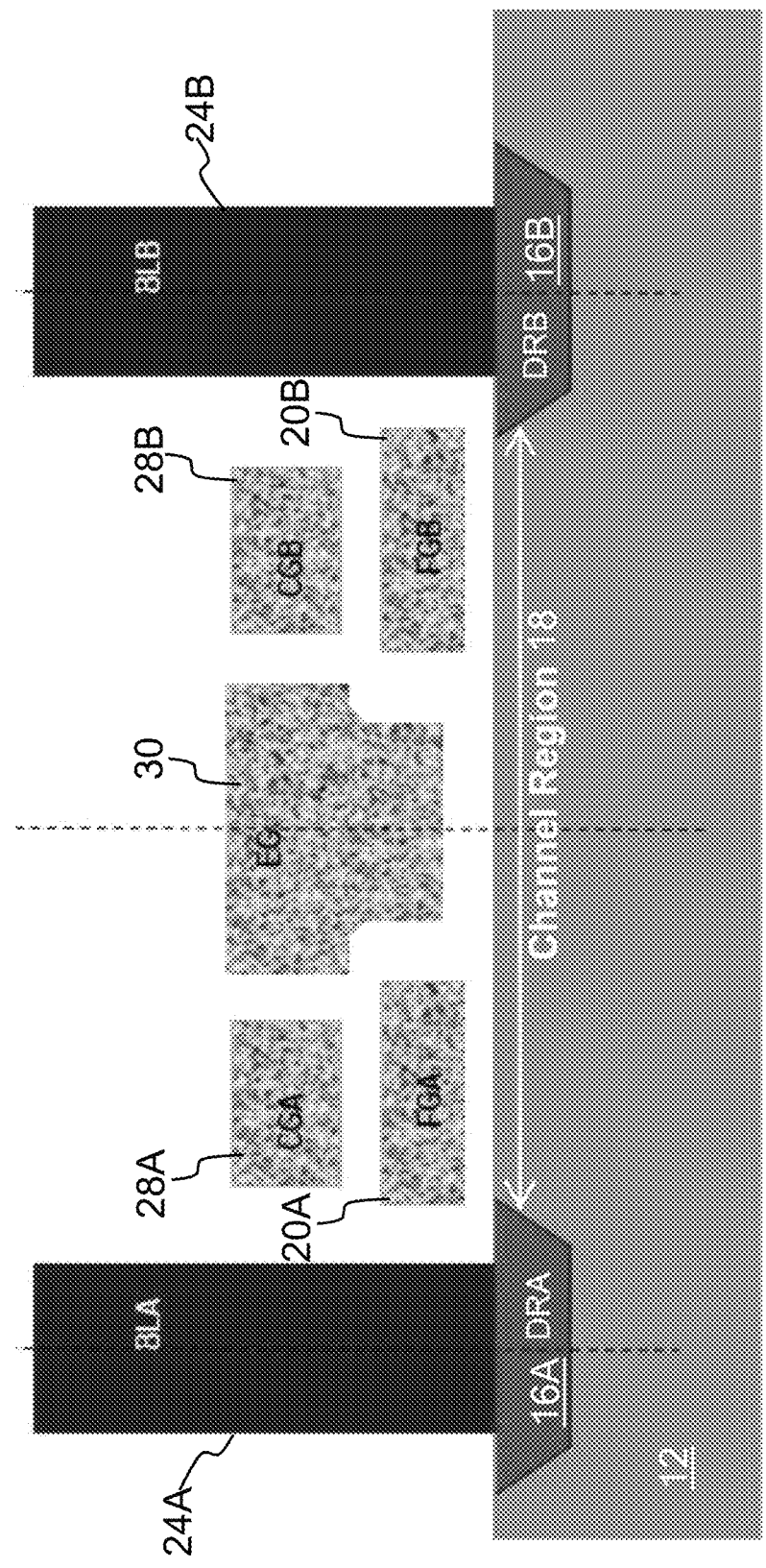
FIG. 8 depicts a twin split-gate memory cell.
Figure 9:
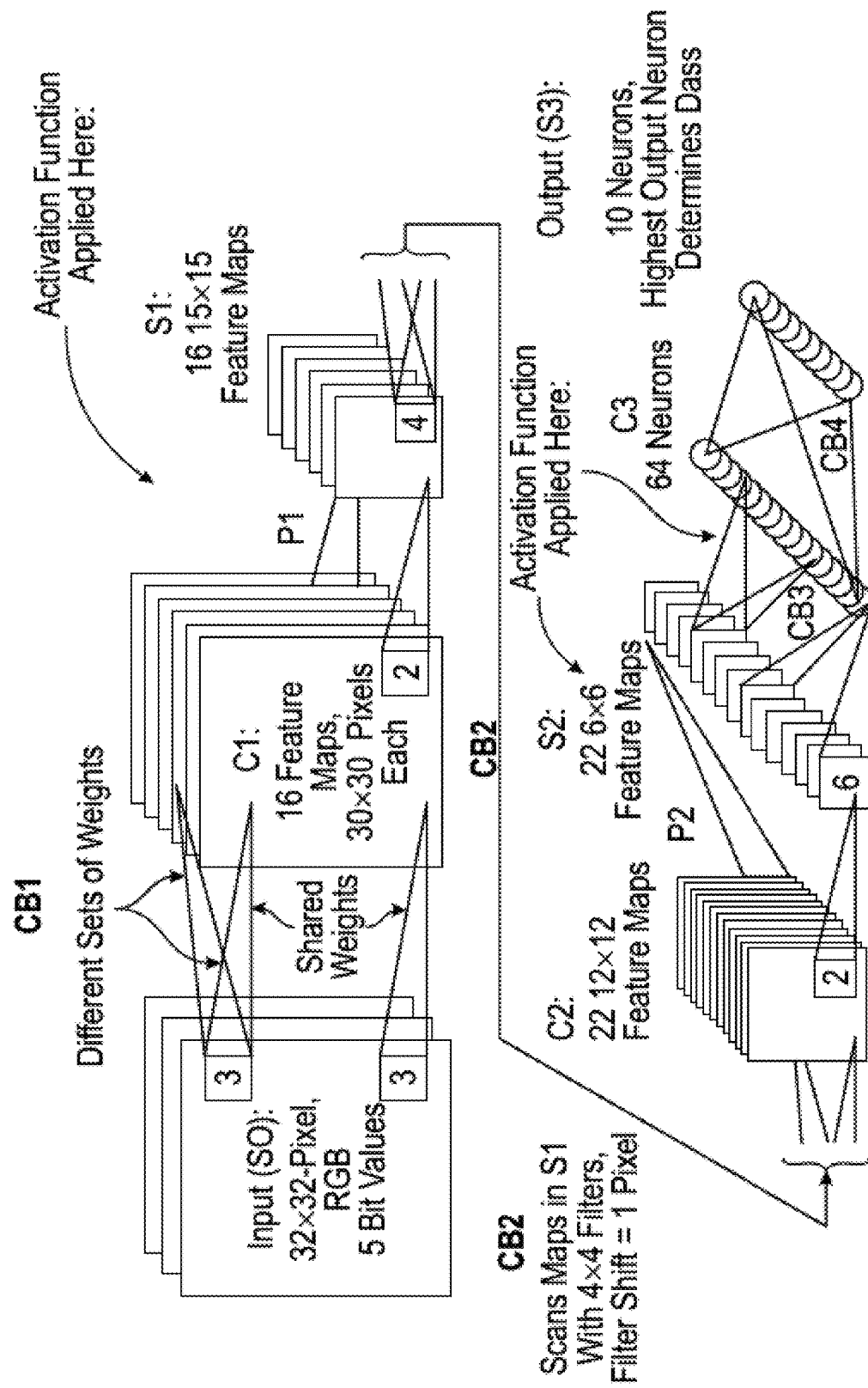
FIG. 9 depicts different levels of an exemplary artificial neural network utilizing one or more VMM arrays.
Figure 10:
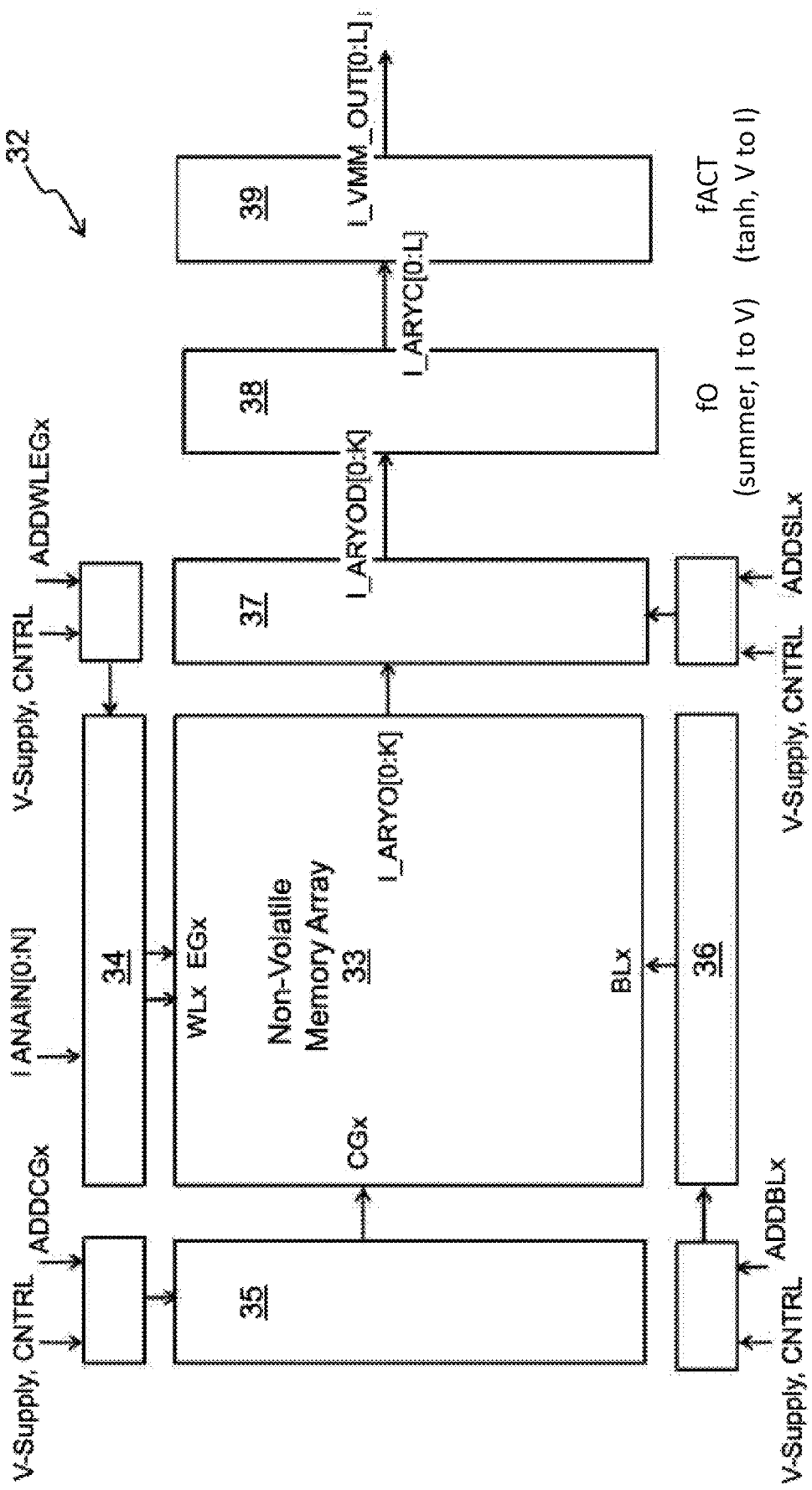
FIG. 10 depicts a VMM system comprising a VMM array and other circuitry.
Figure 11:
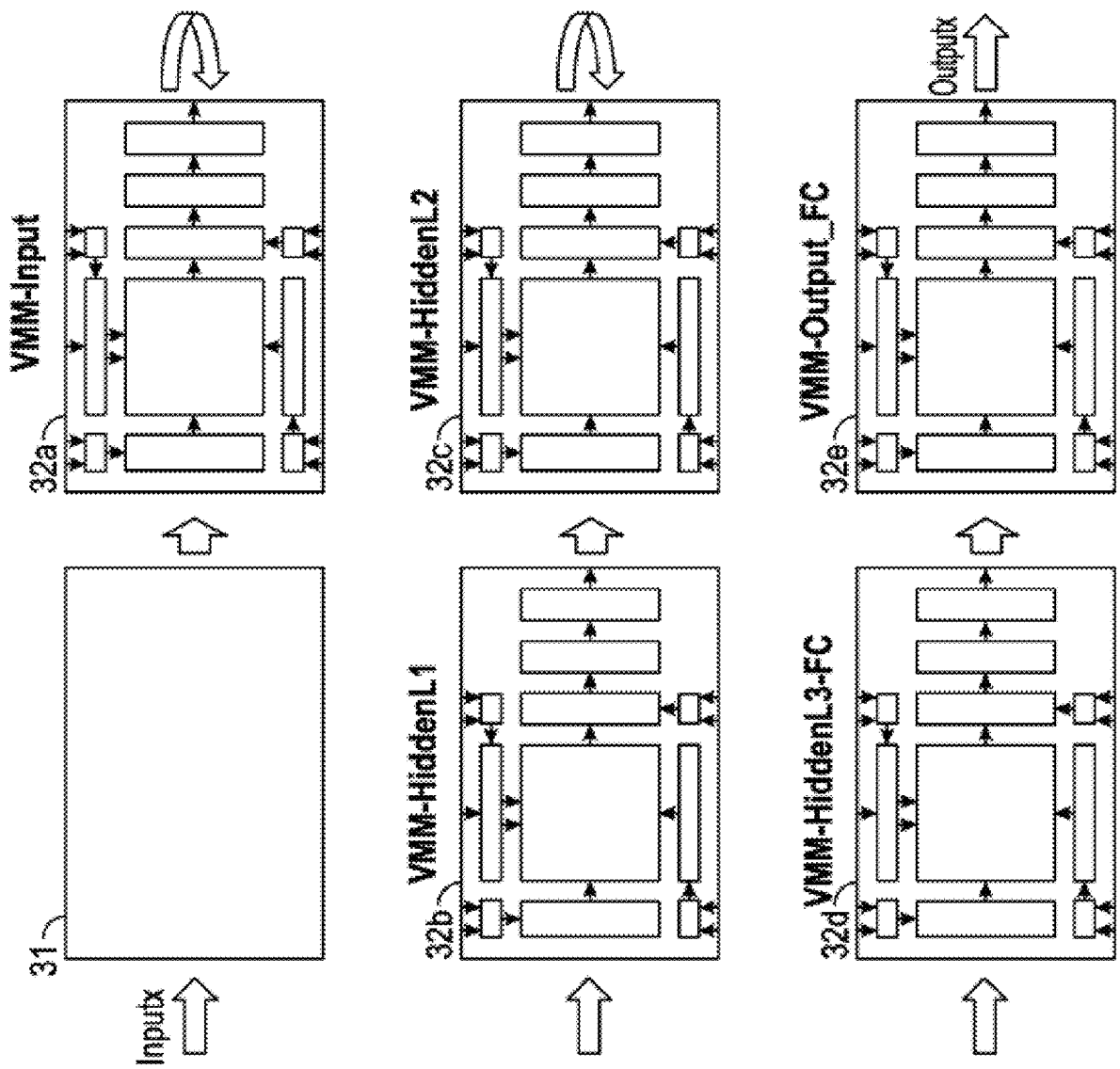
FIG. 11 depicts an exemplary artificial neural network utilizing one or more VMM systems.
Figure 12:
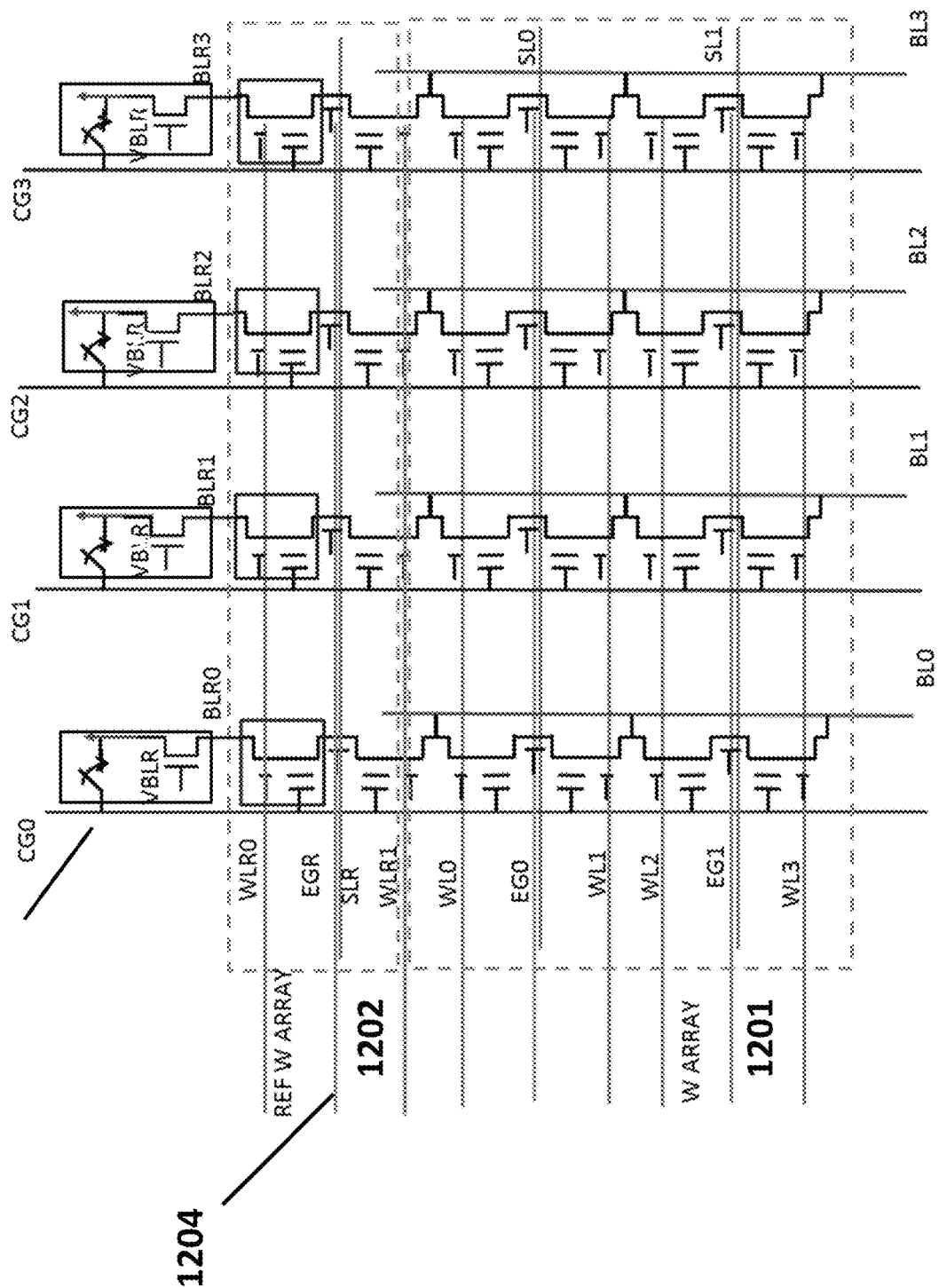
FIG. 12 depicts an embodiment of a VMM array.
Figure 13:
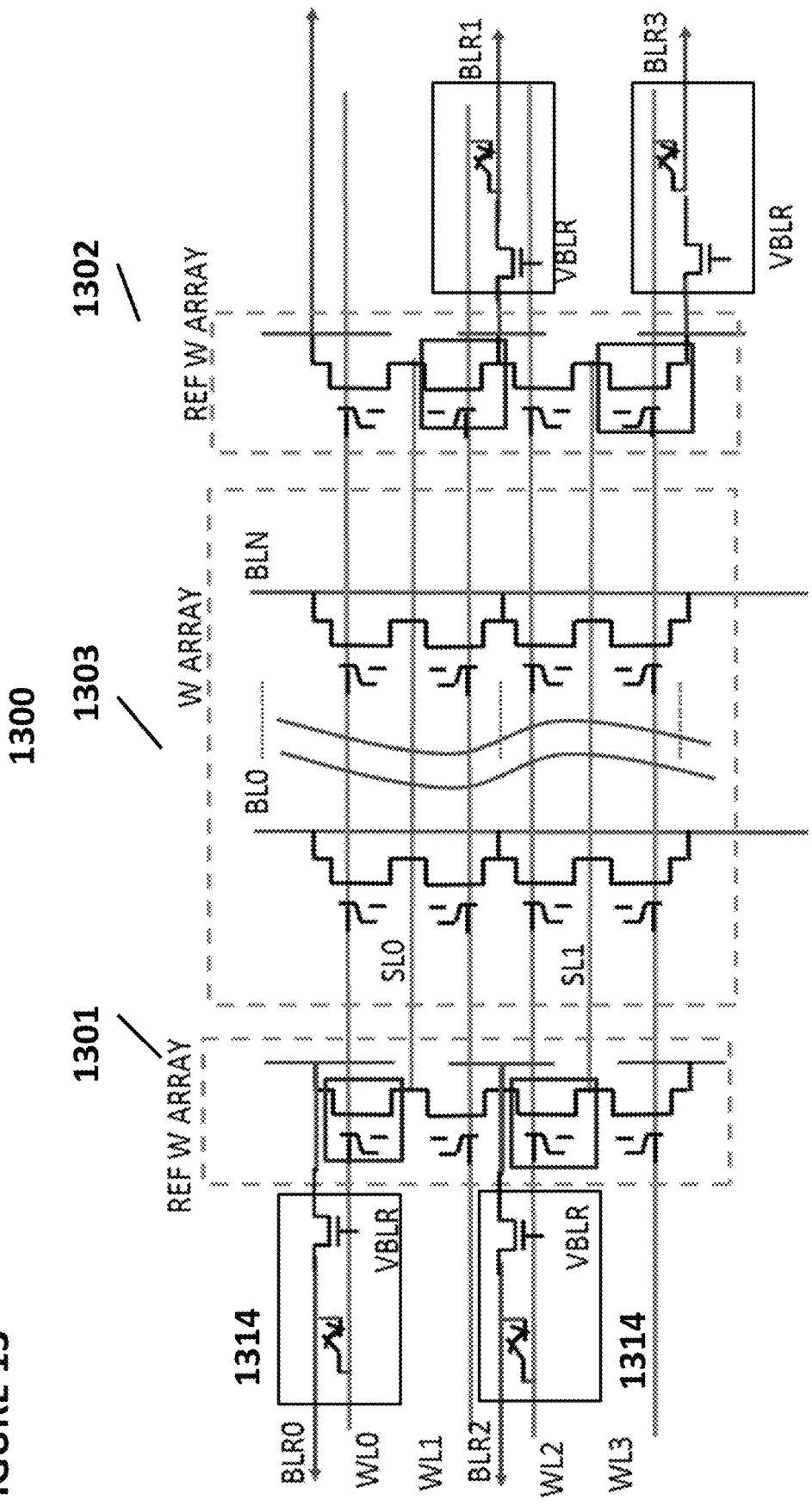
FIG. 13 depicts another embodiment of a VMM array.
Figure 14:
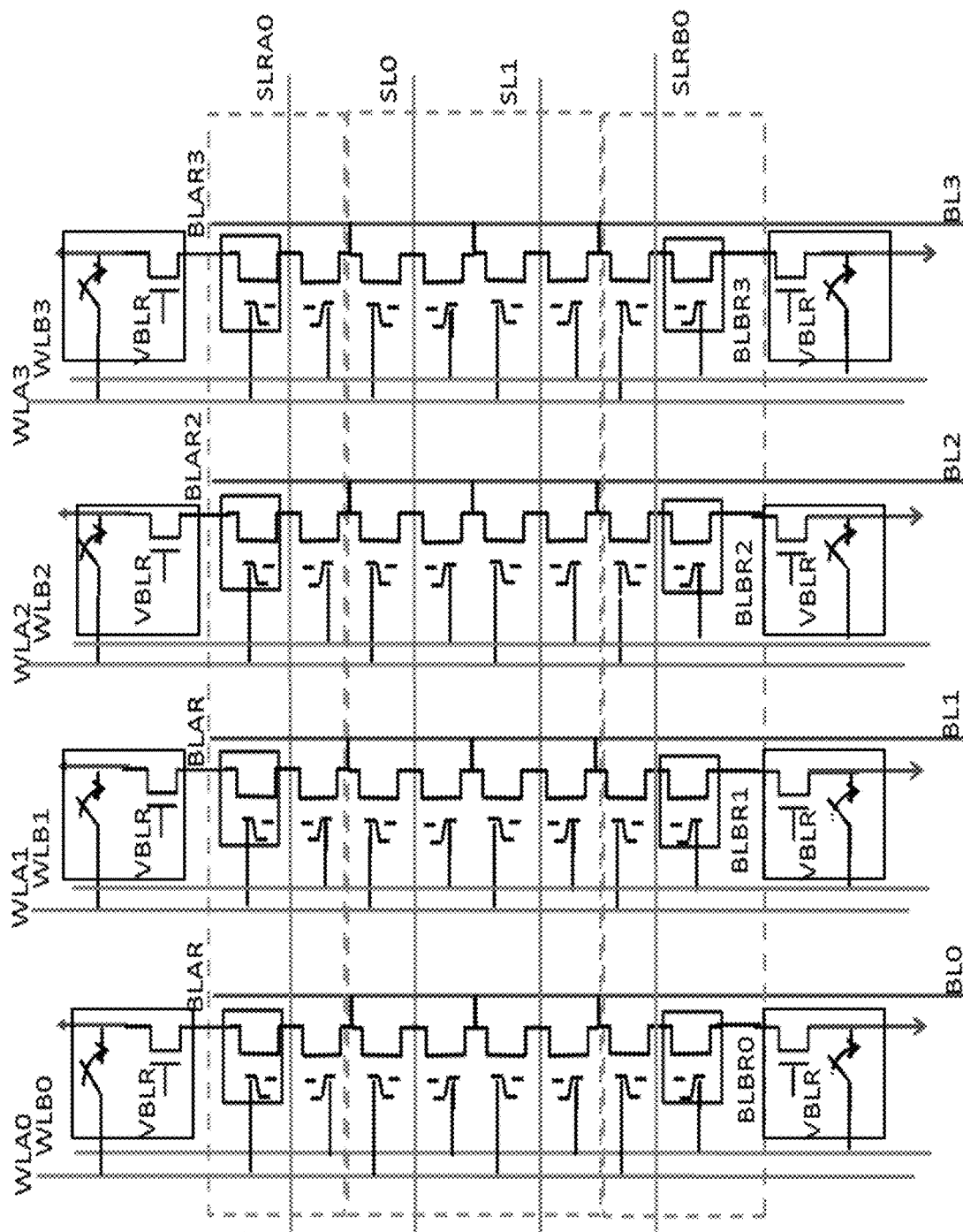
FIG. 14 depicts another embodiment of a VMM array.
Figure 15:
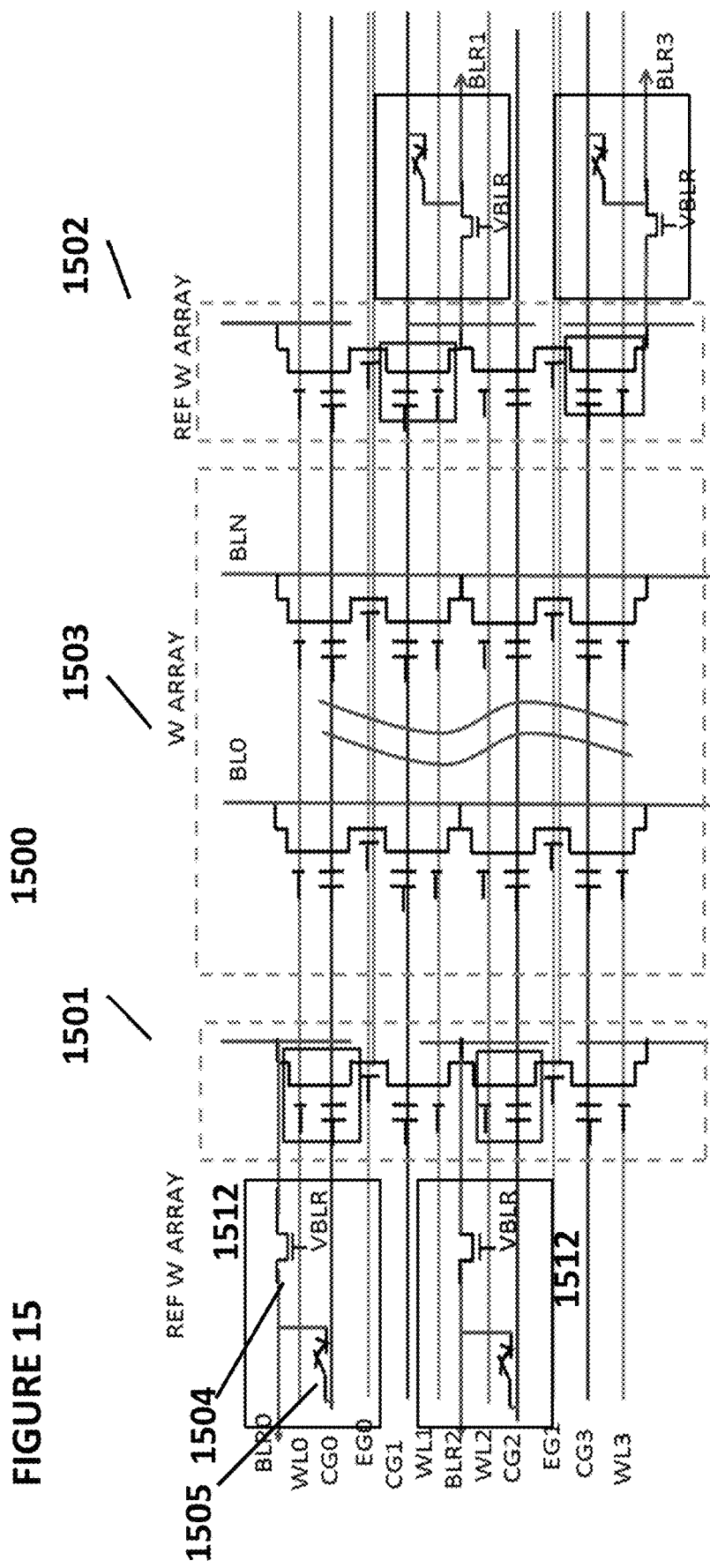
FIG. 15 depicts another embodiment of a VMM array.
Figure 16:
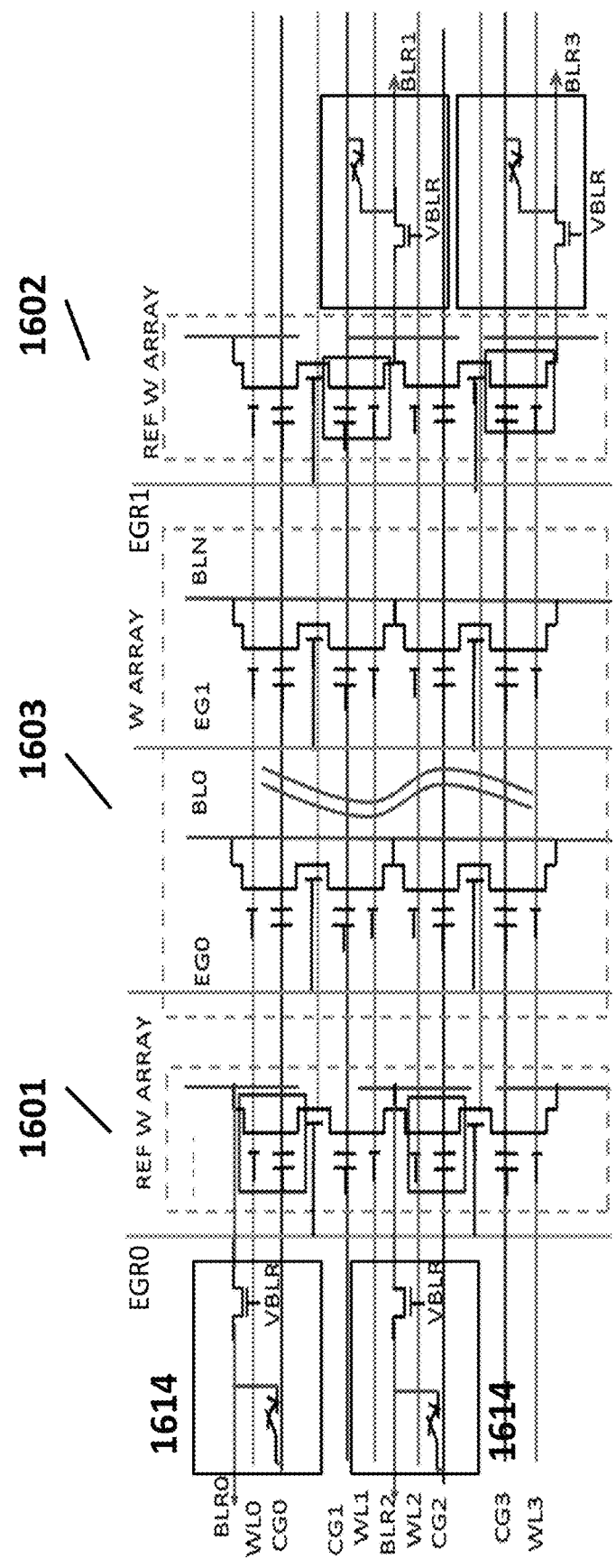
FIG. 16 depicts another embodiment of a VMM array.
Figure 17:
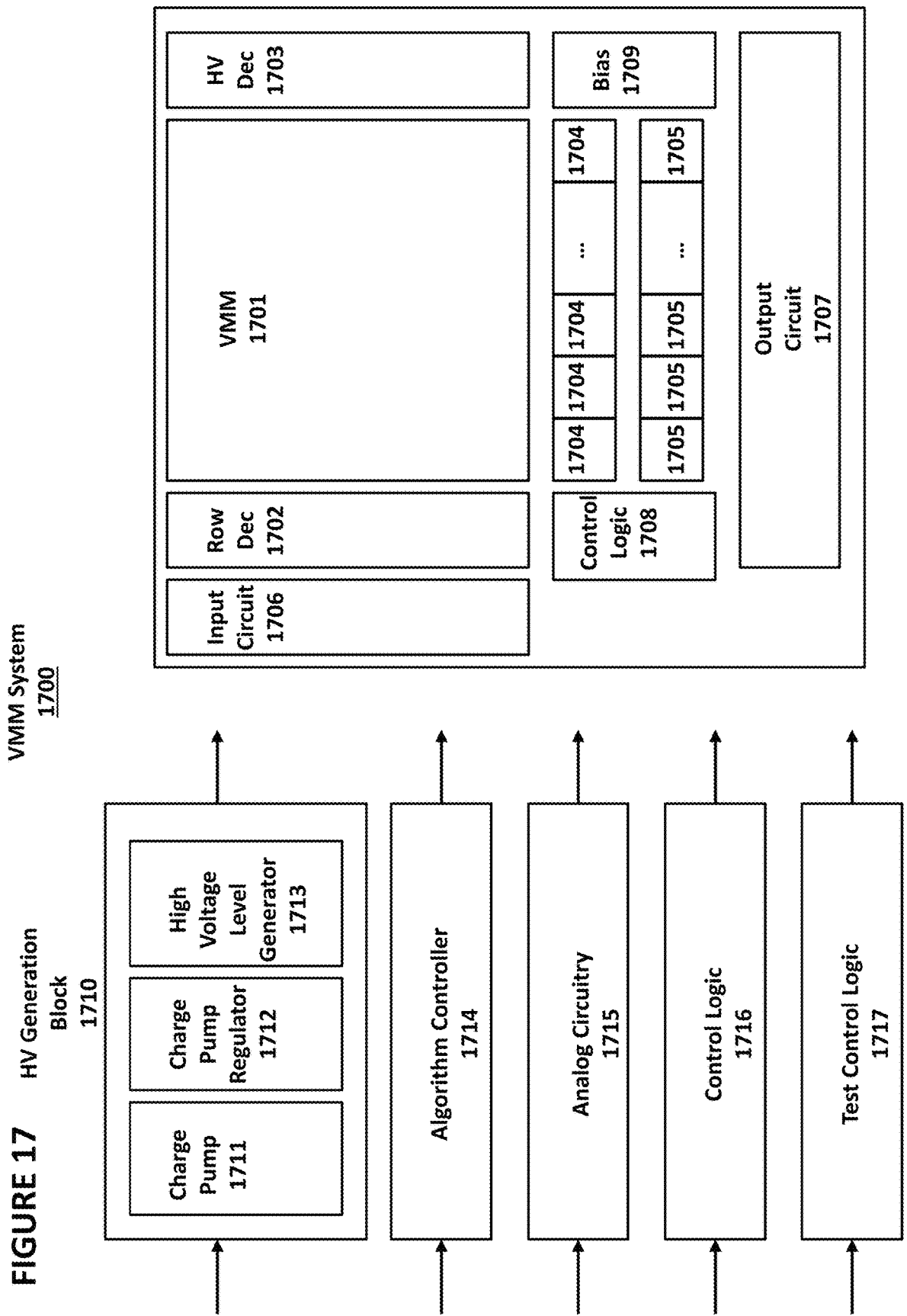
FIG. 17 depicts a VMM system.

FIG. 17 depicts a block diagram of VMM system 1700. VMM system 1700 comprises VMM array 1701, row decoders 1702, high voltage decoders 1703, column decoders 1704, bit line drivers 1705, input circuit 1706, output circuit 1707, control logic 1708, and bias generator 1709. VMM system 1700 further comprises high voltage generation block 1710, which comprises charge pump 1711, charge pump regulator 1712, and high voltage level generator 1713. VMM system 1700 further comprises algorithm controller 1714, analog circuitry 1715, control logic 1716, and test control logic 1717. The systems and methods described below can be implemented in VMM system 1700.

The input circuit 1706 may include circuits such as a DAC (digital to analog converter), DPC (digital to pulses converter), AAC (analog to analog converter, such as current to voltage converter), PAC (pulse to analog level converter), or any other type of converters. The input circuit 1706 may implement normalization, scaling functions, or arithmetic functions. The input circuit 1706 may implement temperature compensation function for input. The input circuit 1706 may implement activation function such as ReLU or sigmoid. The output circuit 1707 may include circuits such as a ADC (analog to digital converter, to convert neuron analog output to digital bits), AAC (analog to analog converter, such as current to voltage converter), APC (analog to pulse(s) converter), or any other type of converters. The output circuit 1707 may implement activation function such as ReLU or sigmoids. The output circuit 1707 may implement statistic normalization, regularization, up/down scaling functions, statistical rounding, or arithmetic functions (e.g., add, subtract, divide, multiply, shift, log) for neuron outputs. The output circuit 1707 may implement temperature compensation function for neuron outputs or array outputs (such as bitline output) such as to keep power consumption of the array approximately constant or to improve precision of the array (neuron) outputs such as by keeping the IV slope approximately the same.

Figure 18A:
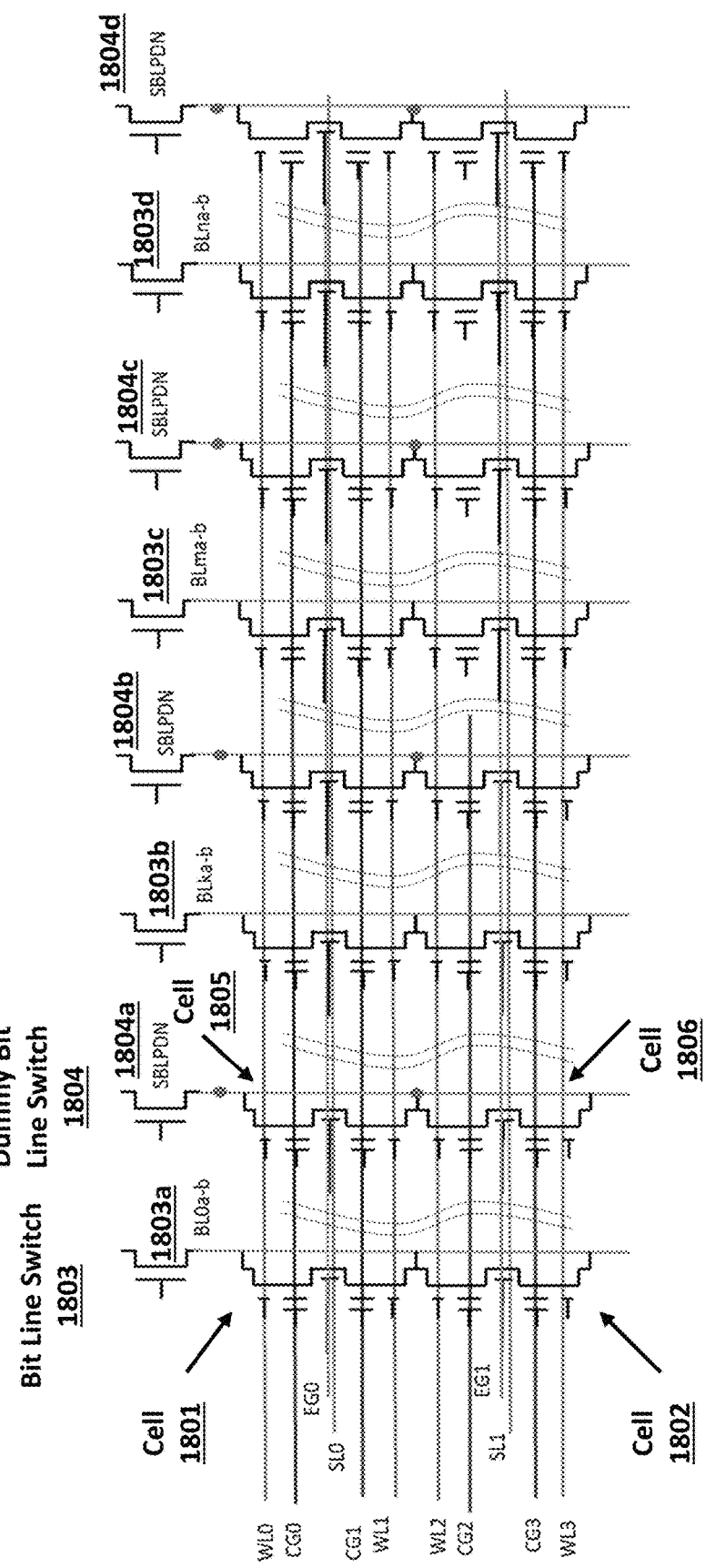
FIGS. 18A, 18B, and 18C depict a prior art VMM array.

FIG. 18A depicts prior art VMM system 1800. VMM system 1800 comprises exemplary cells 1801 and 1802, exemplary bit line switch 1803 (which connects bit lines to sensing circuitry), exemplary dummy bit line switch 1804 (which couples to a low level such as ground level in read), exemplary dummy cells 1805 and 1806 (source line pulldown cells). Bit line switch 1803 is coupled to a column of cells, including cells 1801 and 1802, that are used to store data in VMM system 1800. Dummy bit line switch 1804 is coupled to a column (bitline) of cells that are dummy cells are not used to store data in VMM system 1800. This dummy bitline (aka source line pulldown bitline) is used as source line pulldown in read, meaning used to pull the source line SL to low level such ground level through the memory cells in the dummy bitline.

Figure 18B:
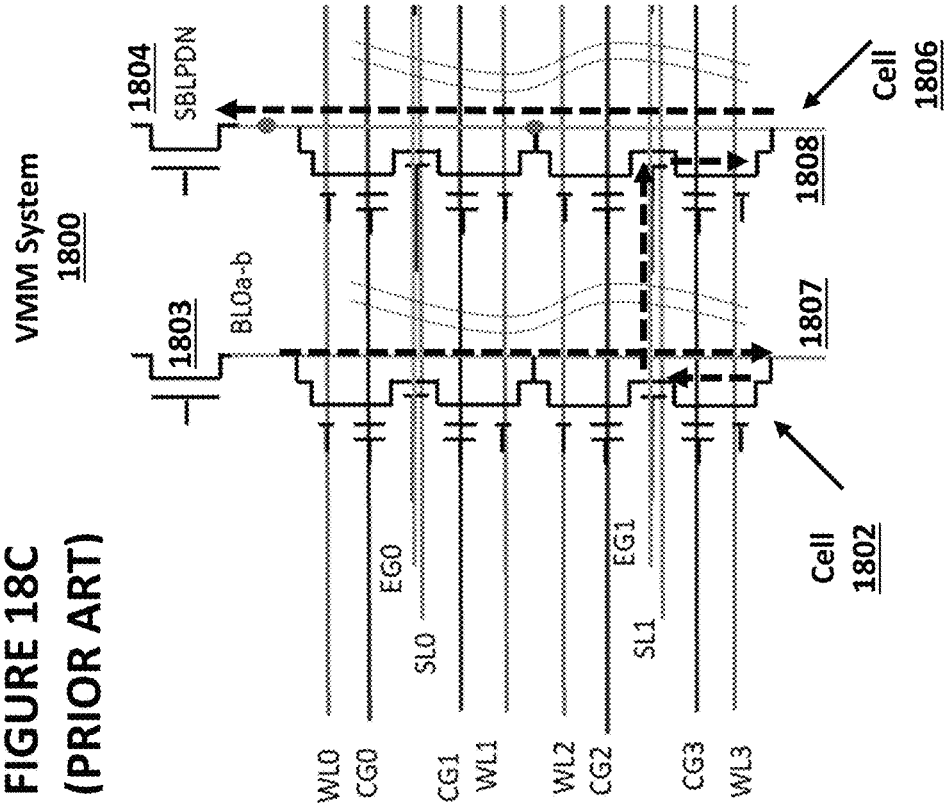
Figure 18C:
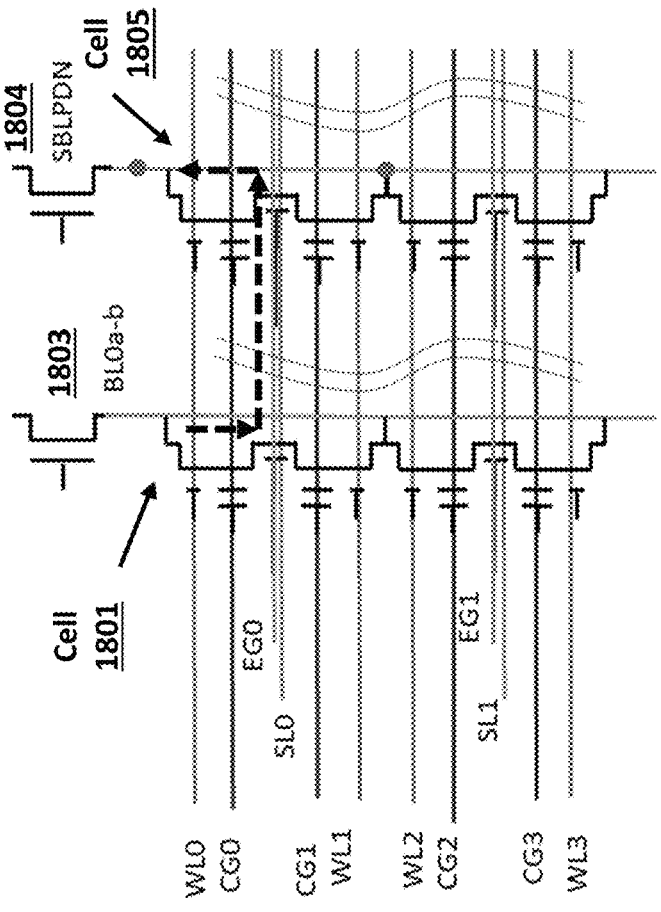

One drawback of VMM system 1800 is that the input impedance for each cell varies due to the length of the electrical path through the relevant bit line switch, the cell itself, and the relevant dummy bit line switch. For example, FIG. 18B shows the electrical path through bit line switch 1803, cell 1801, dummy cell 1805, and dummy bit line switch 1804. Similarly, FIG. 18C shows the electrical path through bit line switch 1803, vertical metal bitline 1807, cell 1802, dummy cell 1808, vertical metal bitline 1808, and dummy bit line switch 1804. As can be seen, the path through cell 1802 traverses a significantly larger length of bit line and dummy bit line, which is associated with a higher capacitance and higher resistance. This results in cell 1802 having a greater parasitic impedance in the bit line or source line than cell 1801. This variability is a drawback, for instance, because it results in a variance in the precision of the cell output as applied to read or verify (for program/erase tuning cycles) cells depending on their location within the array.

Figure 19A:
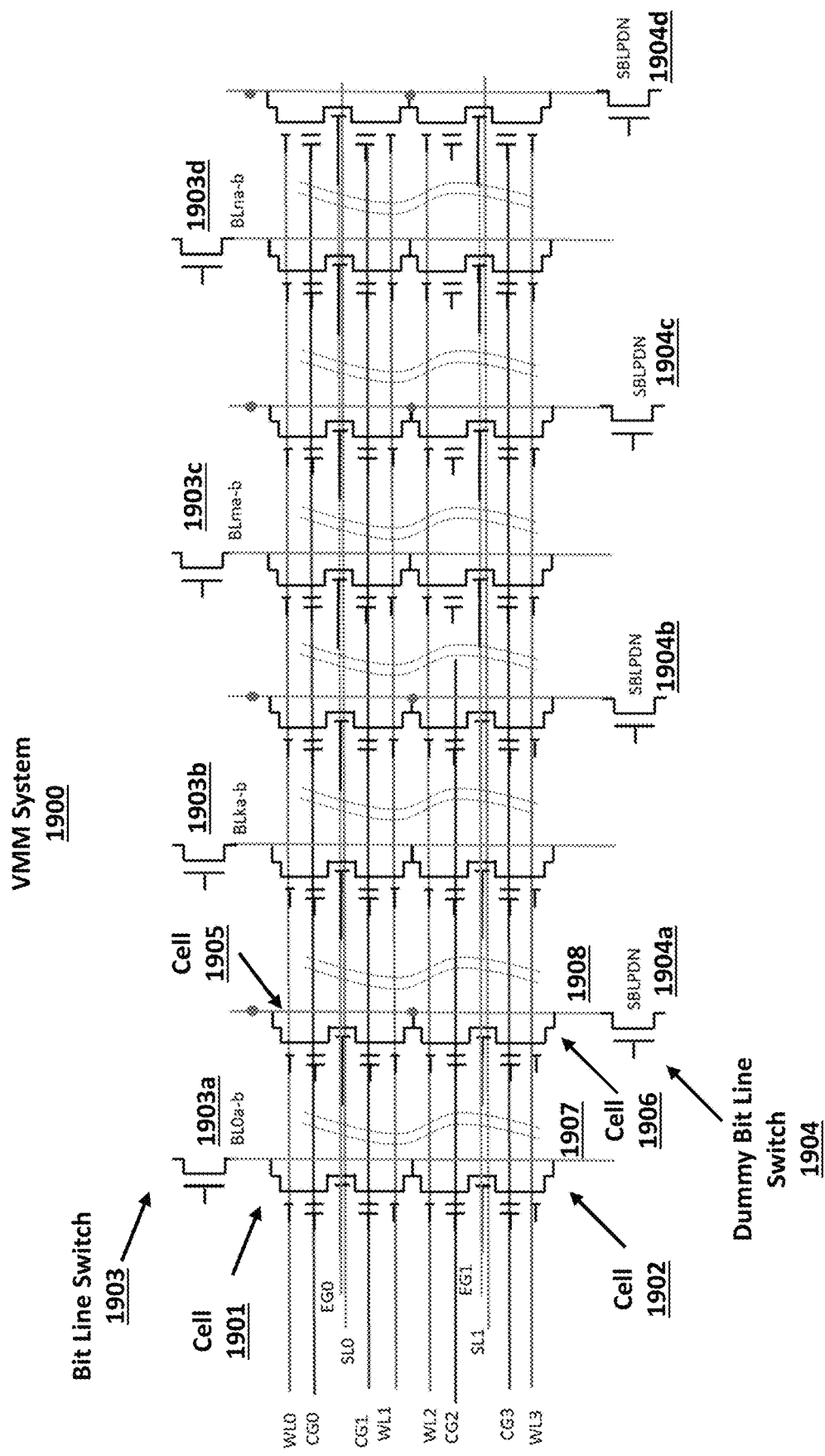

FIG. 19A depicts improved VMM system 1900. VMM system 1900 comprises exemplary cells 1901 and 1902, exemplary bit line switch 1903 (which connects the bit lines to sensing circuitry), exemplary dummy cells 1905 and 1906 (source line pulldown cells), and exemplary dummy bit line switch 1904 (which couples to a low level such as ground level in read, this switch connects to dummy bit line that connects to dummy cells used as source line pulldown). As can be seen, exemplary dummy bit line switch 1904 and the other dummy bit line switches are located on the opposite end of the array from bit line switch 1903 and the other bit line switches.

The benefit of this design can be seen in FIGS. 19B and 19C. FIG. 19B depicts the electrical path through bit line switch 1903, cell 1901, dummy cell 1905 (source line pulldown cell), vertical metal bit line 1908, and dummy bit line switch 1904 (which couples to a low level such as ground level in read). FIG. 19C depicts the electrical path through bit line switch 1903, vertical metal line 1907, cell 1902, dummy cell 1906 (source line pulldown cell), and dummy bit line switch 1904. The paths are substantially the same (cells, interconnect lengths), which is true for all cells in VMM system 1900. As a result, the impedance of the bit line impedance plus source line impedance of each cell is substantially the same, which means that the variance in the amount of parasitic voltage drop drawn to read or verify operation of the various cells in the array is relatively same.

Figure 20:
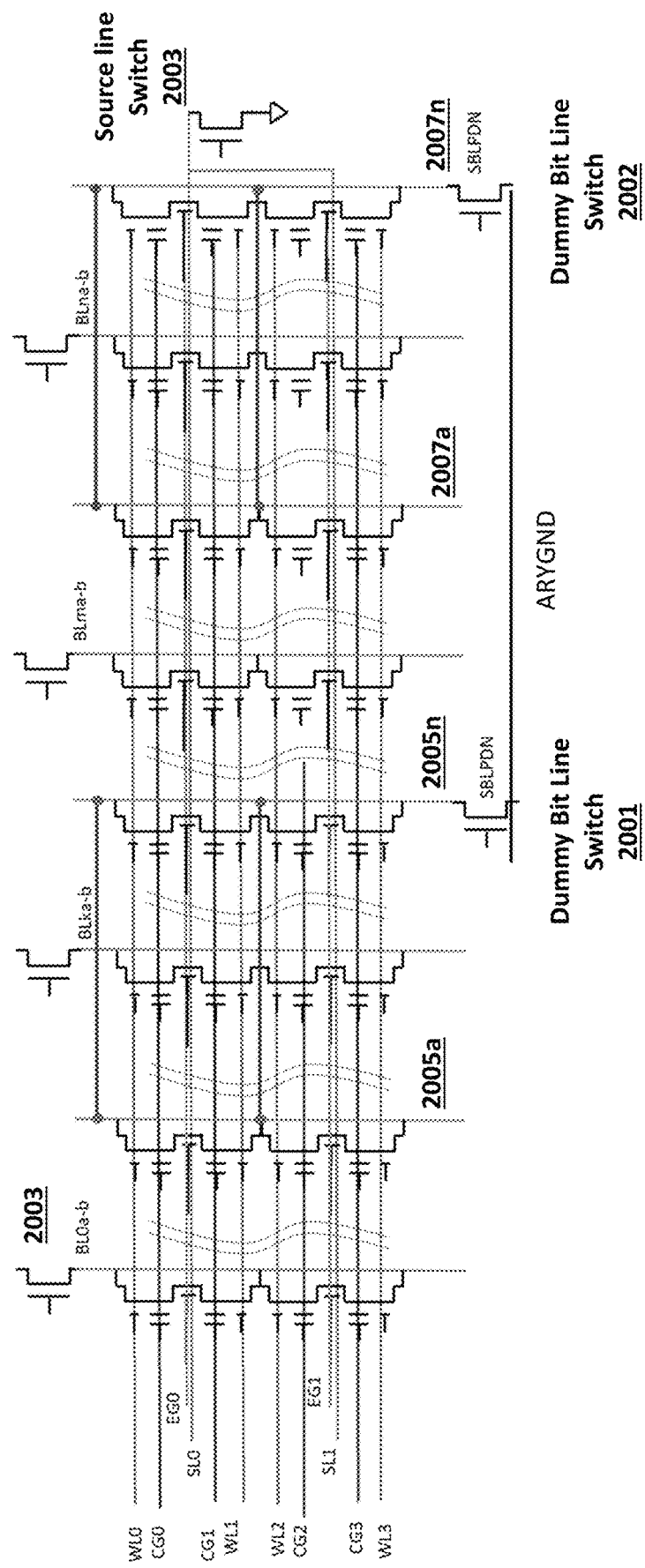
FIG. 20 depicts another improved VMM array.

FIG. 20 depicts VMM system 2000 with global source line pulldown bitline. VMM system 2000 is similar to VMM system 1900, except that: the dummy bit lines 2005a-2005n or 2007a-2007n are connected together (to act as global source line pulldown lines to pull memory cell source lines to ground level during read or verify), the dummy bit line switches, such as dummy bit line switch 2001 and 2002, are connected or coupled to a common ground; and the source lines are coupled together to source line switch 2003, which selectively pulls the source lines to ground. These changes further decrease the variance in (array) parasitic impedance among cells during read or verify operations.

Figure 21:
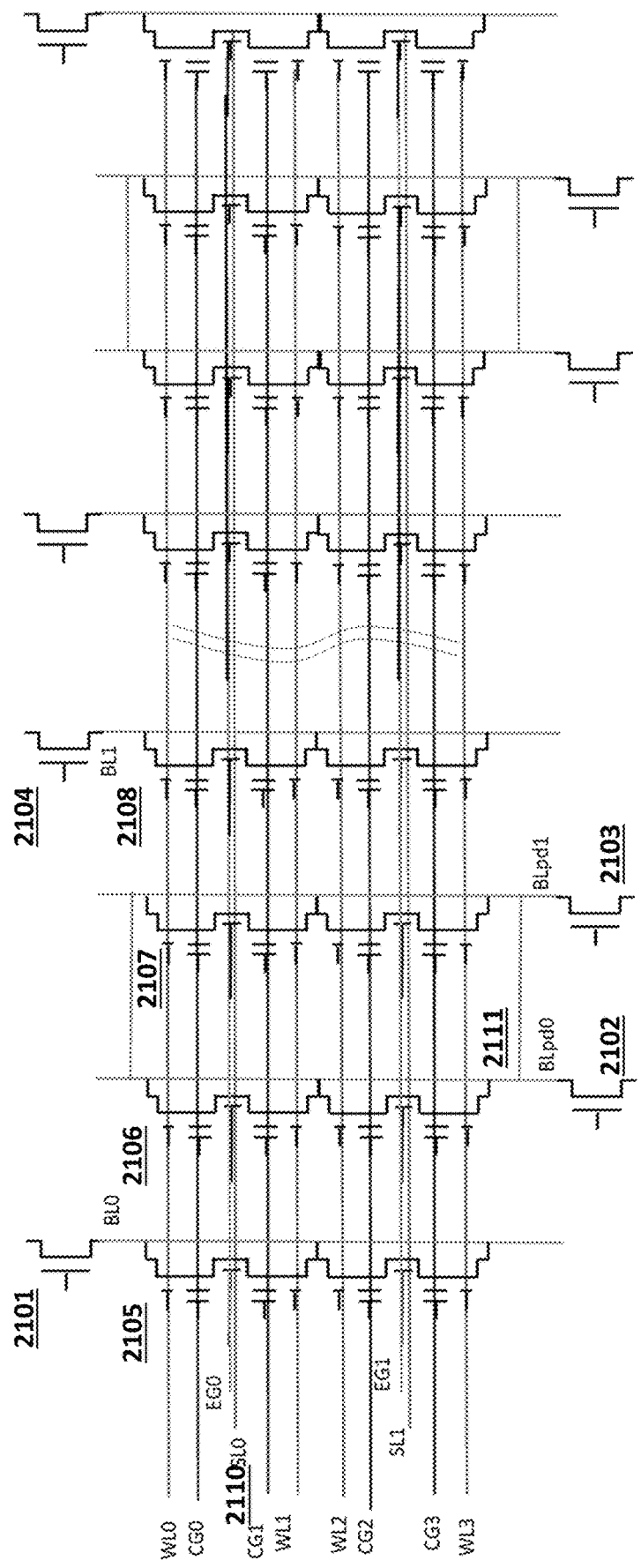
FIG. 21 depicts a VMM system with an improved source line pulldown mechanism.

FIG. 21 depicts VMM system 2100. VMM system 2100 comprises bit line switch 2101, pulldown bit line switch 2102, pulldown bit line switch 2103, bit line switch 2104, data cell 2105 (herein, a "data cell" is a memory cell used to store a weight value for a neural network), pulldown cell 2106, pulldown cell 2107, and data cell 2018. Note that the pulldown cells 2106 and 2107 are adjacent to each together. This allows vertical metal lines BLpdx of the two pulldown cells 2106 and 2107 to be connected together (line 2111) to reduce parasitic resistance due to the resulting wider metal line. During a read or verify (for program/erase tuning cycles) operation of data cell 2105, current will flow through bit line switch 2101 into the bit line terminal of cell 2105 and out to the source line terminal of cell 2015, where it then flows into source line 2110, where it flows into the source line terminals of pulldown cells 2106 and 2107 and through pulldown bit line switches 2102 and 2103. During a read or verify (for program/erase tuning cycles) operation of cell 2104, current will flow through bit line switch 2104 into the bit line terminal of data cell 2108 and out to the source line terminal of cell 2108, where it then flows into source line 2110, where it flows into the source line terminals of pulldown cells 2106 and 2107 and through pulldown bit line switches 2102 and 2103. This pattern of columns repeats throughout the array, where every four columns contains two columns of data cells and two adjacent array columns used for pulldown operations. In another embodiment, the diffusion of the two pulldown cells of the two adjacent columns can be merged together into one bigger diffusion to increase the pulldown capability. In another embodiment, the diffusion of the pulldown cell can be made to be bigger than that of the data cell diffusion to increase the pulldown capability. In another embodiment, each pulldown cell has a bias condition different than a bias condition of a selected data cell.

In one embodiment, the pulldown cell has the same physical structure as a regular data memory cell. In another embodiment, the pulldown cell has a different physical structure than a regular data memory cell, for example, the pulldown cell can be a modified version of a regular data memory cell such as by modifying one or more physical dimensions (width, length, etc.) for electrical parameters (layer thickness, implant, etc.). In another embodiment, the pulldown cell is a regular transistor (without a floating gate) such as an IO or high voltage transistor.

Figure 22:
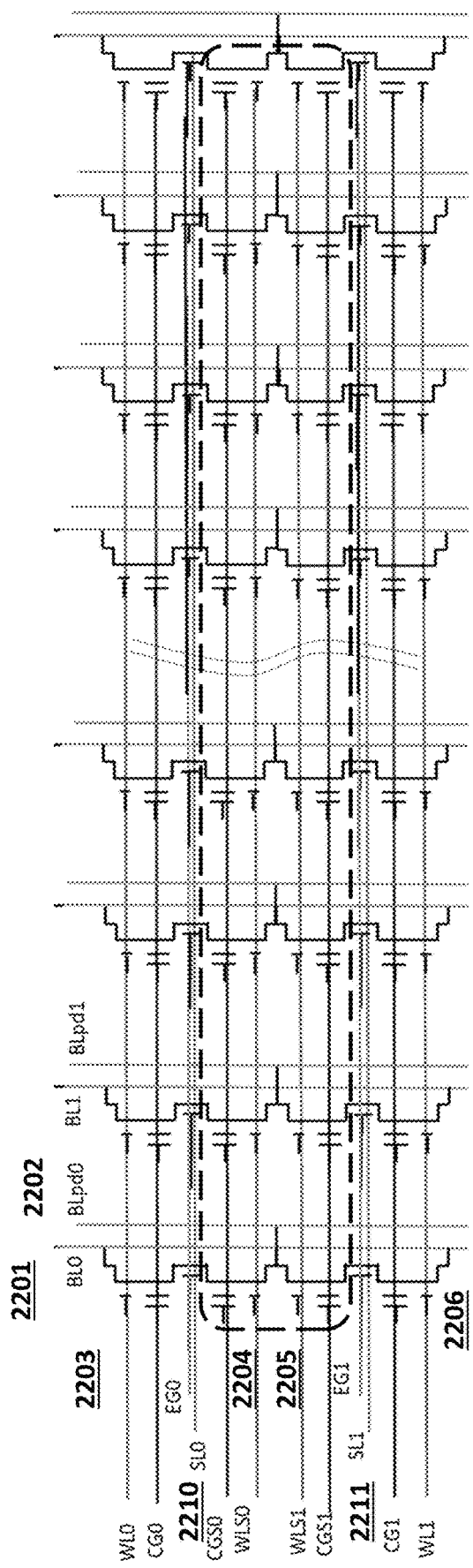
FIG. 22 depicts another VMM system with an improved source line pulldown mechanism.

FIG. 22 depicts VMM system 2200. VMM system 2200 comprises bit line 2201, pulldown bit line 2202, data cells 2203 and 2206, pulldown cells 2204 and 2205, and source line 2210. During a read or verify operation of cell 2203, current will flow through bit line switch 2201 into the bit line terminal of cell 2203 and out to the source line terminal of cell 2203, where it then flows into source line 2210 and into the source line terminals of pulldown cell 2204 and through pulldown bit line BLpd 2202. This design is repeated for every column, with the net result that the row containing pulldown cell 2204 is a row of pulldown cells.

During a read or verify (for program/erase tuning cycles) operation of cell 2206, current will flow through bit line switch 2201 into the bit line terminal of cell 2206 and out to the source line terminal of cell 2206, where it then flows into source line 2211 and into the source line terminals of pulldown cell 2205 and through pulldown bit line 2202. This design is repeated for every column, with the net result that the row containing pulldown cell 2205 is a row of pulldown cells. As shown in FIG. 22, there are four rows, the two middle adjacent rows are used for pulldown cells, the top and bottom rows are data cells.

Table No. 10 depicts operating voltages for VMM system 2200. The columns in the table indicate the voltages placed on bit lines for selected cells, bit line pulldowns, word lines for selected cells, control gates for selected cells, word lines WLS for selected pulldown cells, control gates CGS for selected pulldown cells, erase gates for all cells, and source lines for all cells. The rows indicate the operations of read, erase, and program. Note that the voltage bias for CGS and WLS in read are higher than that of the regular WL and CG biases to enhance the drive capability of the pulldown cells. The voltage biased for WLS and CGS can be negative in programming to reduce disturb.

Figure 23:
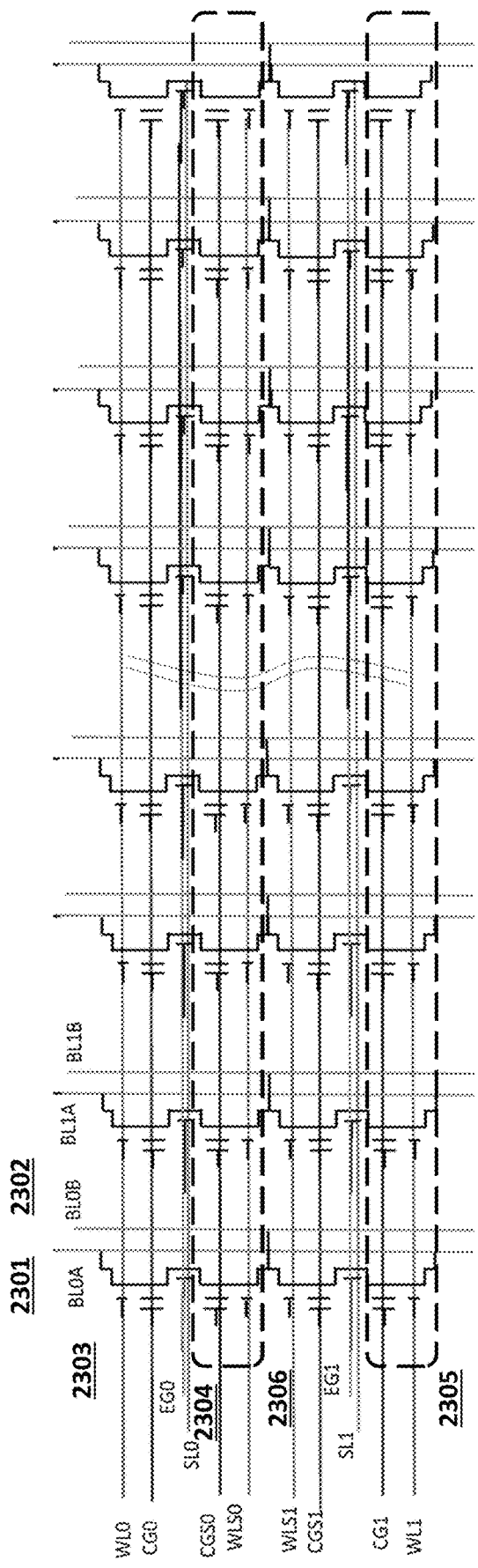
FIG. 23 depicts another VMM system with an improved source line pulldown mechanism.

FIG. 23 depicts VMM system 2300. VMM system 2300 comprises bit line 2301, bit line 2302, data cells 2303 and 2306, and pulldown cells 2304 and 2305. During a read or verify (for program/erase tuning cycles) operation of cell 2303, current will flow through bit line 2301 into the bit line terminal of cell 2303 and out to the source line terminal of cell 2303, where it then flows into source line terminals of pulldown cell 2304 and through bit line 2302 (acting as pulldown bit line in this case). This design is repeated for every column, with the net result that the row containing pulldown cell 2304, in a first mode, is a row of pulldown cells. During a read or verify (for program/erase tuning cycles) operation of data cell 2306, current will flow through bit line 2301 into the bit line terminal of cell 2306 and out to the source line terminal of cell 2306, where it then flows into source line terminals of pulldown cell 2305 and through bit line 2302 (acting as pulldown bit line in this case). This design is repeated for every column, with the net result that the row containing pulldown cell 2305, in a second mode, is a row of pulldown cells. As shown in FIG. 23, there are four rows, the alternative odd (or even) rows are used for pulldown cells, the alternative even (or odd) rows are data cells.

Notably, during a second mode, cells 2305 and 2306 are active in read or verify and cells 2303 and 2305 are used for the pulldown process, with the roles of bit lines 2301 and 2302 being reversed.

Table No. 11 depicts operating voltages for VMM system 2300. The columns in the table indicate the voltages placed on bit lines for selected data cells, bit lines for selected pulldown cells, word lines for selected data cells, control gates for selected data cells, word lines WLS for selected pulldown cells, control gates CGS for selected pulldown cells, erase gates for all cells, and source lines for all cells. The rows indicate the operations of read, erase, and program.

TABLE No. 10

Operation of VMM Array 2200 of FIG. 22

| Op Table | BL | BLpd | WL | CG | WLS | CGS | EG | SL |
|---|---|---|---|---|---|---|---|---|
| Erase | 0 V | 0 V | 0 V | 0 V | 0 V | 0 V | 11.5 V | 0 V |
| Program | Iprog | VINH | ~0.7 V | ~10.5 V | −0.5 V to 0 V | −2 V to 0 V | ~4.5 V | ~4.5 V |
| Read | 0.6 V | 0 V | ~0-1.1 V | ~0-1.5 V | 1.1-1.3 V | 1.8-3 V | 0 V | 0 V |

TABLE No. 11

Operation of VMM System 2300 of FIG. 23

| Op Table | BL0A | BL0B | WL | CG | WLS | CGS | EG | SL |
|---|---|---|---|---|---|---|---|---|
| Erase | 0 V | 0 V | 0 V | 0 V | 0 V | 0 V | 11.5 V | 0 V |
| Program | Iprog | VINH | ~0.7 V | ~10.5 V | −0.5 V to 0 V | −2 V to 0 V | ~4.5 V | ~4.5 V |
| Read | 0.6 V/0 V | 0 v/0.6 V | ~0-1.1 V | ~0-1.5 V | 1.1-1.3 V | 1.8-3 V | 0 V | 0 V |

Figure 24:
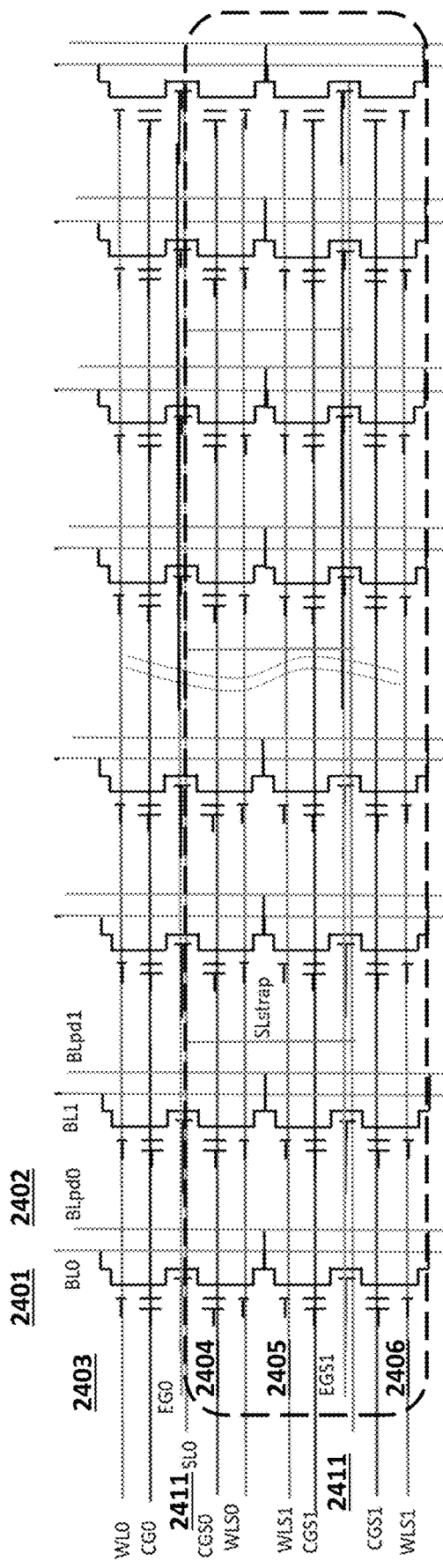
FIG. 24 depicts another VMM system with an improved source line pulldown mechanism.

FIG. 24 depicts VMM system 2400. VMM system 2400 comprises bit line 2401, pulldown bit line 2402, (data) cell 2403, source line 2411, and pulldown cells 2404, 2405, and 2406. During a read or verify operation of cell 2403, current will flow through bit line 2401 into the bit line terminal of cell 2403 and out to the source line terminal of cell 2403, where it then flows into source line 2411, and where it then flows into the source line terminal of pulldown cells 2404, 2405, and 2406, from which is flows through pulldown bit line 2402. This design is repeated for every column, with the net result that the rows containing pulldown cells 2404, 2405, and 2406 each are rows of pulldown cells. This maximizes the pulldown applied to the source line terminal of cell 2403, as current is drawn through three cells into pulldown bit line 2402. Note the source lines of the four rows are connected together.

Table No. 12 depicts operating voltages for VMM system 2400. The columns in the table indicate the voltages placed on bit lines for selected cells, bit line pulldowns, word lines for selected cells, control gates for selected cells, erase gates for selected cells, word lines WLS for selected pulldown cells, control gates CGS for selected pulldown cells, erase gates for selected pulldown cells, and source lines for all cells. The rows indicate the operations of read, erase, and program.

fashion. The negative operation is done at the output of the w− bit line (neuron output) by a summation circuit, such as summation circuits 2701 and 2702. The output of a w+ line and the output of a w− line are combined together to give effectively w=w+−w− for each pair of (w+, w−) cells for all pairs of (w+, w−) lines. The dummy bitlines or source line pulldown bitlines used to avoid FG-FG coupling and/or reduce IR voltage drop in the source line in read are not shown in the figure. The input (such as to CG or WL) to the system 2700 can has positive value or negative value input. For the case of the input has negative value, since actual input to array is still positive (such as an voltage level on CG or WL), the array output (bitline output) is negated before output to realize the equivalent function of the negative value input.

Figure 27A:
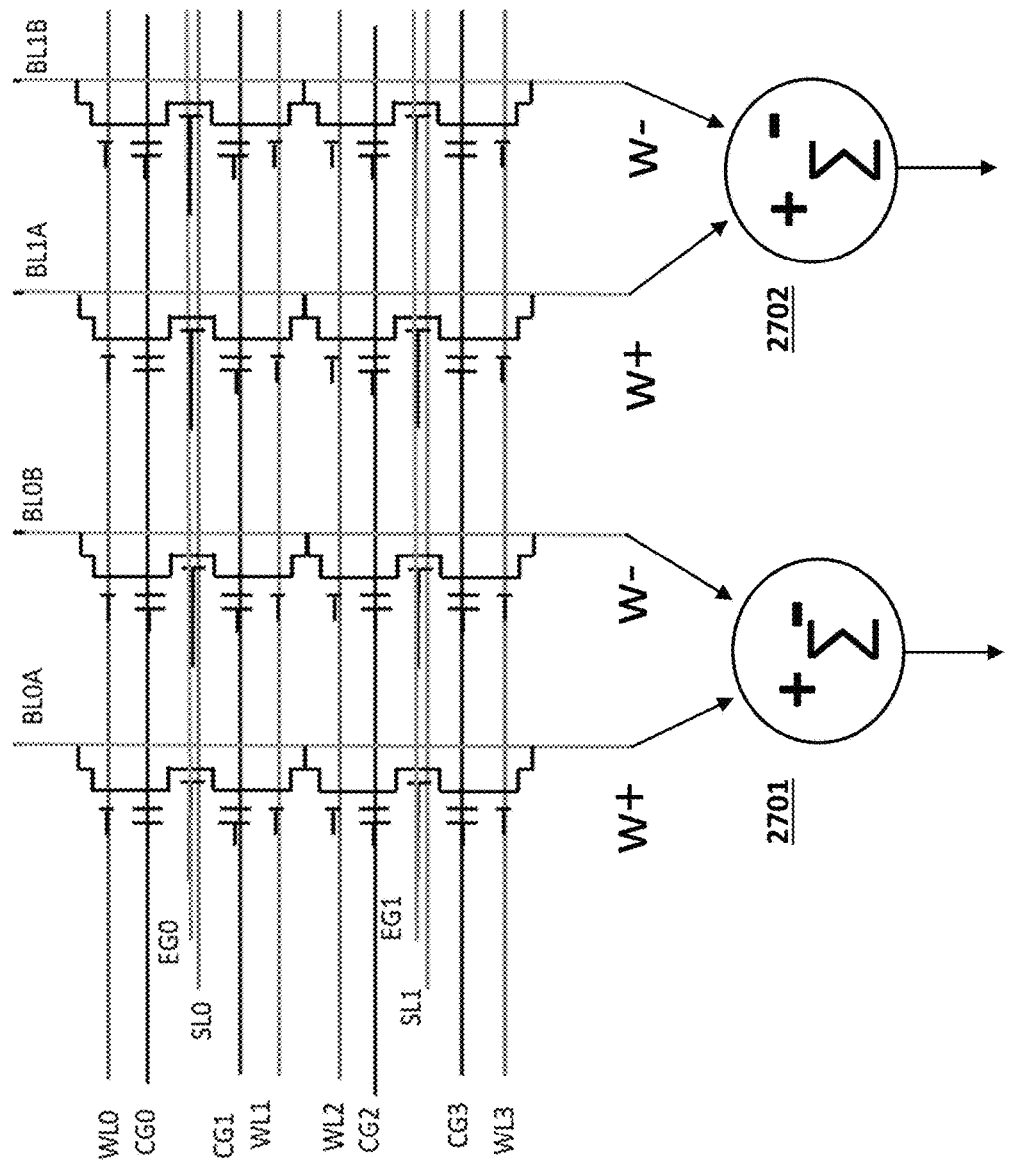
FIGS. 27A, 27B, and 27C depict other improved VMM arrays.
Figure 27B:
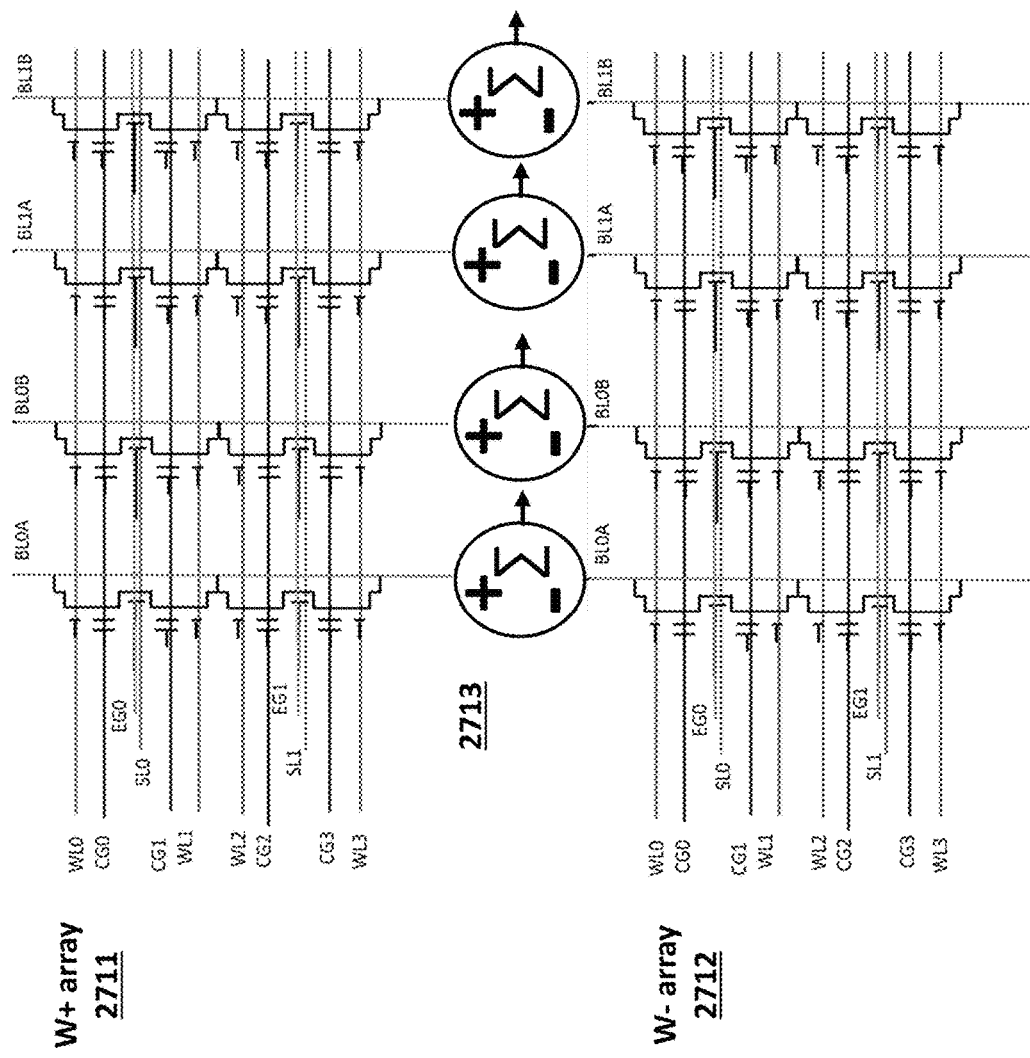

Alternatively, with reference to FIGS. 27B, positive weights can be implemented in a first array 2711 and negative weights can implemented in a second array 2712, separate from the first array, and the resulting weights are appropriately combined together by summation circuits 2713. Similarly, the dummy bitlines (not shown) or source line pulldown bitlines (not shown) are used to avoid FG-FG coupling and/or reduce IR voltage drop in the source line in read.

TABLE No. 12

Operation of VMM System 2400 of FIG. 24

| Op Table | BL | BPpd | WL | CG | WLS | CGS | EG | EGS | SL |
|---|---|---|---|---|---|---|---|---|---|
| Erase | 0 V | 0 V | 0 V | 0 V | 0 V | 0 V | 11.5 V | 11.5 V | 0 V |
| Program | Iprog | VINH | ~0.7 V | ~10.5 V | −0.5 V to 0 V | −2 V to 0 V | ~4.5 V | 0 V | ~4.5 V |
| Read | 0.6 V | 0 V | ~0-1.1 V | ~0-1.5 V | 1.1-1.3 V | 1.8-3 V | 0 V | ~2.5 V | 0 V |

Figure 25:
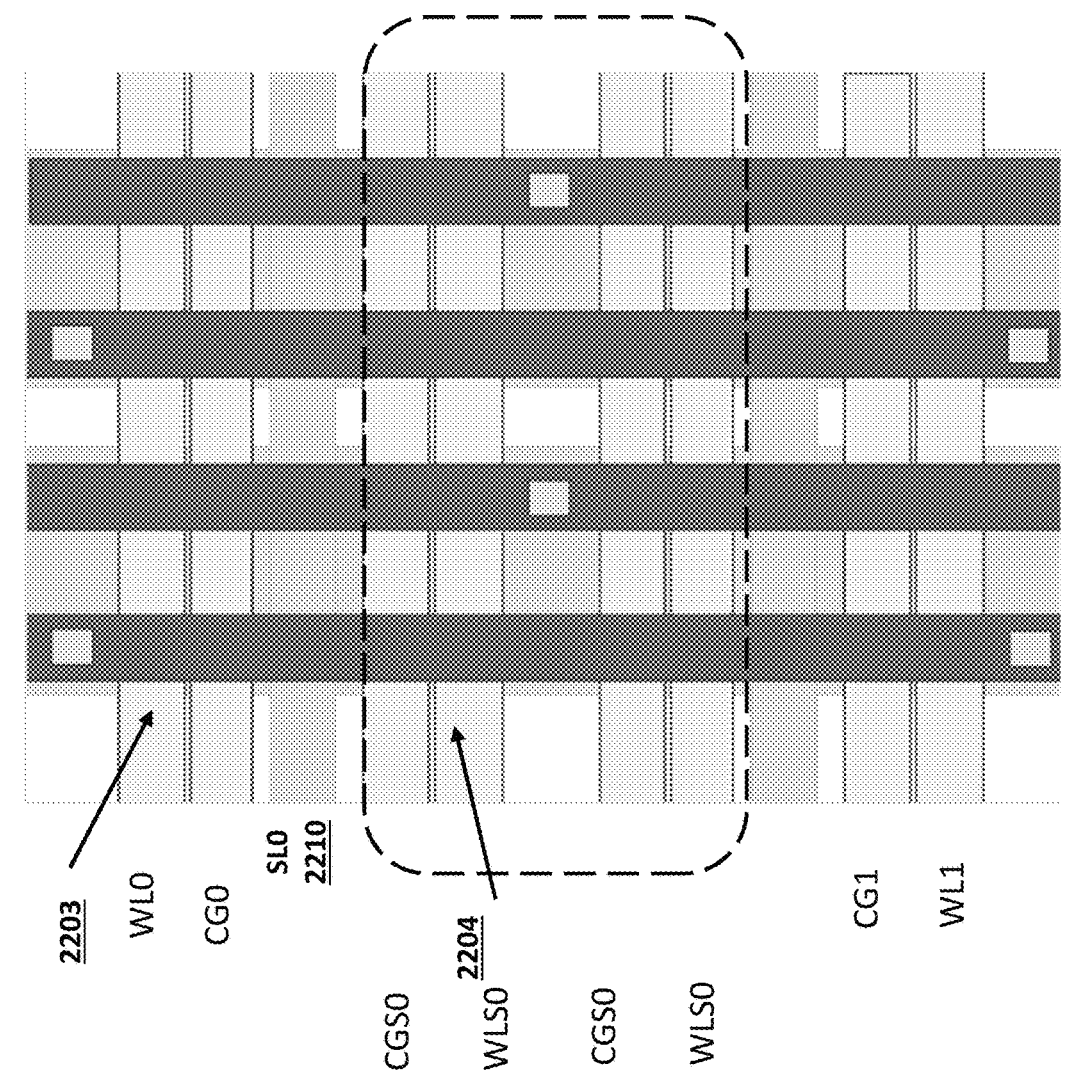
FIG. 25 depicts an exemplary layout diagram of a VMM system with an improved source line pulldown mechanism.

FIG. 25 depicts an exemplary layout 2500 for VMM system 2200 of FIG. 22. The light squares indicate metal contacts to bit lines such as bit line 2201 and pulldown bit lines such as pulldown bit line 2202.

Figure 26:
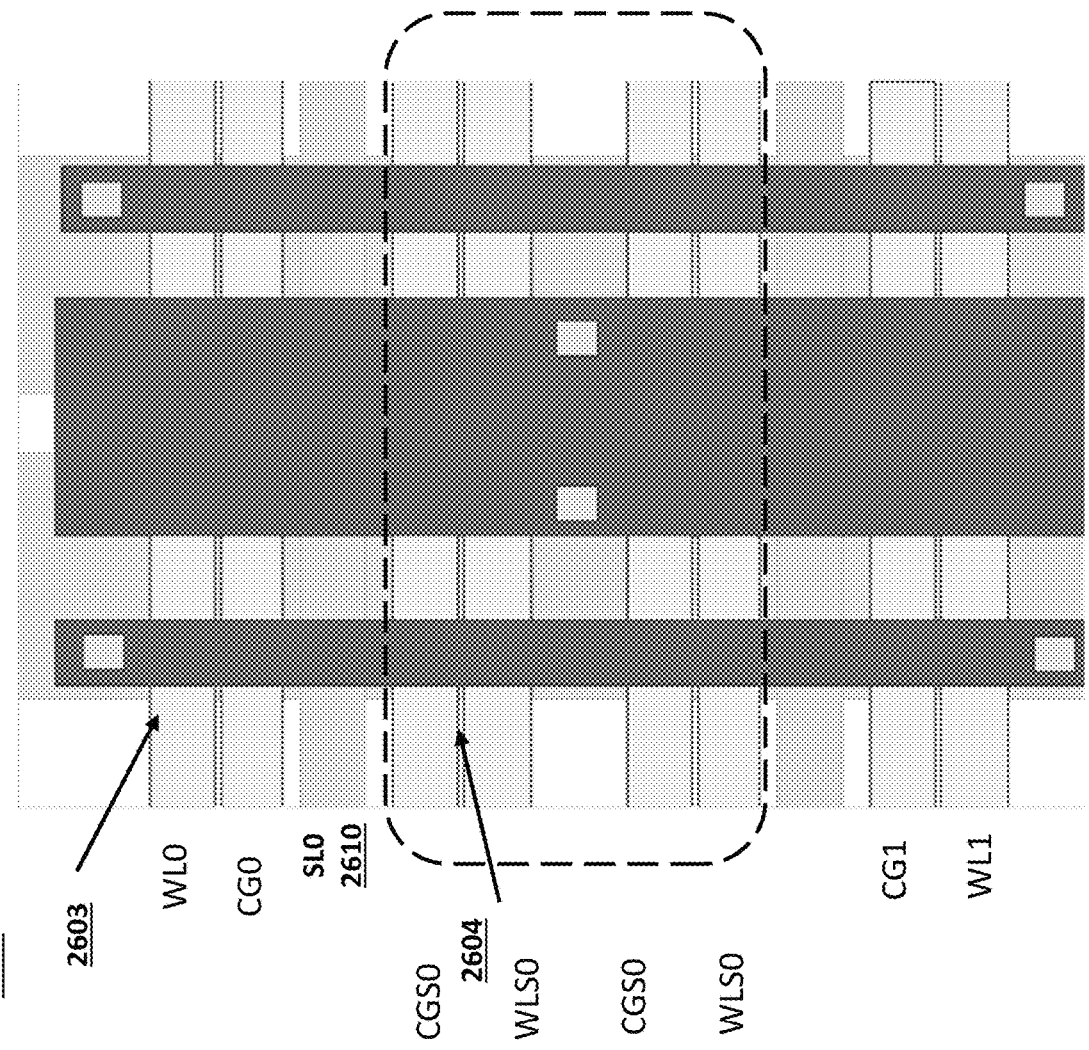
FIG. 26 depicts another exemplary layout diagram of a VMM system with an improved source line pulldown mechanism.

FIG. 26 depicts an alternative layout 2600 for a VMM system similar to the VMM system 2200 of FIG. 22, with the difference that pulldown bit line 2602 is extremely wide and traverses two columns of pulldown cells. That is, the diffusion area for pulldown bit line 2602 is wider than the diffusion area for bit line 2601. Layout 2600 further shows cells 2603 and 2604 (pulldown cell), source line 2610, and bit line 2601. In another embodiment, the diffusion of the two pulldown cells (left and right) can be merged together into one bigger diffusion.

Figure 27C:
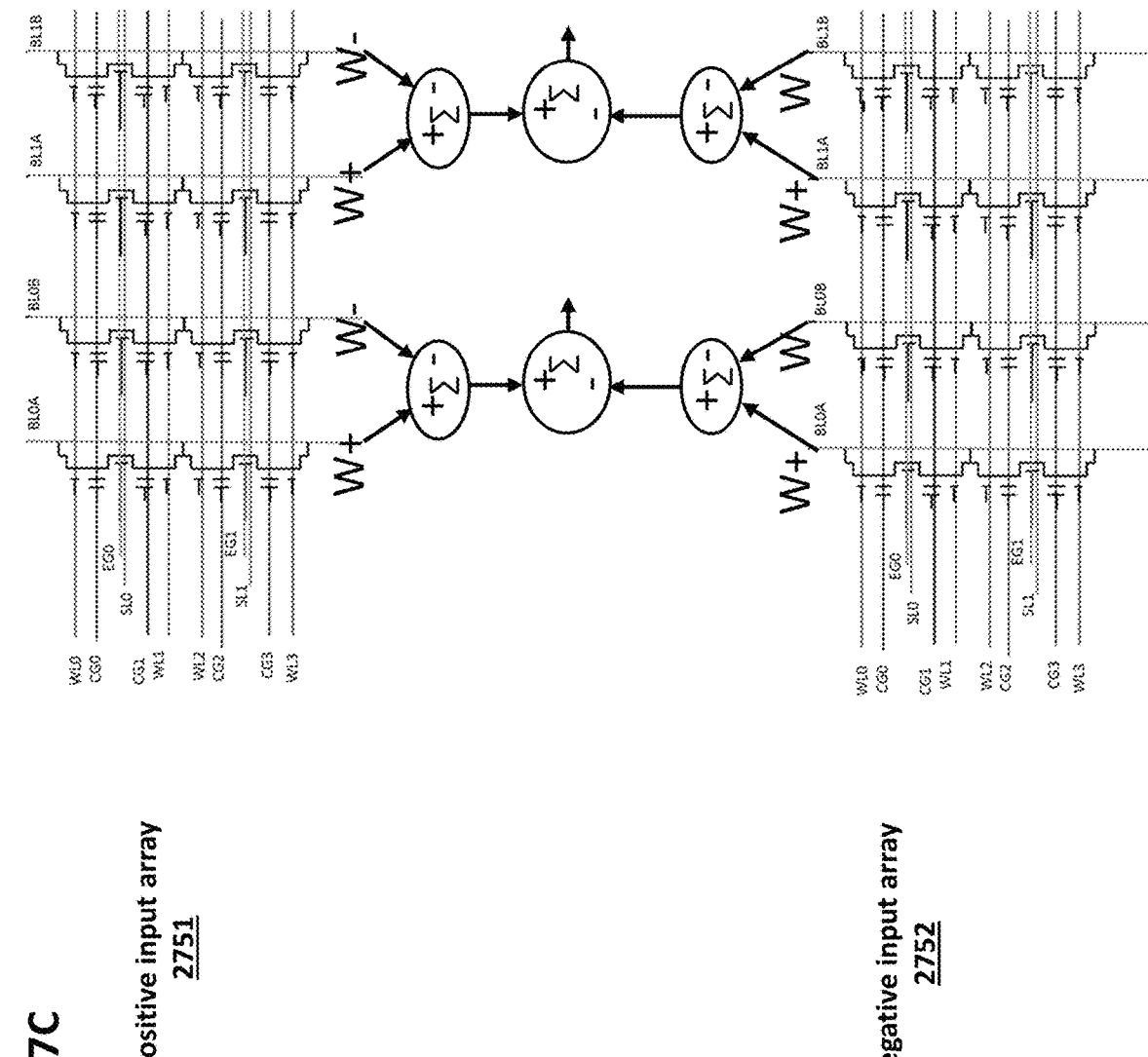

FIG. 27A depicts VMM system 2700. To implement negative and positive weights of a neural network, half of the bit lines are designated as w+ lines (bit lines connecting to memory cells implementing positive weights), and the other half of the bit lines are designated as w− lines (bit lines connecting to memory cells implementing negative weights) and are interspersed among the w+ lines in an alternating Alternatively, FIG. 27C depicts VMM system 2750 to implement negative and positive weights of a neural network with positive or negative input. First array 2751 implements positive value inputs with negative and positive weights and second array 2752 implements negative value inputs with negative and positive weights. The output of the second array is negated before adding to the output of the first array by the summer 2755 since any input to any array only has positive value (such as an analog voltage level on CG or WL).

Table 10A shows an exemplary layout of a physical array arrangement of a (w+, w−) pair of bit lines BL0/1 and BL2/3, where 4 rows are coupled to source line pulldown bit lines BLPWDNs. Pair of (BL0, BL1) bit lines is used to implement (w+, w−) lines. Between the (w+, w−) line pair, there is a source line pulldown bit line (BLPWDN). This is used to prevent coupling (e.g., FG to FG coupling) from adjacent (w+, w−) lines into the current (w+, w−) lines. Basically, the source line pulldown bit line (BLPWDN) serves as physical barrier between pair of (w+, w−) lines.

Additional details regarding the FG to FG coupling phenomena and mechanisms for counteracting that phenomena are found in U.S. Provisional Patent Application No. 62/981,757, filed on Feb. 26, 2020 by the same assignee, and titled "Ultra-Precise Tuning of Analog Neural Memory Cells in a Deep Learning Artificial Neural Network," which is incorporated by reference herein.

Table 10B shows different exemplary weight combination. '1' means that the cell is used and has a real output value, whereas '0' means the cell is not used and has no value or no significant output value.

In another embodiment, dummy bit lines instead of source line pulldown bit lines can be used.

In another embodiment, dummy rows can also be used as physical barriers to avoid coupling between rows.

TABLE 10A

Exemplary Layout

| | BLPWDN | BL0 | BL1 | BLPWDN | BL2 | BL3 | BLPWDN |
|---|---|---|---|---|---|---|---|
| row0 | | w01+ | w01− | | w02+ | w02− | |
| row1 | | w11+ | w11− | | w12+ | w12− | |
| row2 | | w21+ | w21− | | w22+ | w22− | |
| row3 | | w31+ | w31− | | w32+ | w32− | |

TABLE 10B

Exemplary Weight Combinations

| | BLPWDN | BL0 | BL1 | BLPWDN | BL2 | BL3 | BLPWDN |
|---|---|---|---|---|---|---|---|
| row0 | | 1 | 0 | | 1 | 0 | |
| row1 | | 0 | 1 | | 0 | 1 | |
| row2 | | 0 | 1 | | 1 | 0 | |
| row3 | | 1 | 1 | | 1 | 1 | |

Table 11A shows another array embodiment of a physical arrangement of (w+, w−) pair lines BL0/1 and BL2/3 with redundant lines BL01,BL23 and source line pulldown bit lines BLPWDN. BL01 is used to weight re-mapping for pair BL0/1 and BL23 is used to weight re-mapping for pair BL2/3.

Table 11B shows a case of distributed weight that needs no re-mapping, basically there is no adjacent '1' between BL1 and BL3, which causes adjacent bit line coupling.

In one embodiment, the weight mapping is such that the total current along a bitline is approximately constant to maintain approximately constant bitline voltage drop. In another embodiment, the weight mapping is such that the total current along a source line is approximately constant to maintain approximately constant source line voltage drop.

Table 11C shows a case of distributed weight that needs re-mapping, basically there is adjacent '1' between BL1 and BL3, which causes adjacent bit line coupling. This re-mapping is shown in Table 11D, resulting in no '1' value between any adjacent bit lines. Furthermore, by re-mapping, meaning re-distributing the weights, the '1' real value weight among the bit lines, the total current along the bit line is now reduced leading to more precise value in the bit line (output neuron). In this case, additional columns (bitline) are needed (BL01, BL23) to act as redundant columns.

Tables 11E and 11F depict another embodiments of remapping noisy cells (or defective cells) into the redundant (spare) columns such as BL01, BL23 in Table 10E or BL0B and BL1B in Table 11F. A summer is used to sum up the bit line outputs with mapping appropriately.

TABLE 11A

Exemplary Layout

| | BLPWDN | BL01 | BL0 | BL1 | BL2 | BL3 | BL23 | BLPWDN |
|---|---|---|---|---|---|---|---|---|
| row0 | | | | w01+ | w01− | w02+ | w02− | |
| row1 | | | | w11+ | w11− | w12+ | w12− | |
| row2 | | | | w21+ | w21− | w22+ | w22− | |
| row3 | | | | w31+ | w31− | w32+ | w32− | |

TABLE 11B

Exemplary Weight Combinations

| | BLPWDN | BL01 | BL0 | BL1 | BL2 | BL3 | BL23 | BLPWDN |
|---|---|---|---|---|---|---|---|---|
| row0 | | | | 1 | 0 | 1 | 0 | |
| row1 | | | | 0 | 1 | 0 | 1 | |
| row2 | | | | 1 | 0 | 1 | 0 | |
| row3 | | | | 0 | 1 | 0 | 1 | |

TABLE 11C

Exemplary Weight Combinations

| | BLPWDN | BL01 | BL0 | BL1 | BL2 | BL3 | BL23 | BLPWDN |
|---|---|---|---|---|---|---|---|---|
| row0 | | | | 0 | 1 | 1 | 0 | |
| row1 | | | | 0 | 1 | 1 | 0 | |
| row2 | | | | 0 | 1 | 1 | 0 | |
| row3 | | | | 0 | 1 | 1 | 0 | |

TABLE 11D

Remapped Weight Combinations

| | BLPWDN | BL01 | BL0 | BL1 | BL2 | BL3 | BL23 | BLPWDN |
|---|---|---|---|---|---|---|---|---|
| row0 | | 0 | 0 | 1 | 0 | 0 | 1 | |
| row1 | | 1 | 0 | 0 | 1 | 0 | 0 | |
| row2 | | 0 | 0 | 1 | 0 | 0 | 1 | |
| row3 | | 1 | 0 | 0 | 1 | 0 | 0 | |

TABLE 11E

Remapped Weight Combinations

| | BLPWDN | BL01 | BL0 | BL1 | BL2 | BL3 | BL23 | BLPWDN |
|---|---|---|---|---|---|---|---|---|
| row0 | | 0 | 0 | 1 | 0 | 0 | 1 | |
| row1 | | 1 | 0 | noisy or defective cell (not used) | 1 | 0 | 0 | |

TABLE 11E-continued

| | Remapped Weight Combinations | | | | | | |
|---|---|---|---|---|---|---|---|
| | BLPWDN | BL01 | BL0 | BL1 | BL2 | BL3 | BL23 | BLPWDN |
| row2 | | 0 | 0 | 1 | noisy or defective cell (not used) | 0 | 1 | |
| row3 | | 1 | 0 | 0 | 1 | 0 | 0 | |

TABLE 11F

| | Remapped Weight Combinations | | | | |
|---|---|---|---|---|---|
| | BLPWDN | BL0A | BL0B | BL1A | BL1B | BLPWDN |
| row0 | | 1 | 0 | 0 | 0 | |
| row1 | | noisy or defective cell (not used) | 1 | 1 | 0 | |
| row2 | | 1 | 0 | noisy or defective cell (not used) | 1 | |
| row3 | | 0 | 0 | 1 | 0 | |

Table 11G shows an embodiment of array physical arrangement that is suitable for FIG. 27B. Since each array has either positive weight or negative weight, a dummy bitline acting as source line pulldown and physical barrier to avoid FG-FG coupling is needed for each bit line.

TABLE 11G

| | Exemplary Layout | | | | |
|---|---|---|---|---|---|
| | BLPWDN | BL0 | BLPWDN | BL1 | BLPWDN |
| row0 | | w01+/− | | w02+/− | |
| row1 | | w11+/− | | w12+/− | |
| row2 | | w21+/− | | w22+/− | |
| row3 | | w31+/− | | w32+/− | |

Another embodiment has a tuning bit line as an adjacent bit line to a target bitline to tune the target bit line to final target by virtue of FG-FG coupling. In this case source line pulldown bitline (BLPWDN) is inserted on one side of the target bit line that does not border the tuning bitline.

Alterative embodiment for mapping noisy or defective cells are to designate these cells (after identify them as noisy or defective by sensing circuitry) as non-used cells, meaning they are to be (deeply) programmed to not contribute any value to the neuron output.

An embodiment for handling fast cells are first to identify these cells, then apply a more precision algorithm to these cells such as smaller or no voltage increment pulses or using floating gate coupling algorithm.

Figure 28:
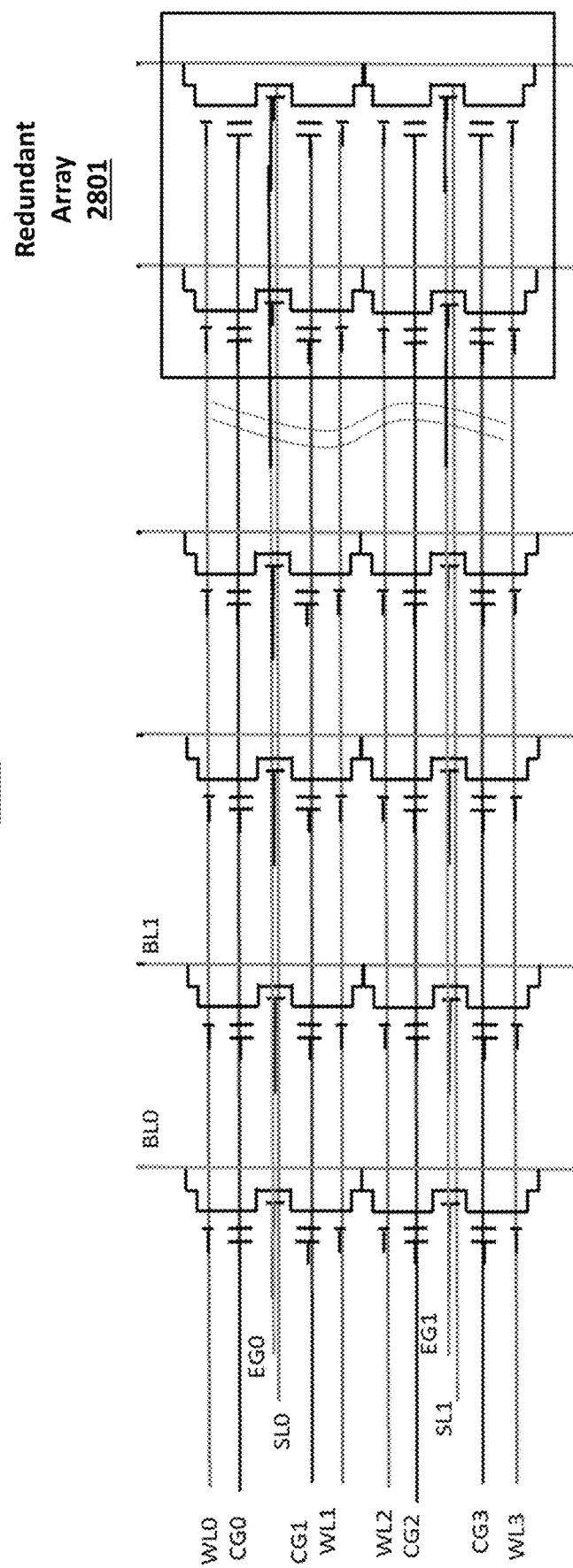
FIG. 28 depicts another improved VMM array comprising a redundant array.

FIG. 28 depicts an optional redundant array 2801 that can be included in any of the VMM arrays discussed thus far. Redundant array 2801 can be used as redundancy to replace defective columns if any of the columns attached to bit line switches are deemed defective. The redundant array can have its own redundant neuron outputs (e.g., bit lines) and ADC circuits for redundancy purpose. For the case of redundancy is needed, the output of redundancy ADC is to replace the output of the ADC of the bad bit line. Redundant array 2801 can also be used for weight mapping such as described in Table 10x for power distribution across bit lines.

Figure 29:
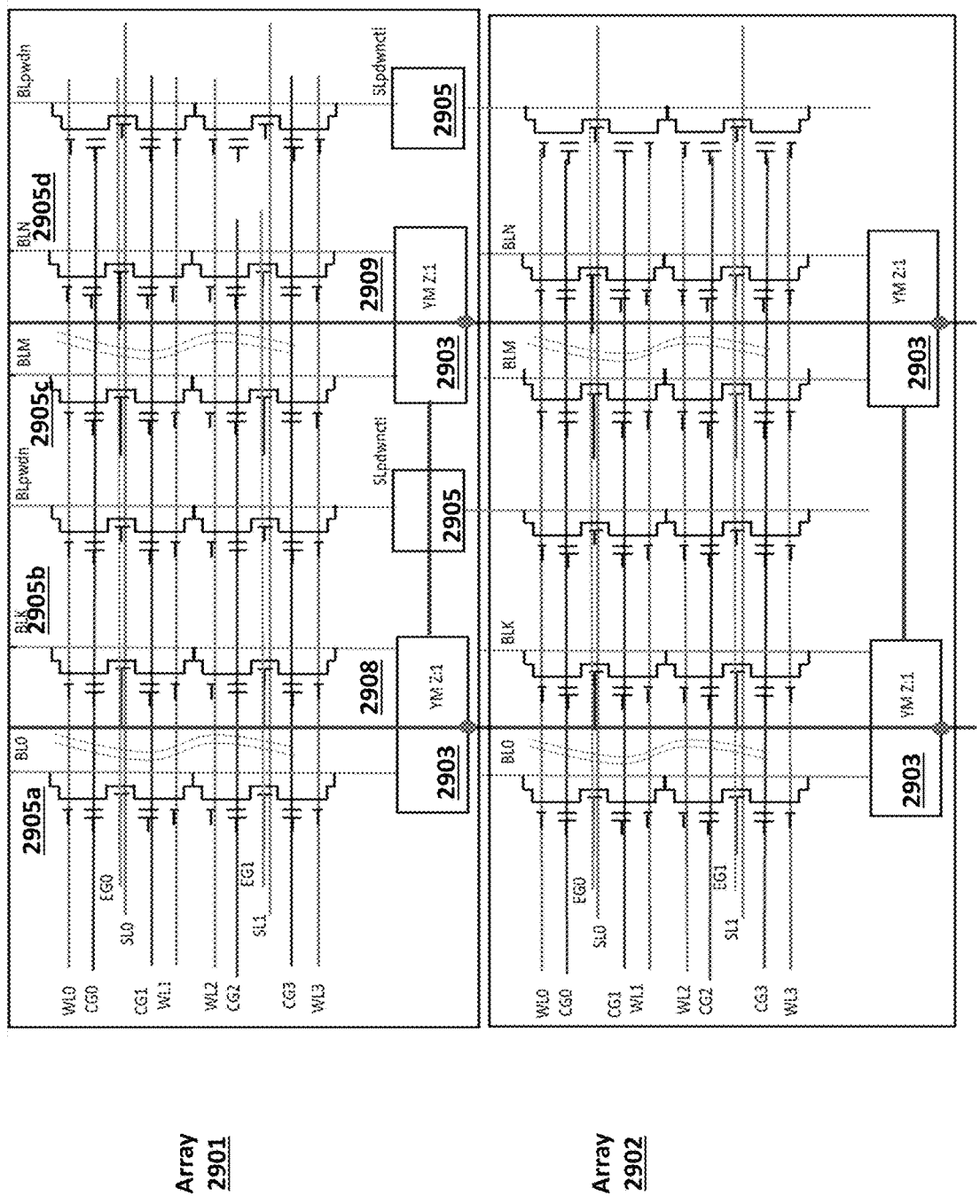
FIG. 29 depict another improved VMM system that comprises two VMM arrays and shared dummy bit line switching circuitry.

FIG. 29 depicts VMM system 2900, which comprises array 2901, array 2902, column multiplexors 2903, local bit lines LBL 2905a-d, global bit line GBL 2908 and 2909, and dummy bit line switches 2905. The column multiplexors 2903 is used to select top local bit line 2905 of the array 2901 or bottom local bit line 2905 of the array 2902 into the global bit line 2908. In one embodiment, the (metal) global bit line 2908 has the same number of lines as number of the local bit lines, e.g. 8 or 16. In another embodiment, the global bit line 2908 has only one (metal) line per N number of local bit lines, such as one global bit line per 8 or 16 local bit lines. The column multiplexors 2903 further includes multiplexing (muxing) the adjacent global bit line (such as GBL 2909) into the current global bit line (such as GBL 2908) to effectively increase the width of the current global bit line. This reduces the voltage drop across the global bit line.

Figure 30:
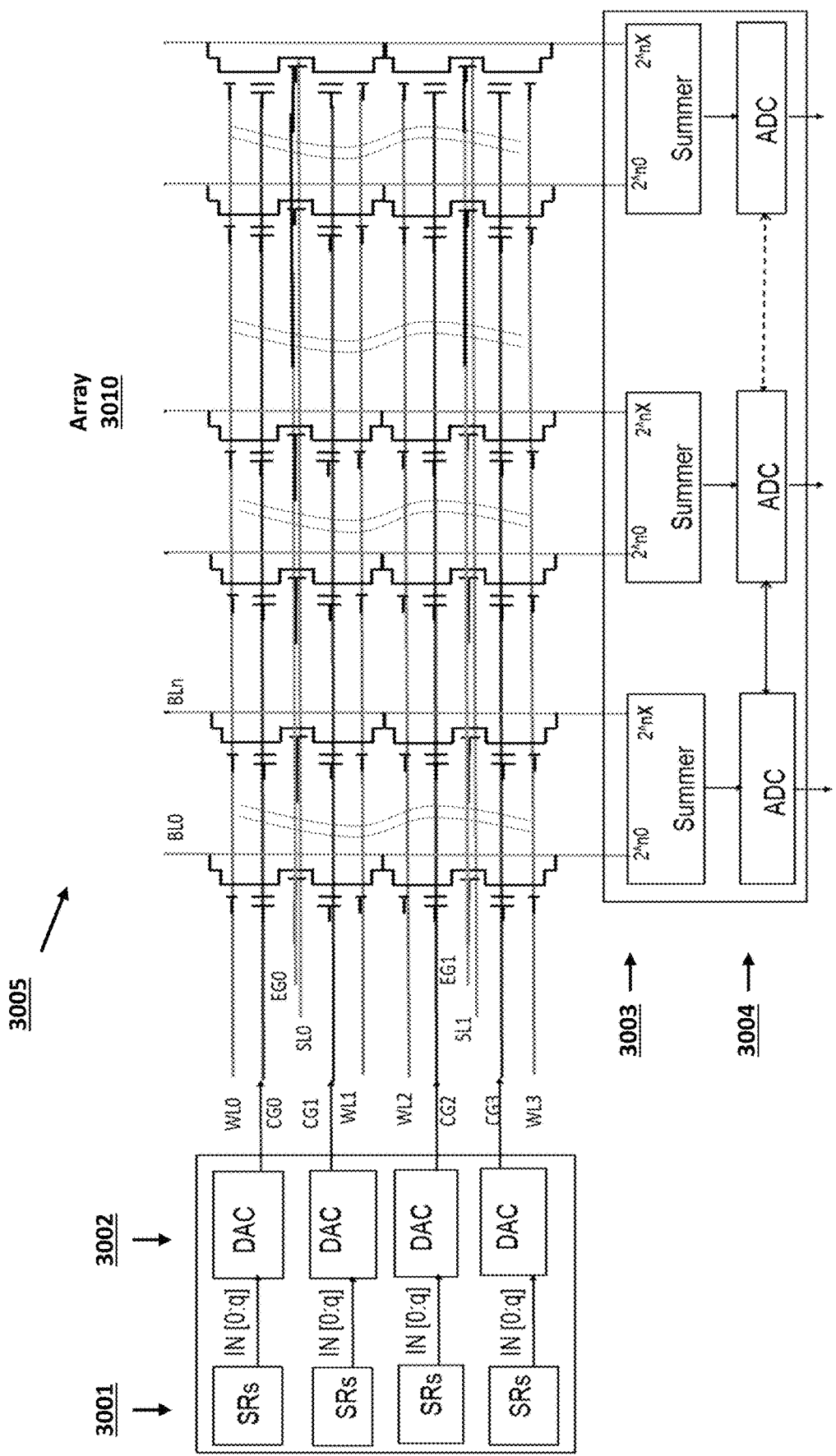
FIG. 30 depicts another improved VMM system.

FIG. 30 depicts VMM system 3000. VMM system 3000 comprises array 3010, (shift registers) SRs 3001, digital-to-analog converters 3002 (which receives the input from the SRs 3001 and output an equivalent (analog or pseudo-analog) level or info), summer circuits 3003, analog-to-digital converters 3004, and bit line switches 3005. Dummy bit lines and dummy bit line switches are present but not shown. As shown, ADC circuits can be combined together to create a single ADC with greater precision (i.e., greater number of bits).

Figure 31:
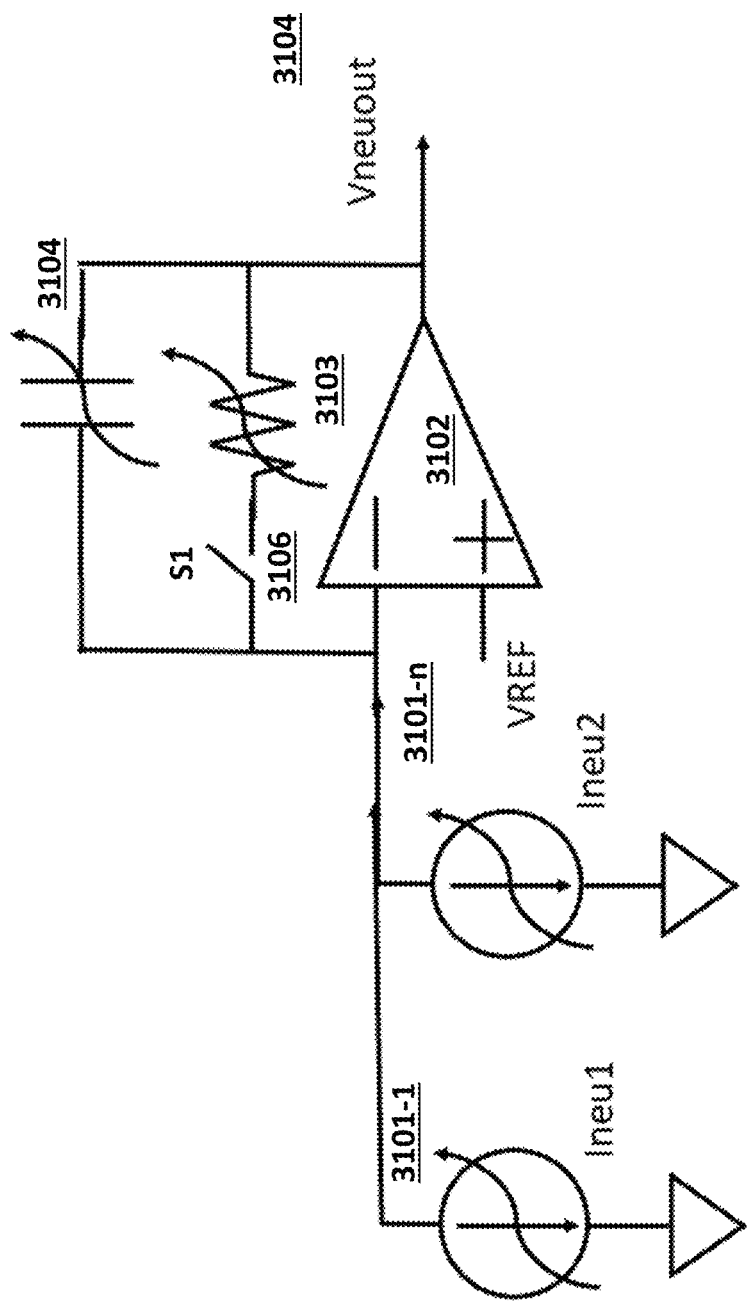
FIG. 31 depicts an embodiment of a summer circuit.
Figure 32:
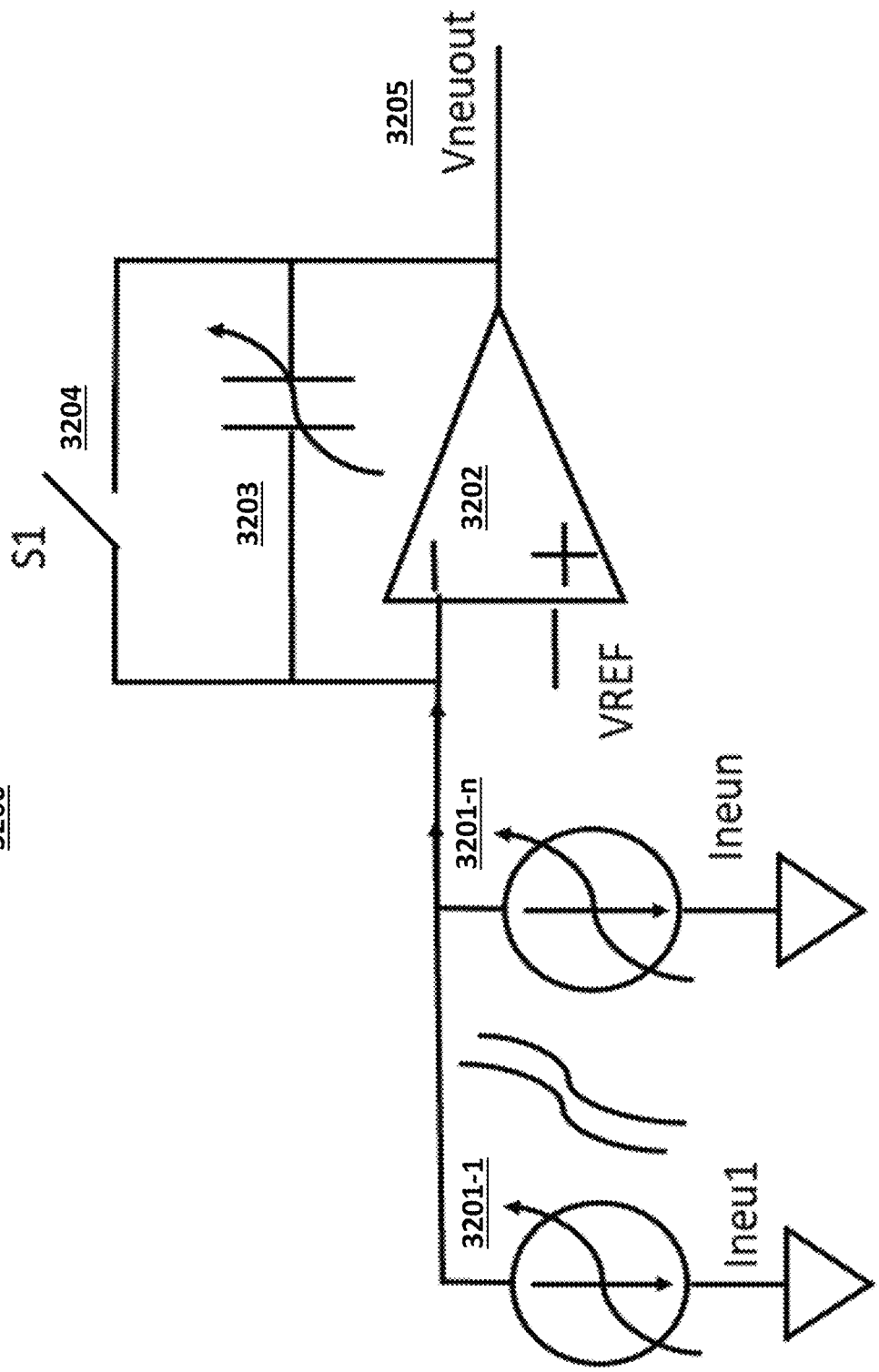
FIG. 32 depicts another embodiment of a summer circuit.

Summer circuits 3003 can include the circuits that are shown in FIGS. 31-33. It may include circuits for normalization, scaling, arithmetic operations, activation, statistical rounding, etc.

FIG. 31 depicts current-to-voltage summer circuit 3100 adjustable by a variable resistor, which comprises current source 3101-1, . . . , 3101-n drawing current Ineu(1), Ineu(n), respectively (which are the currents received from bit line(s) of a VMM array), operational amplifier 3102, variable holding capacitor 3104, and variable resistor 3103. Operational amplifier 3102 outputs a voltage, Vneuout=R3103*(Ineu1+Ineu0), which is proportional to the current Ineux. The holding capacitor 3104 is used to hold the output voltage when switch 3106 is open. This holding output voltage is used for example to be converted into digital bits by an ADC circuit.

FIG. 32 depicts current-to-voltage summer circuit 3200 adjustable by a variable capacitor (basically an integrator), which comprises current source 3201-1, . . . , 3201-n drawing current Ineu(1), . . . Ineu (n), respectively (which are the currents received from bit line(s) of a WM array), operational amplifier 3202, variable capacitor 3203, and switch 3204. Operational amplifier 3202 outputs a voltage, Vneuout=Ineu*integration time/C3203, which is proportional to the current Ineu(s).

Figure 33A:
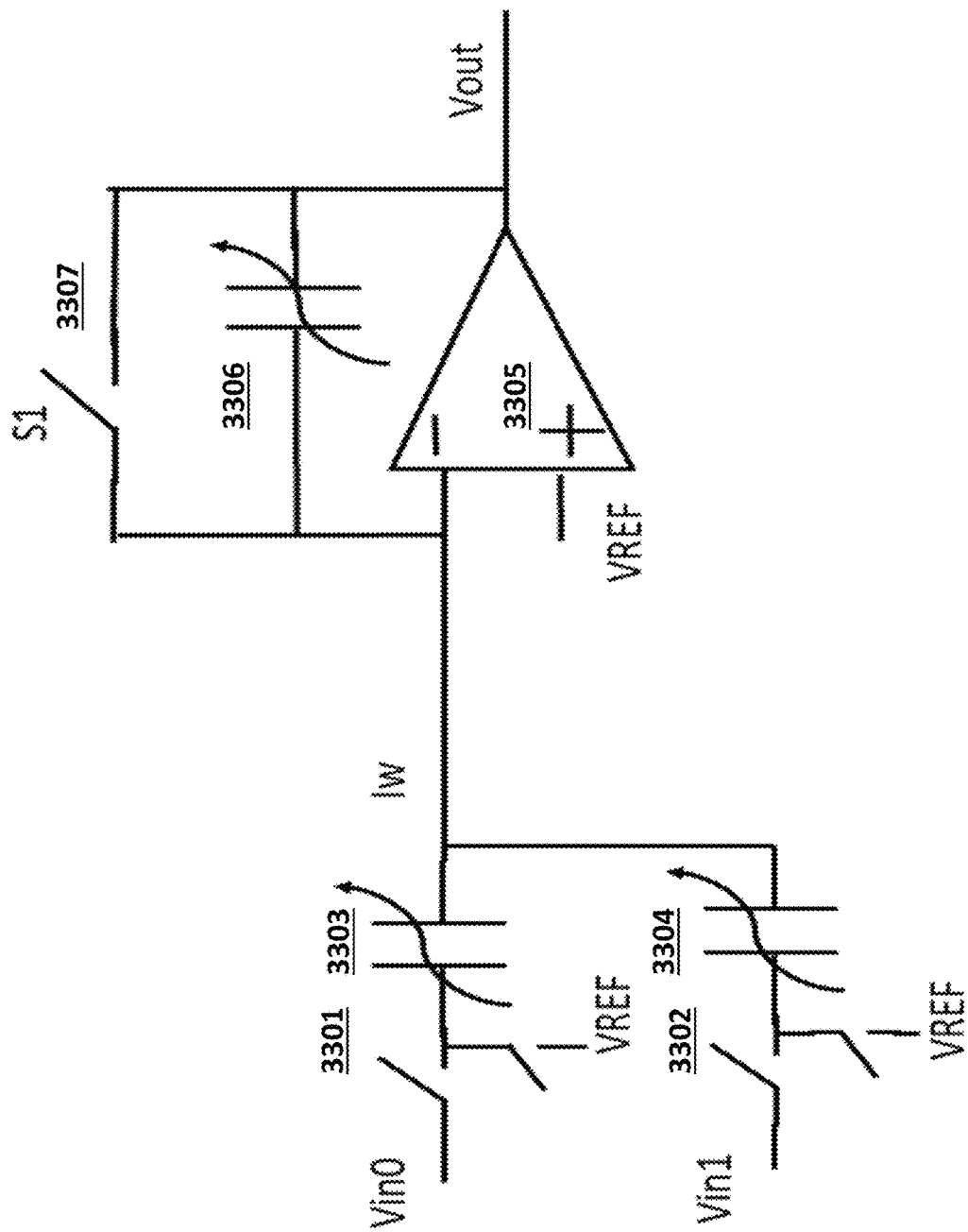
FIGS. 33A and 33B depicts other embodiments of a summer circuit.

FIG. 33A depicts voltage summer 3300 adjustable by variable capacitors (i.e., a switch cap SC circuit), which comprises switches 3301 and 3302, variable capacitors 3303 and 3304, operational amplifier 3305, variable capacitor 3306, and switch 3306. When switch 3301 is closed, input Vin0 is provided to operational amplifier 3305. When switch 3302 is closed, input Vin1 is provided to operational amplifier 3305. Optionally, switches 3301 and 3302 are not closed at the same time. Operational amplifier 3305 generates an output Vout, that is an amplified version of the input (either Vin0 and/or Vin1, depending on which switch is closed among switches 3301 and 3302). That is Vout=Cin/Gout*(Vin), Cin is C3303 or C3304, Cout is C3306. For example, Vout=Cin/Gout*(Vinx), Cin=C3303=C3304. In one embodiment, Vin0 is a W+ voltage and Vin1 is a W− voltage, and voltage summer 3300 adds them together to generate output voltage Vout.

Figure 33B:
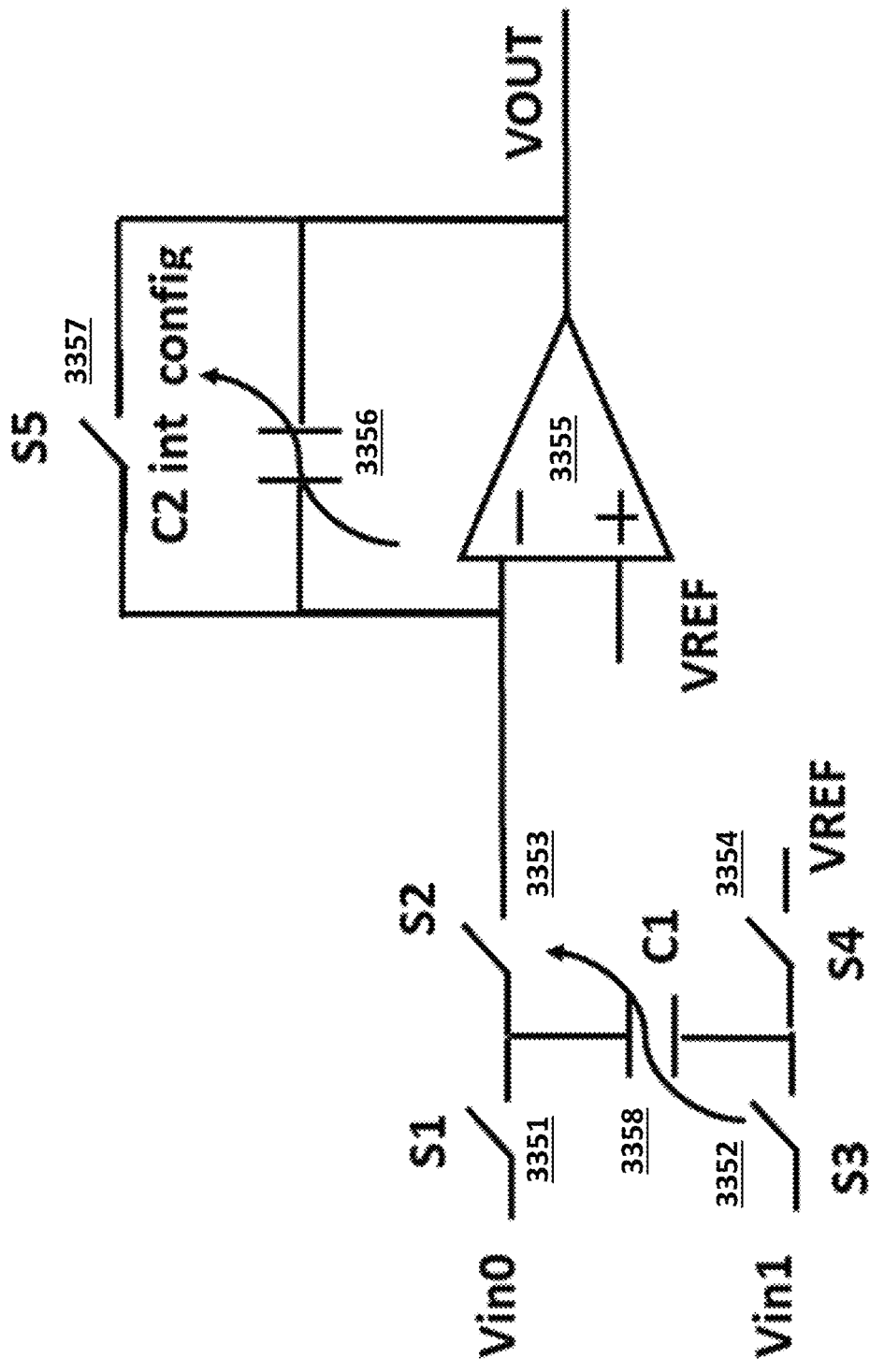

FIG. 33B depicts voltage summer 3350, which comprises switches 3351, 3352, 3353, and 3354, variable input capacitors 3358, operational amplifier 3355, variable feedback capacitor 3356, and switch 3357. In one embodiment, Vin0 is a W+ voltage and Vin1 is a W−voltage, and voltage summer 3300 adds them together to generate output voltage Vout.

For Input=Vin0: when switch 3354 and 3351 are closed, input Vin0 is provided to top terminal of the capacitor 3358. Then switch 3351 is open and switch 3353 is closed to transfer the charge from the capacitor 3358 into the feedback capacitor 3356. Basically, then the output VOUT=(C3358/C3356)*Vin0 (for case of with VREF=0 as example).

For Input=Vin1: when switch 3353 and 3354 are closed, both terminals of the capacitor 3358 are discharged to VREF. Then switch 3354 is open and switch 3352 is closed, charging the bottom terminal of the capacitor 3358 to Vin1, which in turn charges up the feedback capacitor 3356 to VOUT=−(C3358/C3356)*Vin1 (for case of VREF=0).

Hence, if Vin1 input is enabled after Vin0 input is enabled, VOUT=(C3358/C3356)*(Vin 0−Vin1), for case of VREF=0 as example. This is used for example to realize w=w+−w−.

Methods of input and output operation to FIG. 2 which applies to the VMM arrays discussed above can be in digital or analog form. Methods include:

Sequential Inputs IN [0:q] to DACs:
Operate sequentially IN0, then IN1, . . . , then INq; all input bits has same VCGin; all bit line (neuron) outputs are summed with adjusting binary index multiplier; either before ADC or after ADC Adjusting neuron (bit line) binary index multiplier method: as shown in FIG. 20, the example summer has two bit lines BL0 and BLn. A weight is distributed across multiple bit lines BL0 to BLn. For example there are 4 bit lines BL0,BL1,BL2,BL3. The output from bitline BL0 is to be multiplied by $2^0=1$. The output from bit line BLn, which stand for nth binary bit position, is multiplied by $2^n$, for example 2 1 \3=8 for n=3. Then the output from all bit lines after being multiplied appropriately by binary bit position $2^n$, are summed together. Then this is digitized by the ADC. This method means all cells have only binary range, the multi-level range (n-bit) is accomplished by the peripheral circuit (meaning by the summer circuit). Hence the voltage drop for all the bit lines is approximately the same for highest bias level of memory cell.

Operate sequentially IN0, IN1, . . . , then INq; each input bit has a corresponding analog value VCGin; all neuron outputs are summed for all input bit evaluation; either before ADC or after ADC Parallel Inputs to DACs:
Each input IN[0:q] has a corresponding analog value VCGin; all neuron outputs are summed with adjusting binary index multiplier method; either before ADC or after ADC By sequentially operates on the arrays, the power is more evenly distributed. The neuron (bit line) binary index method also reduce the power in the array since each cell in the bit line only has binary levels, the $2^n$ level is accomplished by the summer circuit 2603.

Each ADC as shown in FIG. 33 can be configured to combine with next ADC for higher bit implementation with appropriate design of the ADC.

Figure 34A:
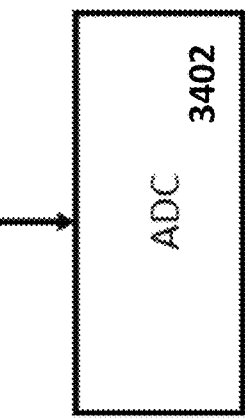
FIGS. 34A, 34B, and 34C depicts embodiments of an output circuit.
Figure 34B:
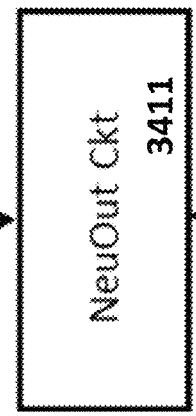
Figure 34C:
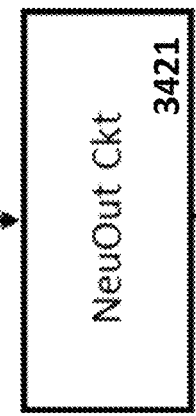

FIGS. 34A, 34B, and 34C depict output circuits that can be used for summer circuits 3003 and analog-to-digital converters 3004 in FIG. 30.

FIG. 34A depicts output circuit 3400, which comprises analog-to-digital converter 3402, which receives neuron output 3401 and outputs output digital bits 3403.

FIG. 34B depicts output circuit 3410, which comprises neuron output circuit 3411 and analog-to-digital converter 3412, which together receive neuron output 3401 and generates outputs 3413.

FIG. 34C depicts output circuit 3420, which comprises neuron output circuit 3421 and converter 3422, which together receive neuron output 3401 and generates outputs 3423.

Neuron output circuit 3411 or 3411 can, for example, perform summing, scaling, normalization, arithmetic operations, etc. Converter 3422, for example, can perform ADC, PDC, AAC, APC operation, etc.

Figure 35:
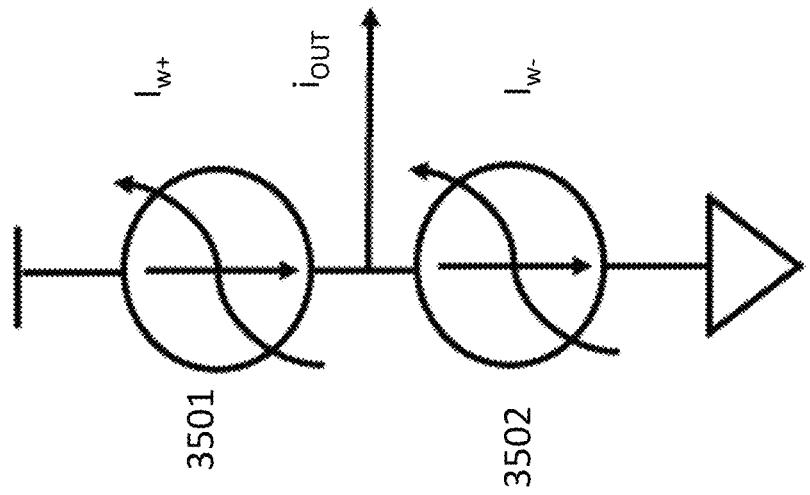
FIG. 35 depicts a neuron output circuit.

FIG. 35 depicts neuron output circuit 3500, which comprises adjustable (scaling) current source 3501 and adjustable (scaling) current source 3502, which together generate output $i_{OUT}$, which is the neuron output. This circuit can perform summation of positive weight and negative weights, i.e., w=w+−w−, and up or down scaling of the output neuron current at the same time.

Figure 36:
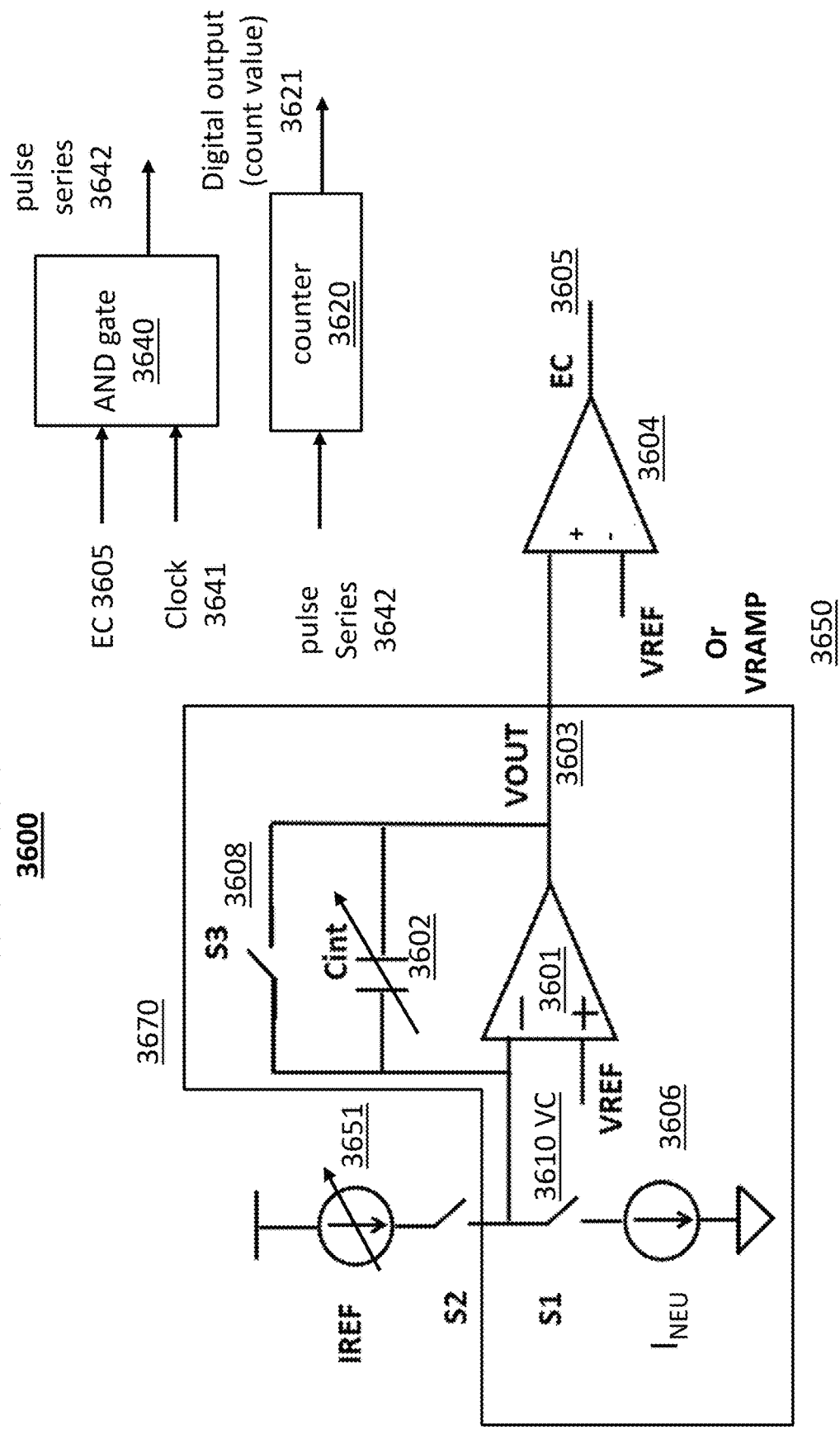
FIG. 36 depicts an embodiment of an analog-to-digital converter.

FIG. 36 depicts configurable neuron serial analog-to-digital converter 3600. It includes integrator 3670 which integrates the neuron output current into the integrating capacitor 3602. One embodiment is that the digital output (count output) 3621 is produced by clocking the ramping VRAMP 3650 until the comparator 3604 switches polarity or another embodiment is by ramping down node VC 3610 by the ramp current 3651 until the VOUT 3603 reaches the VREF 3650, at which point the EC 3605 signal disables the counter 3620. The (n-bit) ADC is configurable to have lower number of bit precision<n-bits or higher number of bit precision>n-bits depending on target application. The configurability is done such as by configuring the capacitor 3602, the current 3651, or ramping rate of the VRAMP 3650, the clocking 3641, etc. In another embodiment, the ADC circuits of a VMM array is configured to have lower precision<n-bits and the ADC circuits of another VMM array is configured to have high precision>n-bits. Further this ADC circuit of one neuron circuit can be configured to combine with the next ADC of the next neuron circuit to produce higher n-bit ADC precision such as by combining the integrating capacitor 3602 of the two ADC circuits.

Figure 37:
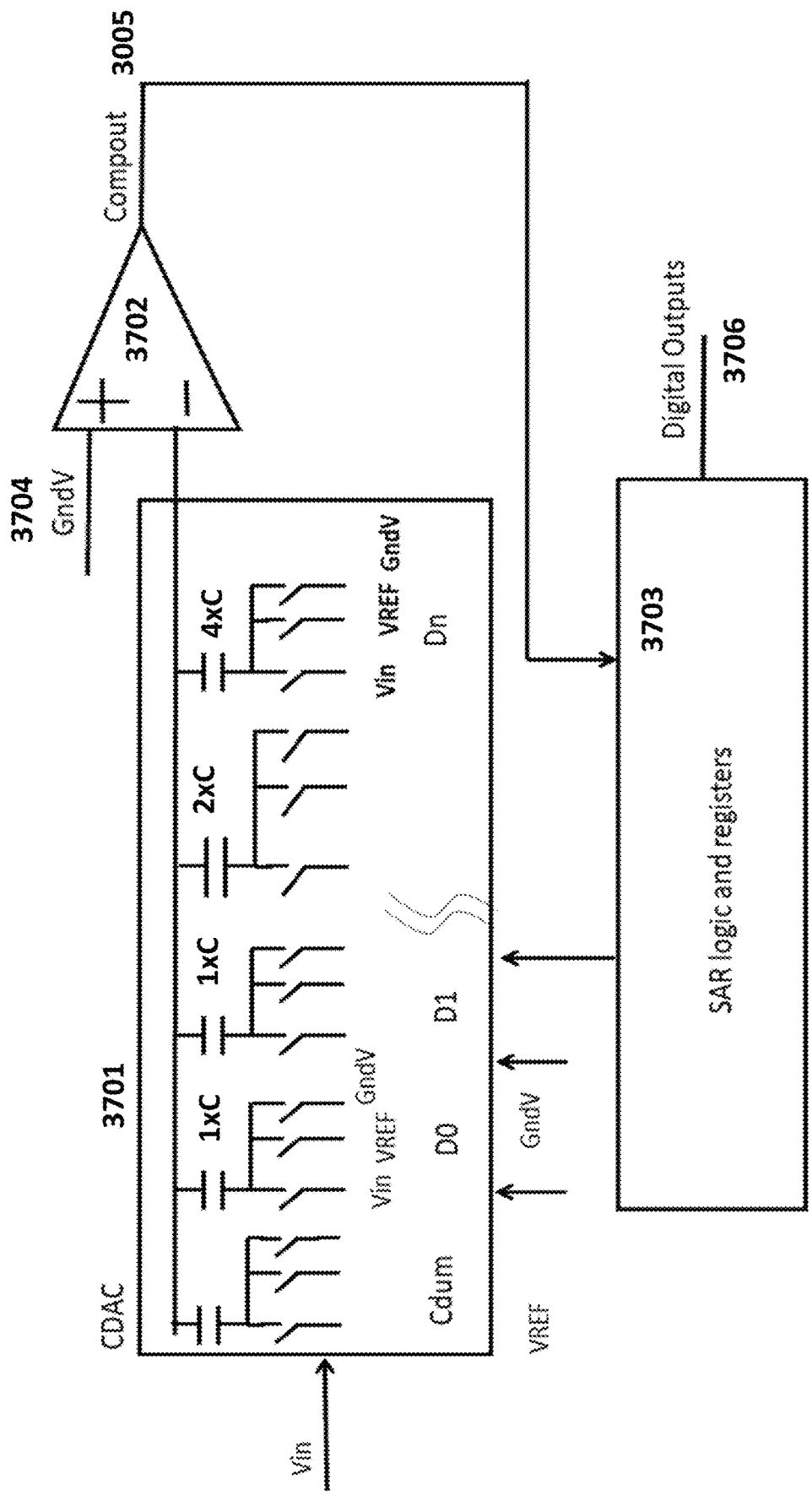
FIG. 37 depicts another embodiment of an analog-to-digital converter.

FIG. 37 depicts configurable neuron SAR (successive approximation register) analog-to-digital converter 3700. This circuit is a successive approximation converter that bases on charge redistribution using binary capacitors. It includes a binary CDAC (DAC basing on capacitors) 3701, op-amp/comparator 3702, SAR logic 3703. As shown GndV 3704 is a low voltage reference level, for example ground level.

Figure 38:
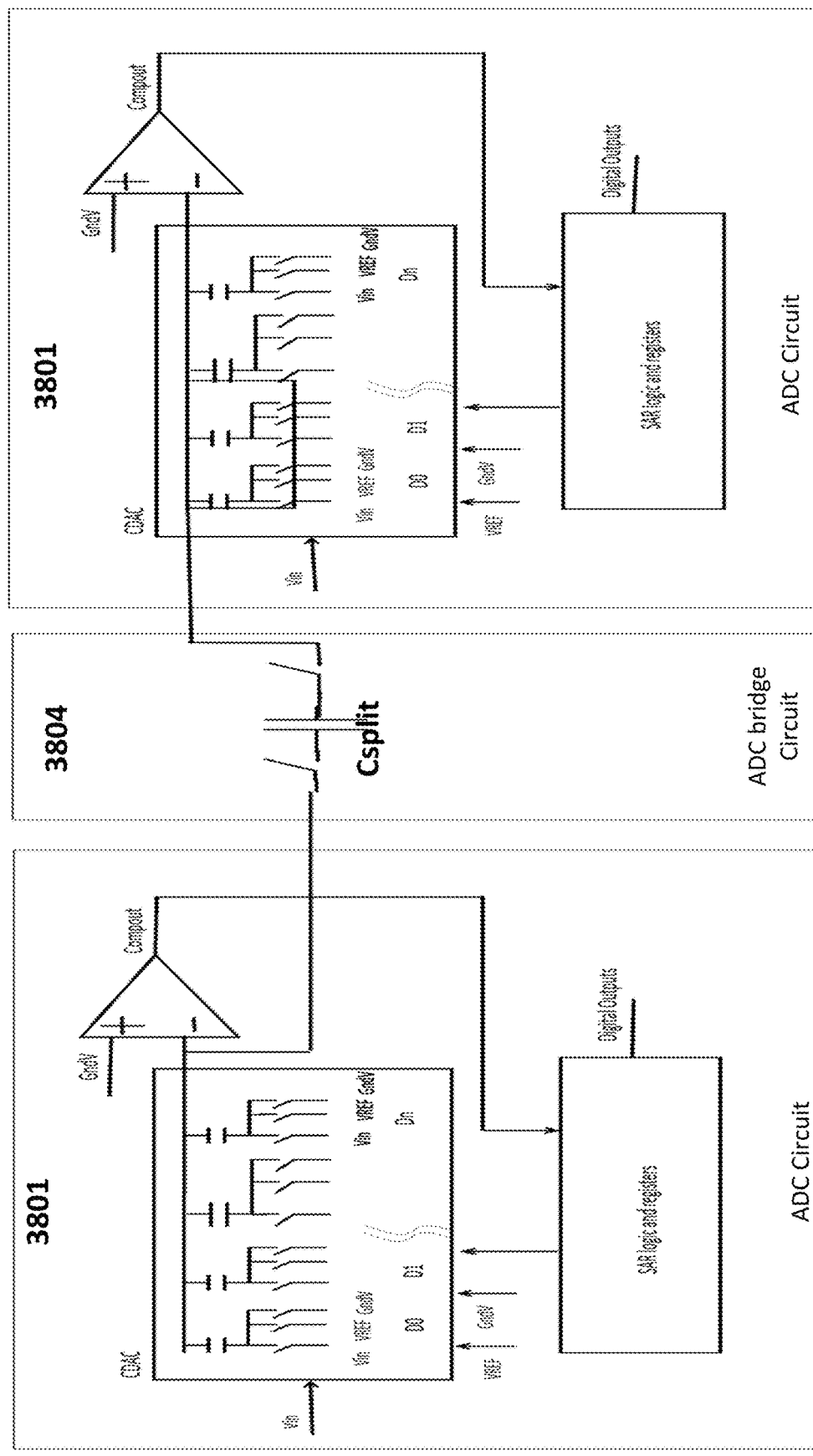
FIG. 38 depicts another embodiment of an analog-to-digital converter.

FIG. 38 depicts a configurable neuron combo SAR analog-to-digital converter 3800. This circuit combines two ADCs from two neuron circuits into one to achieve higher precision n-bit, for example for 4-bit ADC for one neuron circuit, this circuit can achieve >4-bit precision such as 8-bit ADC precision by combining two 4-bit ADCs. The combo circuit topology is equivalent to a split cap (bridge capacitor (cap) or attention cap) SAR ADC circuit, for example a 8-bit 4C-4C SAR ADC resulted by combining two adjacent 4-bit 4C SAR ADC circuits. A bridge circuit 3804 is needed to accomplish this, the capacitance of capacitor of this circuit is =(total number of CDAC cap unit/total number of CDAC cap unit−1).

Figure 39:
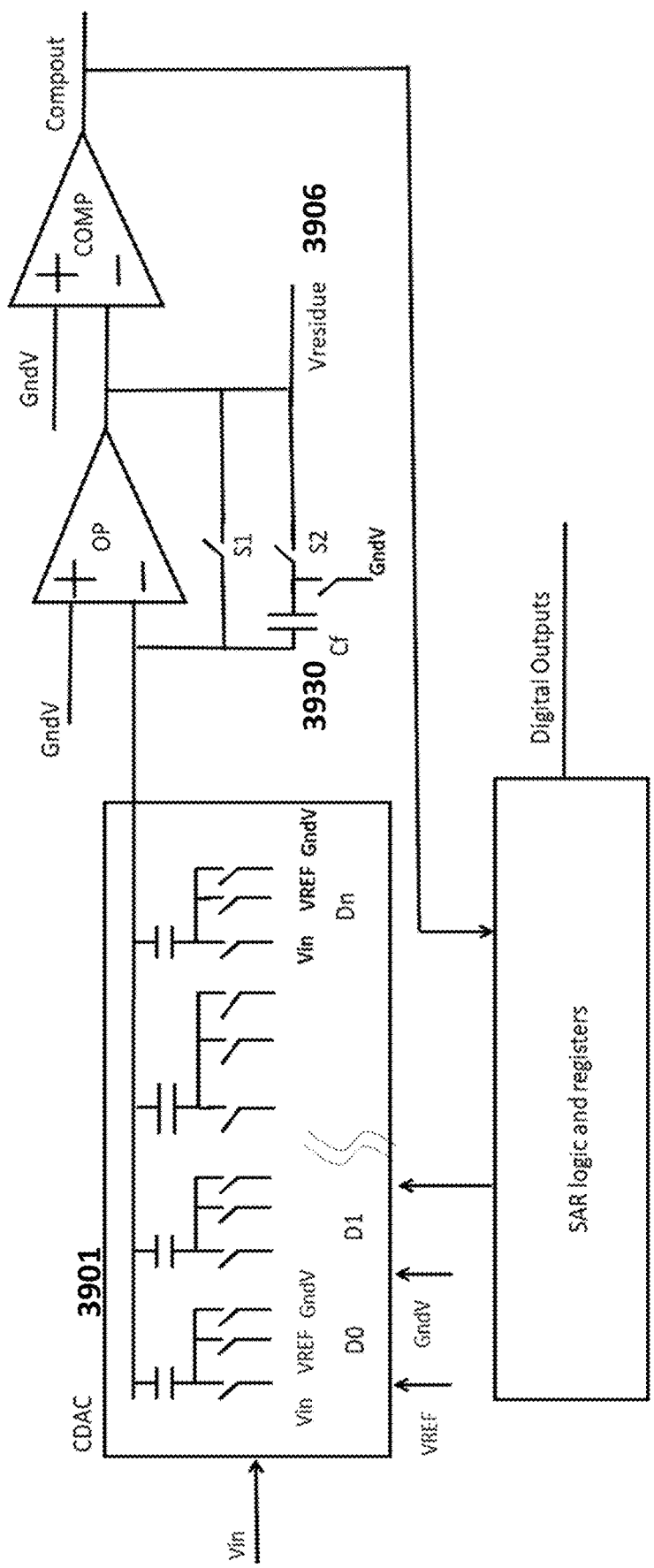
FIG. 39 depicts another embodiment of an analog-to-digital converter.

FIG. 39 depicts a configurable neuron, pipelined SAR CDAC ADC circuit 3900 that can be used to combine with the next SAR ADC to increase the number of bits in a pipelined fashion. Residue voltage 3906 is generated by capacitor 3930 Cf to provide as input to next stage of pipelined ADC (e.g. to provide gain of 2 (ratio of Cf to C of all caps in DAC 3901) as input to next SAR CDAC ADC).

Additional implementation details regarding configurable output neuron (such as configurable neuron ADC) circuits can be found in U.S. patent application Ser. No. 16/449,201, filed on Jun. 21, 2019, by the same assignee, and titled "Configurable Input Blocks and Output Blocks and Physical Layout for Analog Neural Memory in a Deep Learning Artificial Neural Network," which is incorporated by reference herein.

Applicant previously invented a mechanism for achieving precise data tuning in an analog neural memory in an artificial neural network, which is described in U.S. patent application Ser. No. 16/985,147, filed on Aug. 4, 2020, and titled, "Ultra-Precise Tuning of Analog Neural Memory Cells in a Deep Learning Artificial Neural Network," which is incorporated by reference herein. That previous application discloses embodiments for performing coarse programming, fine programming, and ultra-fine programming of a selected cell in a VMM. Thus, that application contemplates performing up to three types of programming on each selected cell. While this approach can achieve extremely precise programming, it also takes a significant amount of time, as each selected cell in the array must go through all three types of programming processes.

FIGS. 40-48 depict embodiment that improve upon the programming mechanism of the prior art and the prior application.

Figure 40:
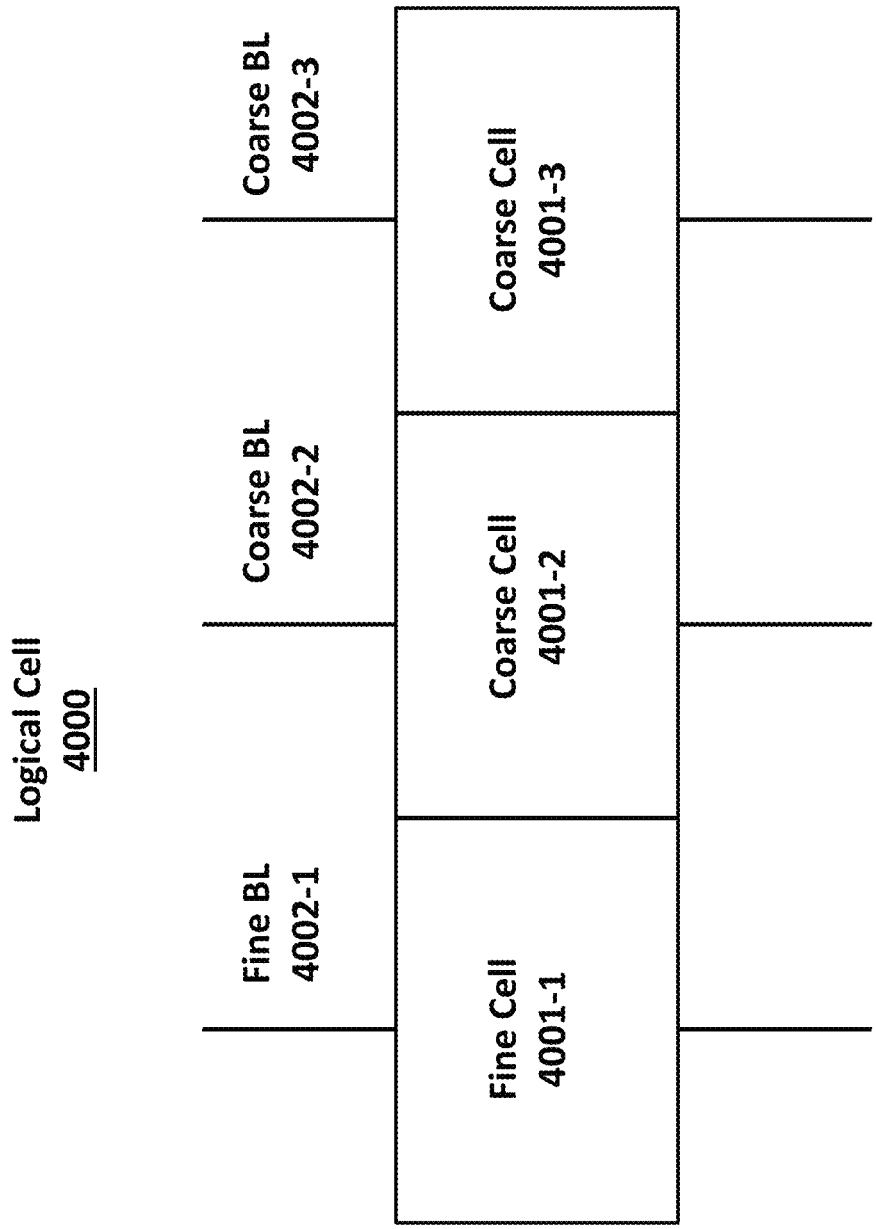
FIG. 40 depicts an embodiment of a logical cell in a VMM array.

FIG. 40 depicts logical cell 4000. In this example, logical cell comprises three memory cells, which are labeled fine cell 4001-1, coarse cell 4001-2, and coarse cell 4001-3. Fine cell 4001-1 is coupled to fine bit line 4002-1, coarse cell 4001-2 is coupled to coarse bit line 4002-2, and coarse cell 4001-3 is coupled to coarse bit line 4002-3. Logical cell 4000 contains data that in the prior art would have been stored in a (physical) single cell. For example, logical cell 4000 can hold one of N different values, where N is the total number of different values that can be stored in logical cell 4000 (e.g., N=64 or 128). Unlike in the prior art, rather than performing multiple types of programming (e.g., coarse programming and fine programming) on each physical cell, a coarse programming method is performed on coarse cell 4001-3 over coarse bit line 4002-3, a coarse programming method is performed on coarse cell 4001-2 over coarse bit line 4002-2, and a coarse and/or a fine programming method are performed on fine cell 4001-1 over fine bit line 4002-1. That is, a fine programming method is not performed on coarse cells 4001-2 and 4001-3. By implementing this approach, the programming time will be much shorter compared to the approach of doing coarse and fine programming for all three cells since fine programming, in particular, takes a relatively large amount of time.

Figure 41:
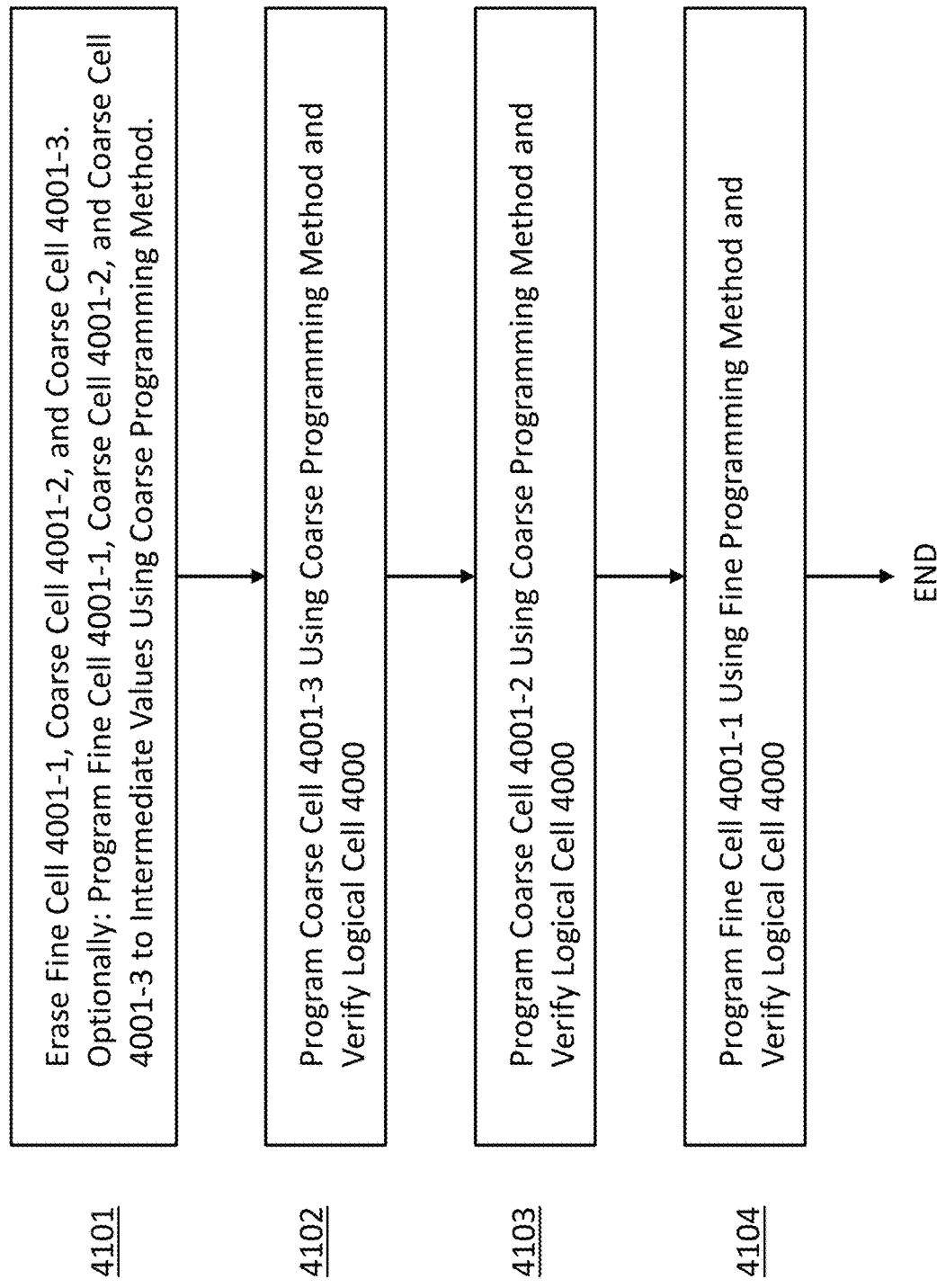
FIG. 41 depicts a program and verify method for the logical cell of FIG. 40.

FIG. 41 depicts program and verify method 4100 performed on logical cell 4000 of FIG. 40.

The first step is to erase fine cell 4001-1, coarse cell 4001-2, and coarse cell 4001-3 (step 4101). Optionally, the first step further comprises, after erasing, performing a coarse programming method on all three cells to intermediate values.

The second step is to program coarse cell 4001-3 using a coarse programming method and to verify logical cell 4000 after that operation to confirm that coarse cell 4001-3 is correctly programmed to the intended coarse value for coarse cell 4001-3 (step 4102). The alternative method is to verify the coarse cell by itself.

The third step is to program coarse cell 4001-2 using a coarse programming method and to verify logical cell 4000 after that operation to confirm that coarse cell 4001-2 and coarse cell 4001-3 together have been correctly programmed to the intended coarse value for coarse cells 4001-2 and 4001-3 together, reflected as the value for logical cell 4000 (step 4103).

The fourth step is to program fine cell 4001-1 using a fine programming method and to verify logical cell 4000 after that operation to confirm that fine cell 4001-1, coarse cell 4001-2, and coarse cell 4003 together have been correctly programmed to the intended value for logical cell 4000 (step 4104).

Table 12 depicts examples of target values for logical cell 4000, fine cell 4001-1, coarse cell 4001-2, and coarse cell 4001-3:

TABLE 12

EXEMPLARY TARGET VALUES FOR LOGICAL CELL 4000

| Value for N | Target for Logical Cell 4000 | Target for Fine Cell 4001-1 | Target for Coarse Cell 4001-2 | Target for Coarse Cell 4001-3 |
| --- | --- | --- | --- | --- |
| 1 | 1 nA | 1 nA | 0 nA | 0 nA |
| 6 | 6 nA | 6 nA | 0 nA | 0 nA |
| 56 | 56 nA | 6 nA | 0 nA | 50 nA |
| 128 | 128 nA | 8 nA | 60 nA | 60 nA |

Figure 42:
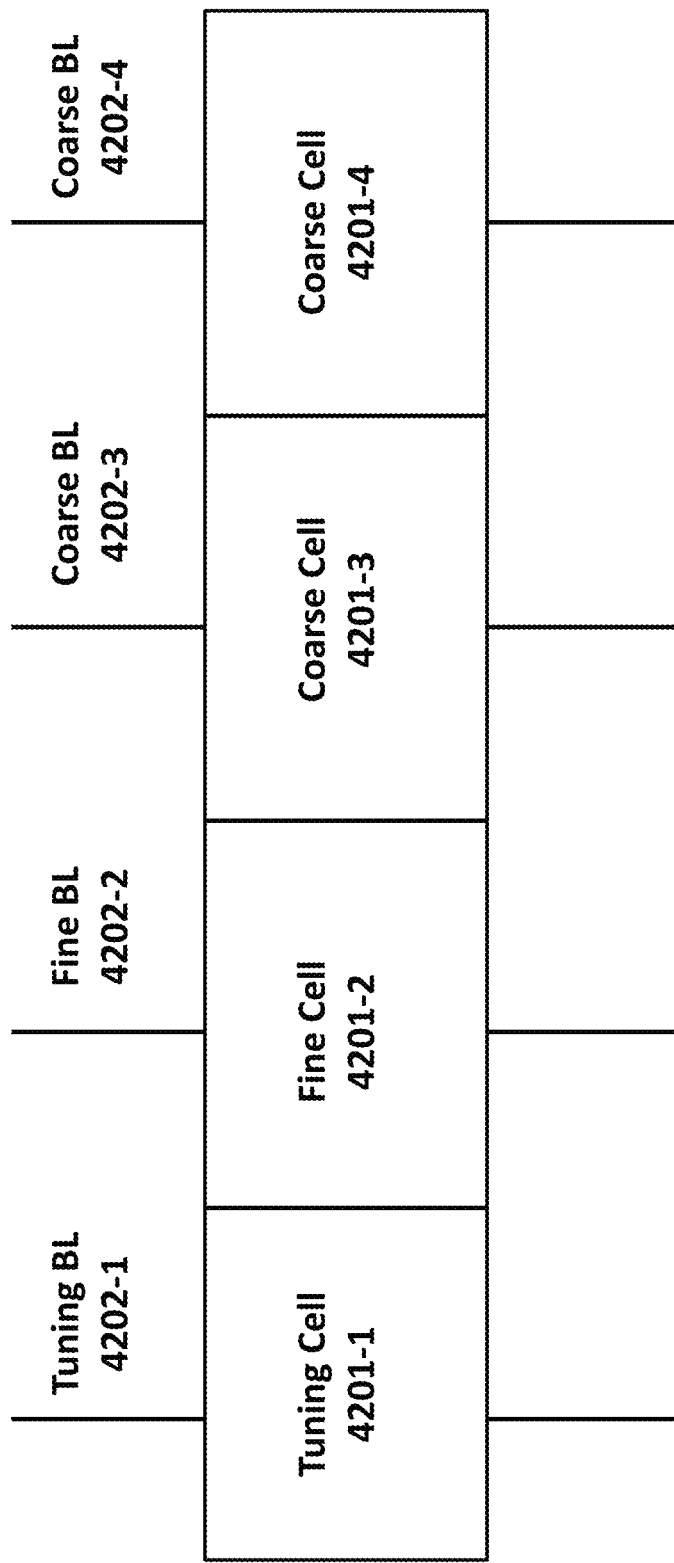
FIG. 42 depicts another embodiment of a logical cell in a VMM array.

As can be appreciated with reference to Table 12, only fine cell 4001-1 needs to have a precise and accurate value within an allowed percentage (e.g., +/−0.5%, +/−0.25%, without limitation) of the final target value for logical cell 4000. For example, Applicant has determined that coarse cells can have as example +/−20% of the target value for the coarse cell (as any inaccuracy can be compensated for by fine cell 4001-1), whereas the fine cell can have +/−0.5% of the target value for the logical cell. Hence, coarse cells can be programmed with coarser voltage steps, which allows them to reach their targets much faster. One method of assigning the charge levels for each of the N levels for memory cells is as follows. First, determine a current range with maximum current Imax in sub-threshold or any other regions from data characterization, typically the current range Imax is within the voltage on the floating approximately =Vtfg−0.2V. Second, determine the leakage current, Ileak, from the physical memory cell when the cell is in the off condition (e.g., WL=0V, CG=0V). The lowest charge for the lowest of the N levels will be some factor a*Ileak, for example a=128 for a 128 row array. The highest charge for the highest of the N levels is the charge associated with the maximum current Imax of the current range. Third, determine the program resolution when program to Imax using a coarse/fine or a coarse/fine/ultra-fine algorithm. Typically, a standard deviation (sigma) variation of the Imax target is a single electron program resolution for the coarse/fine algorithm and sub-electron program resolution for coarse/fine/ultra-fine (bitline tuning or floating gate-floating gate coupling tuning method). For example, a target delta level for a neural network could be=(IdeltaL=I(Ln)−I(Ln−1) =b*1sigma variation, b typically can be 1 or 2 or 3 depending on the desired network accuracy for a particular application. For exemplary embodiment, the number of levels, NL, is =(Imax−a*Ileak)/IdeltaL with a is a pre-determined number basing on data characterization FIG. 42 depicts logical cell 4200. In this example, logical cell 4200 comprises four memory cells, which are labeled tuning cell 4201-1, fine cell 4201-2, coarse cell 4201-3, and coarse cell 4201-4. Tuning cell 4201-1 is coupled to tuning bit line 4202-1, fine cell 4201-2 is coupled to fine bit line 4202-2, coarse cell 4201-3 is coupled to coarse bit line 4202-3, and coarse cell 4201-4 is coupled to coarse bit line 4202-4. Logical cell 4200 contains data that in the prior art would have been stored in a single physical cell. For example, logical cell 4200 can hold one of N different values, where N is the total number of different values that can be stored in logical cell (e.g., N=64 or 128). Unlike in the prior art, rather than performing multiple types of programming (e.g., coarse programming, fine programming, ultra-fine (FG-FG tuning) or tuning programming) on each physical cell, coarse programming is performed on coarse cell 4201-4 over coarse bit line 4202-4, coarse programming is performed on coarse cell 4201-3 over coarse bit line 4202-3, coarse and/or fine programming are performed on fine cell 4201-2 over fine bit line 4202-2, and FG-FG tuning (ultra-fine) programming is performed on tuning cell 4201-1 over tuning bit line 4202-1. That is, ultra-fine and fine programming are not performed on coarse cells 4201-3 and 4201-4, and ultra-fine programming is not performed on fine cell 4201-2.

The ultra-fine programming allows the logical cell to reach within the target % of the final target value, for example +/−0.5% or +/−0.25%, without limitation. The ultra-fine programming is performed by programming the tuning cell 4201-1. The tuning cell 4201-1 tunes the fine cell 4201-2 through the FG-FG coupling (FG of the tuning cell 4201-1 couples to FG of the fine cell 4201-2). For example, if the percentage of coupling from FG-FG of the tuning cell to the fine cell is −3%, this means that a 4 mV change in FG of the tuning cell (such as from CG program increment of 10 mV of one cell) results in 0.12 mV change in FG of the fine cell (from FG to FG coupling of adjacent two cells). The coarse cell target for each of coarse cell 4201-3 and 4201-5 example can be within +/−20%, the fine cell target can be within 15%, the tuning cell tuning target can be +/−0.2%.

Note that only one tuning cell is needed for three (multiple) physical cells to realize one logic cell.

Figure 43:
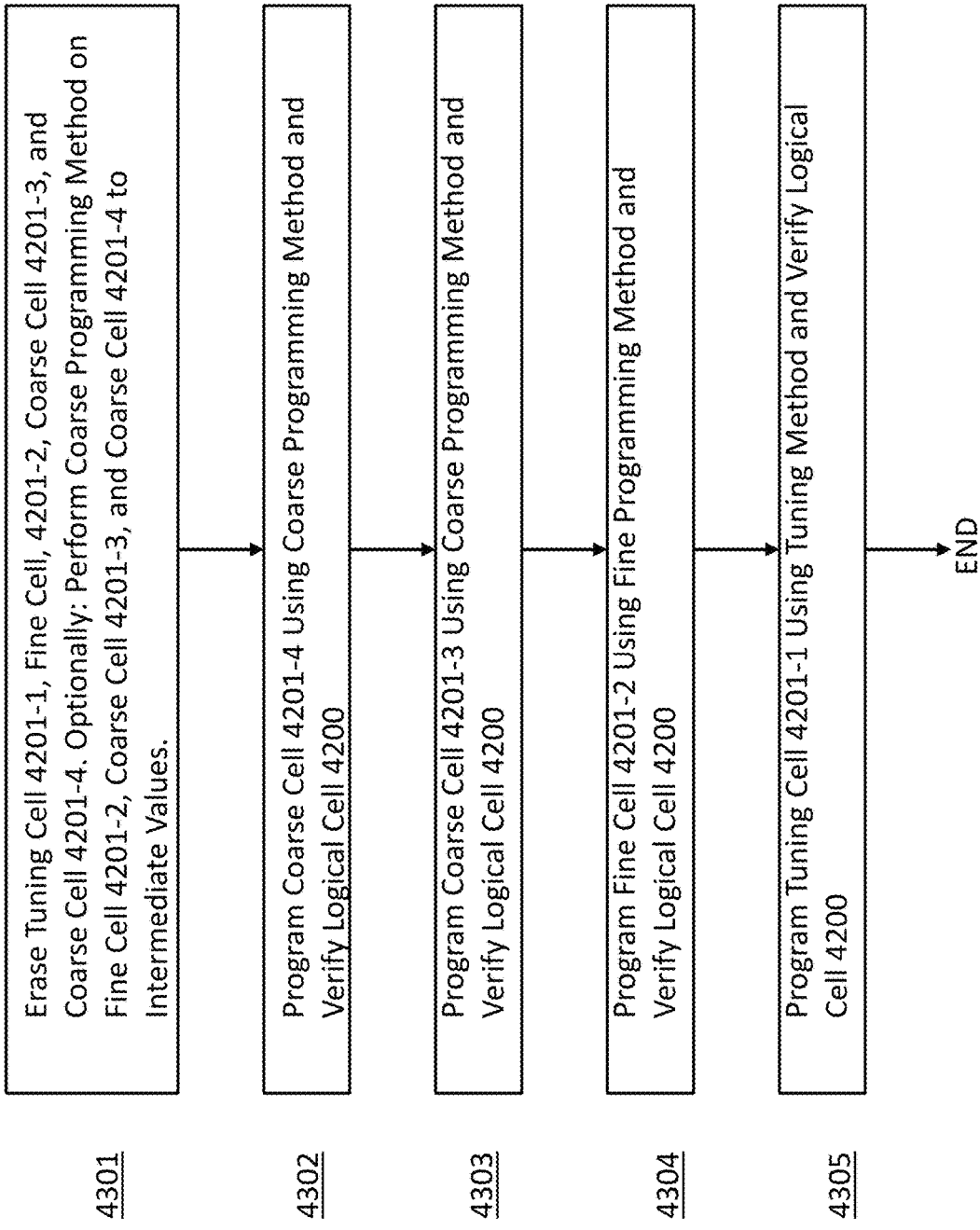
FIG. 43 depicts a program and verify method for the logical cell of FIG. 42.

FIG. 43 depicts program and verify method 4300 performed on logical cell 4200 of FIG. 42.

The first step is to erase tuning cell 4201-1, fine cell 4201-2, coarse cell 4201-3, and coarse cell 4201-4 (step 4301). Optionally, the first step further comprises performing a coarse programming method on fine cell 4201-2, coarse cell 4201-3, and coarse cell 4201-4 to intermediate values.

The second step is to program coarse cell 4201-4 using a coarse programming method and to verify logical cell 4200 after that operation to confirm that coarse cell 4201-4 is correctly programmed to the intended coarse value for coarse cell 4002-4 (step 4302).

The third step is to program coarse cell 4201-3 using a coarse programming method and to verify logical cell 4200 after that operation to confirm that coarse cell 4201-3 and coarse cell 4201-4 together have been correctly programmed to the intended coarse value for coarse cells 4201-3 and 4201-4 together (step 4303).

The fourth step is to program fine cell 4201-2 using a fine programming method and to verify logical cell 4200 after that operation to confirm that fine cell 4201-2, coarse cell 4201-3, and coarse cell 4201-4 together have been correctly programmed to the intended value for logical cell 4200 (step 4304).

The fifth step is to program tuning cell 4201-1 using a tuning method and to verify logical cell 4200 after that operation to confirm that tuning cell 4201-1, fine cell 4201-2, coarse cell 4201-3, and coarse cell 4201-4 together have been correctly programmed to the intended value for logical cell 4200 (step 4305).

Table 13 depicts examples of a target value for logical cell 4200, tuning cell 4201-1, fine cell 4001-2, coarse cell 4201-3, and coarse cell 4201-4:

TABLE 13

EXEMPLARY TARGET VALUES FOR LOGICAL CELL 4200

| Level (N = 128) | Target for Logical Cell 4200 | Target for Tuning Cell 4201-1 | Target for Fine Cell 4201-2 | Target for Coarse Cell 4201-3 | Target for Coarse Cell 4201-4 |
|---|---|---|---|---|---|
| 1 | 0.5 nA | 10-20000 nA | 0.5 nA | 0 nA | 0 nA |
| 6 | 3 nA | 10-2000 nA | 3 nA | 0 nA | 0 nA |
| 7 | 3.5 nA | 10-2000 nA | 3.5 nA | 0 nA | 0 nA |
| 128 | 64 nA | 10-2000 nA | 4 nA | 30 nA | 30 nA |

Note that the absolute value of the tuning cell 4201-1 is not important since the value of the logical cell 4200 is the sum of the two coarse cells 4201-3, 4201-4 and fine cell 4201-2. The purpose of the tuning cell 4201-1 is to tune the value of the fine cell 4201-2.

Figure 44:
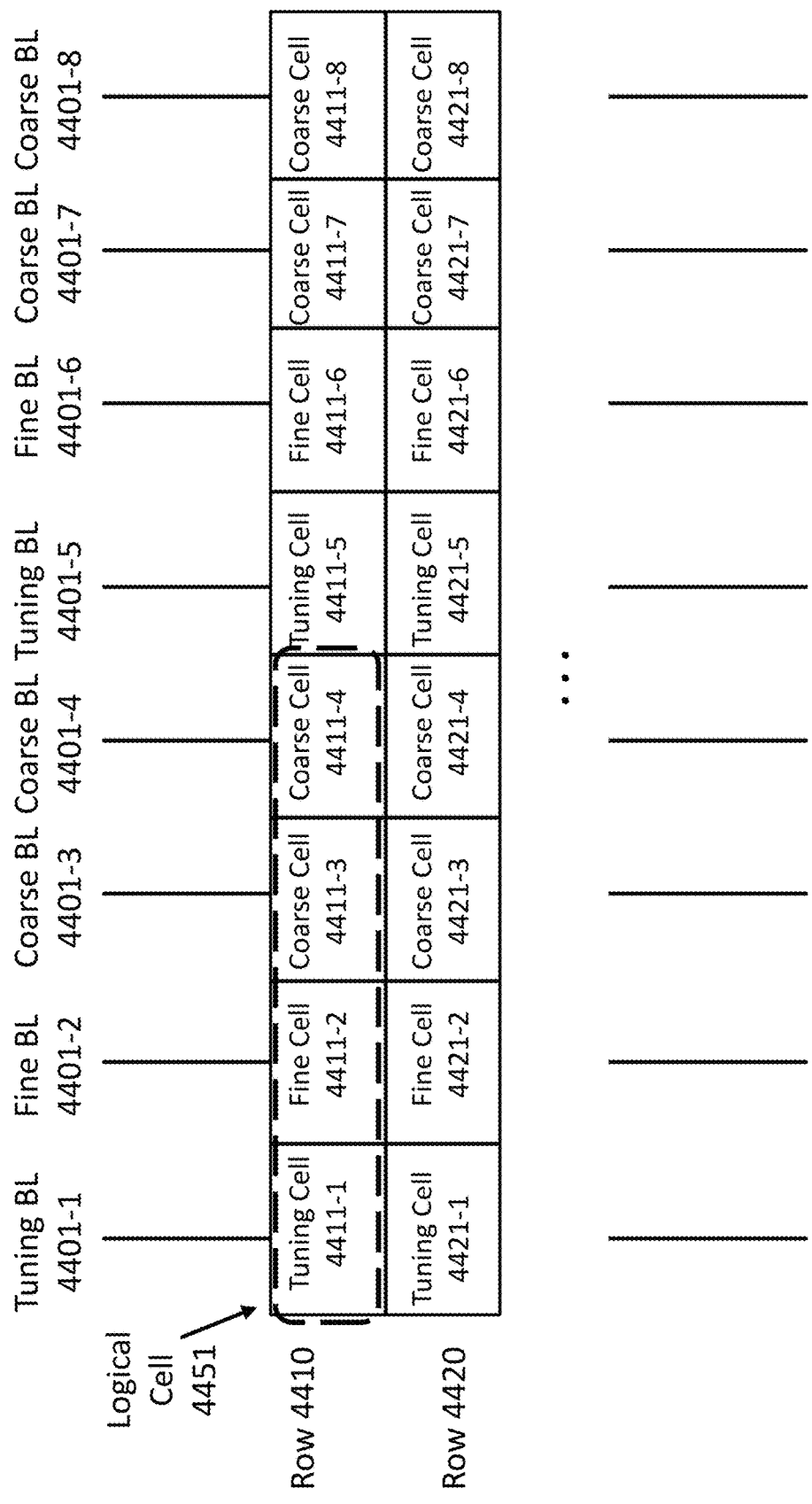
FIG. 44 depicts an embodiment of a VMM array.

FIG. 44 depicts array 4400. Array 4400 comprises a plurality of logical cells, such as exemplary logical cell 4451, which here follows the structure of logical cell 4200. Thus, logical cell 4451 comprises tuning cell 4411-1 coupled to tuning bit line 4401-1, fine cell 4411-2 coupled to fine bit line 4401-2, coarse cell 4411-3 coupled to coarse bitline 44010-3, and coarse cell 4411-4 coupled to coarse bitline 4401-4. Here, each row contains a plurality of logical cells of the same structure as logical cell 4200, and array 4400 comprises a plurality of rows, such as exemplary rows 4410 and 4420. Note in the same row, the next logic cell has its tuning cell next to coarse cell of the previous logical cell, this is used to minimize FG-FG coupling between the two logical cells, as the capacitive effect will be relatively small on coarse cell 4411-4 compared to, for example, fine cell 4411-6.

Figure 45:
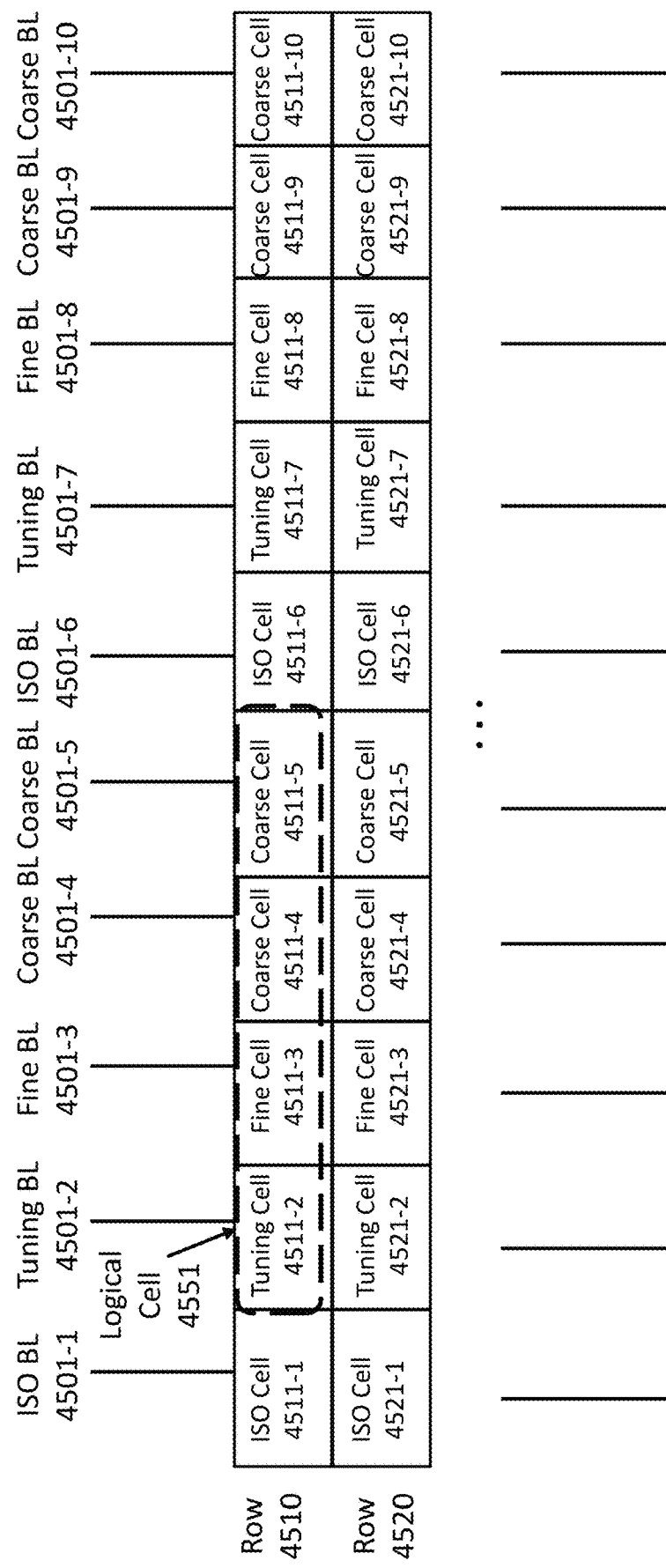
FIG. 45 depicts another embodiment of a VMM array.

FIG. 45 depicts array 4500. Array 4500 is similar to array 4400 except that array 4500 also comprises columns of isolation cells coupled to isolation bit lines. For example, array 4500 comprises logical cell 4551 comprising tuning cell 4511-2 coupled to tuning bit line 4501-2, fine cell 4511-3 coupled to fine bit line 4501-3, coarse cell 4511-4 coupled to coarse bitline 4501-4, and coarse cell 4511-5 coupled to coarse bitline 4501-5. Array 4500 further comprises isolation cell 4511-1 coupled to isolation bitline 4501-1 and isolation cell 4511-6 coupled to isolation bitline 4501-6, where isolation cells 4511-1 and 4511-6 are adjacent to logical cell 4551 on either side of it. Isolation cells 4511-1 and 4511-6 are not used to store data; rather, they are used to provide a buffer between logical cells to reduce any unwanted disturb effects between logical cells. Preferably, the isolation cells are deeply programmed so that the FG voltage of the isolation cells is at the lowest value possible. Alternatively, the isolation cells are partially erased, fully erased, or in native state (no erase or program). Alternatively, the isolation cells are partially programmed. Alternatively, the isolation cells are dummy cells. Note that for the same row, the isolation cells in between logical cells is adjacent to one coarse cell of the previous logical cell and adjacent the tuning cell of the following logical cell.

Figure 46:
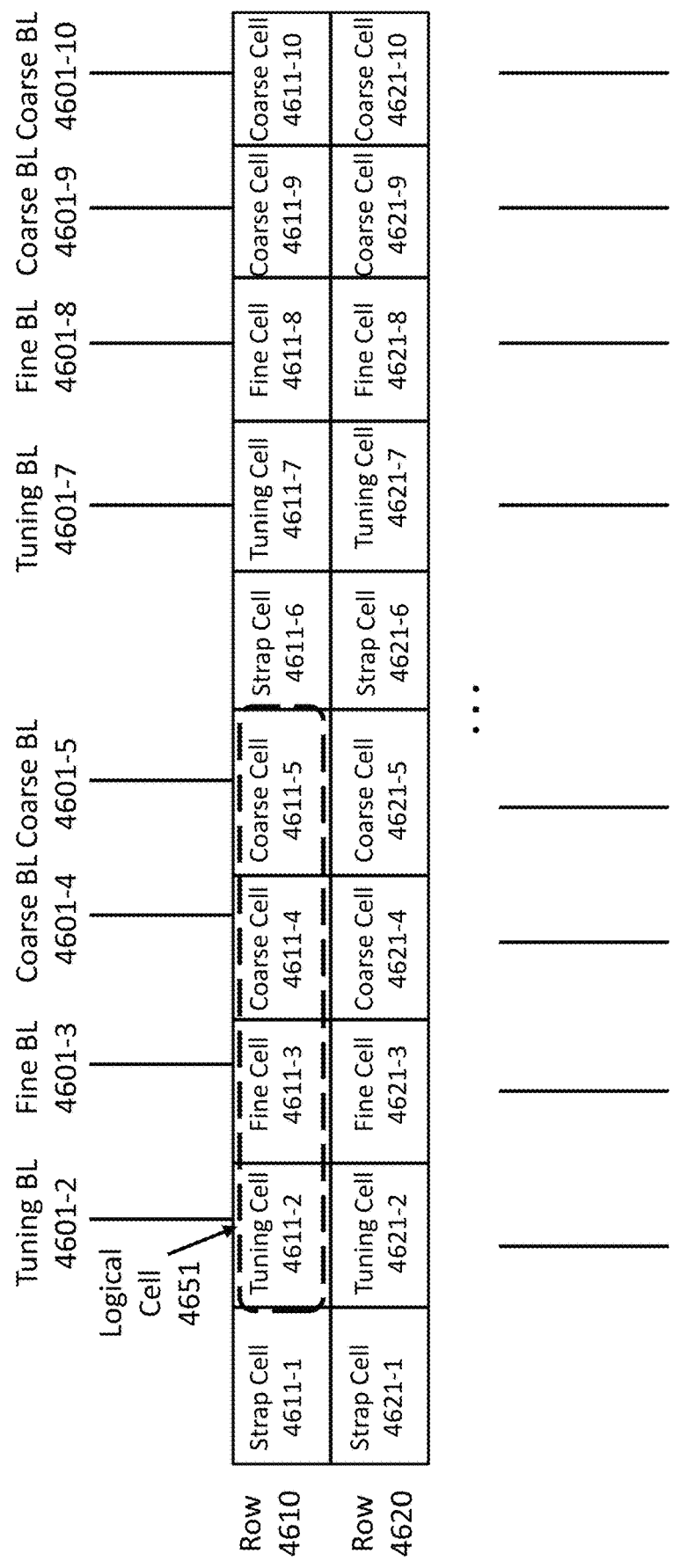
FIG. 46 depicts another embodiment of a VMM array.

FIG. 46 depicts array 4600. Array 4600 is similar to array 4400 except that array 4600 also comprises columns of strap cells that are not coupled to any bit lines. For example, array 4600 comprises logical cell 4651 comprising tuning cell 4611-2 coupled to tuning bit line 4601-2, fine cell 4611-3 coupled to fine bit line 4601-3, coarse cell 4611-4 coupled to coarse bitline 4610-4, and coarse cell 4611-5 coupled to coarse bitline 4601-5. Array 4600 further comprises strap cells 4611-1 and 4611-6 located adjacent to logical cell 4651 on either side of it. Strap cells 4611-1 and 4611-6 are not used to store data; rather, they are used as an area in which conductive connections (like metal interconnect) can be made between various lines (poly lines) within array 4600 (such as WL strap for word lines, EG strap for erase gate lines, CG strap for control gate lines, SL strap source lines, or strap combination like SLWL strap, SLCG strap, SLEG trap; strap cells might still have dummy floating gate structures in their structures) and devices and connections outside of array 4600 (such as driver circuits). Alternatively, isolation cells are placed between strap cells and tuning cells. Alternatively, isolation cells are placed next to strap cells.

Figure 47:
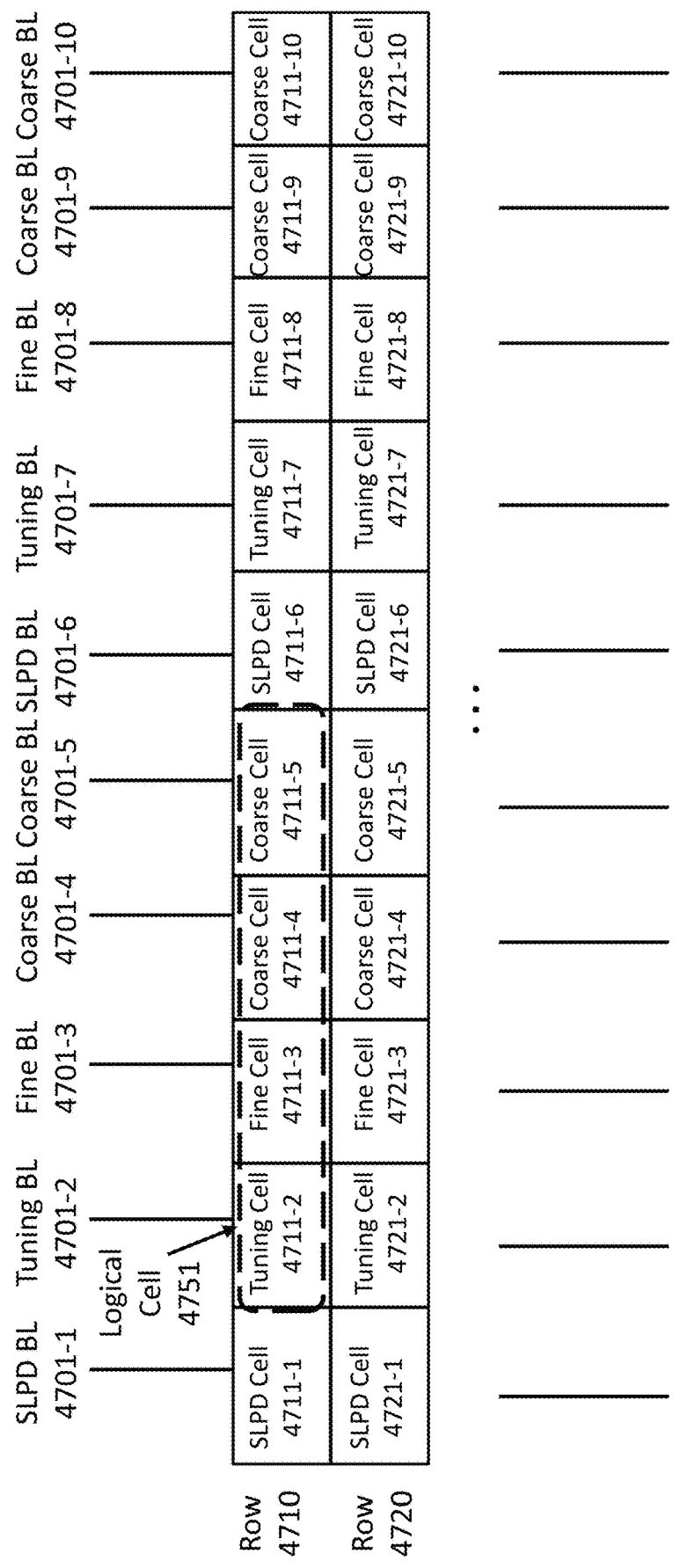
FIG. 47 depicts another embodiment of a VMM array.

FIG. 47 depicts array 4700. Array 4700 is similar to array 4400 except that array 4700 also comprises columns of pulldown cells coupled to pulldown source lines of the array. For example, array 4700 comprises logical cell 4751 comprising tuning cell 4711-2 coupled to tuning bit line 4701-2, fine cell 4711-3 coupled to fine bit line 4701-3, coarse cell 4711-4 coupled to coarse bitline 4701-4, and coarse cell 4711-5 coupled to coarse bitline 4701-5. Array 4700 further comprises pulldown cell 4711-1 coupled to pulldown bitline 4701-1 and pulldown cell 4711-6 coupled to pulldown bitline 4701-6, where pulldown cells 4711-1 and 4711-6 are adjacent to logical cell 4751 on either side of it. Pulldown cells 4711-1 and 4711-6 are not used to store data; rather, as described above with reference to FIGS. 21-27, they are used to pulldown source line terminals to ground as needed.

FIG. 48 depicts array 4800. Array 4800 comprises logical cell 4851 comprising tuning cell 4811-1 and tuning cell 4821-1 coupled to tuning bit line 4801-1; coarse cell 4811-2 and fine cell 4821-2 coupled to mixed bit line 4801-2; coarse cell 4811-3 and coarse cell 4821-3 coupled to coarse bitline 4810-3. Thus, in array 4800, each logic cell comprises three cells in one row (such as an even row) and three cells in an adjacent row (such as an odd row). Three of the cells are coarse cells, one cell is a fine cell, and two cells are tuning cells. Consistent with programming methods described previously, when logic cell 4851 is programmed, the order in which the cells are programmed are: coarse cell 4811-3, coarse cell 4821-3, coarse cell 4811-2, fine cell 4821-2, tuning cell 4811-1 (which is expected to have minimal effect on coarse cell 4811-2), and tuning cell 4821-1. During a read or verify operation, all six cells are read as one logical cell. Through this approach, the mismatch between odd and even rows is averaged together such as to minimize I-V slope mismatch.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system, comprising:
a neural network array comprising non-volatile memory cells arranged in rows and columns, wherein the neural network array is part of a neural network; and
a logical cell comprising a first plurality of non-volatile memory cells in a first row of the neural network array and a second plurality of non-volatile memory cells in a second row adjacent to the first row;
wherein the first plurality of non-volatile memory cells and the second plurality of non-volatile memory cells are configured as one or more coarse cells and one or more fine cells.

2. The system of claim 1, wherein during a programming operation of the logical cell, a coarse programming method is used to program the coarse cells and fine programming method is used to program the fine cells.

3. The system of claim 1, further comprising a tuning cell.

4. The system of claim 3, wherein the tuning cell is used to tune an adjacent cell.

5. The system of claim 1, wherein one or more of the first plurality and the second plurality comprise one or more tuning cells, and wherein during a programming operation of the logical cell, a tuning method is used to program the one or more tuning cells.

6. The system of claim 1, wherein the non-volatile memory cells are split-gate flash memory cells.

7. The system of claim 1, wherein the non-volatile memory cells are stacked-gate flash memory cells.

8. The system of claim 1, wherein the neural network is an analog neural network.

9. A method comprising:
   programming a logical cell comprising a first plurality of non-volatile memory cells in a first row of an array of non-volatile memory cells and a second plurality of non-volatile memory cells in a second row adjacent to the first row, where the first plurality and the second plurality are configured as one or more coarse cells and one or more fine cells, wherein the array of non-volatile memory cells is part of a neural network, the programming comprising:
   programming the one or more coarse cells using a coarse programming method;
   programming the one or more fine cells using a fine programming method.

10. The method of claim 9, further comprising:
    verifying a value programmed in the logical cell.

11. The method of claim 9, wherein the logical cell further comprises one or more tuning cells in a same row, and the method further comprises programming the one or more tuning cells using a tuning method.

12. The method of claim 11, further comprising:
    verifying a value programmed in the logical cell.

13. The method of claim 9, wherein the non-volatile memory cells are split-gate flash memory cells.

14. The method of claim 9, wherein the non-volatile memory cells are stacked-gate flash memory cells.

15. The method of claim 9, wherein the neural network is an analog neural network.

* * * * *